(12) United States Patent
Inoue et al.

(10) Patent No.: US 8,912,563 B2
(45) Date of Patent: Dec. 16, 2014

(54) NITRIDE SEMICONDUCTOR LIGHT-EMITTING DEVICE

(71) Applicant: Panasonic Corporation, Osaka (JP)

(72) Inventors: Akira Inoue, Osaka (JP); Toshiya Yokogawa, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/068,234

(22) Filed: Oct. 31, 2013

(65) Prior Publication Data

US 2014/0070255 A1 Mar. 13, 2014

Related U.S. Application Data

(63) Continuation of application No. PCT/JP2013/003566, filed on Jun. 6, 2013.

(30) Foreign Application Priority Data

Sep. 10, 2012 (JP) ................................. 2012-198718

(51) Int. Cl.
*H01L 33/00* (2010.01)
*H01L 21/00* (2006.01)

(52) U.S. Cl.
USPC ............................................. 257/98; 438/29

(58) Field of Classification Search
USPC ...................... 438/22, 29, 69, 72; 257/13, 98, 257/E33.054, E33.077
See application file for complete search history.

(56) References Cited

U.S. PATENT DOCUMENTS

| 2008/0258156 A1 | 10/2008 | Hata |
| 2009/0050917 A1 | 2/2009 | Nakagawa et al. |
| 2009/0279278 A1 | 11/2009 | Tsujimura et al. |
| 2012/0091490 A1 | 4/2012 | Fujikane et al. |
| 2013/0126900 A1 | 5/2013 | Inoue et al. |

FOREIGN PATENT DOCUMENTS

| JP | 2008-109098 A | 5/2008 | |
| JP | 2009-38293 A | 2/2009 | |
| JP | 2009-88353 A | 4/2009 | |
| JP | 2010-277789 | * 12/2010 | .............. H01L 33/64 |
| JP | 2010-277789 A | 12/2010 | |
| JP | 2011-077188 A | 4/2011 | |

OTHER PUBLICATIONS

International Search Report for International Application No. PCT/JP2013/003566 dated Sep. 10, 2012.
Written Opinion for International Application No. PCT/JP2013/003566 dated Jul. 2, 2013.
International Search Report for International Application No. PCT/JP2013/003566 mailed Jul. 2, 2013 (English translation provided).

* cited by examiner

*Primary Examiner* — Calvin Lee
(74) *Attorney, Agent, or Firm* — Renner, Otto, Boisselle & Sklar, LLP

(57) ABSTRACT

A nitride semiconductor light-emitting device includes: a semiconductor light-emitting chip held on a mounting surface of a mounting substrate, having a growth surface that is a nonpolar or semipolar plane, and emitting polarized light; a reflector surrounding the semiconductor light-emitting chip when viewed in plan and having a reflective surface off which the polarized light is reflected; and a coupler held on the mounting surface of the mounting substrate and holding the reflector such that the reflector is rotatable around the semiconductor light-emitting chip.

40 Claims, 27 Drawing Sheets

- N
- Ga

*m*-PLANE

*c*-PLANE

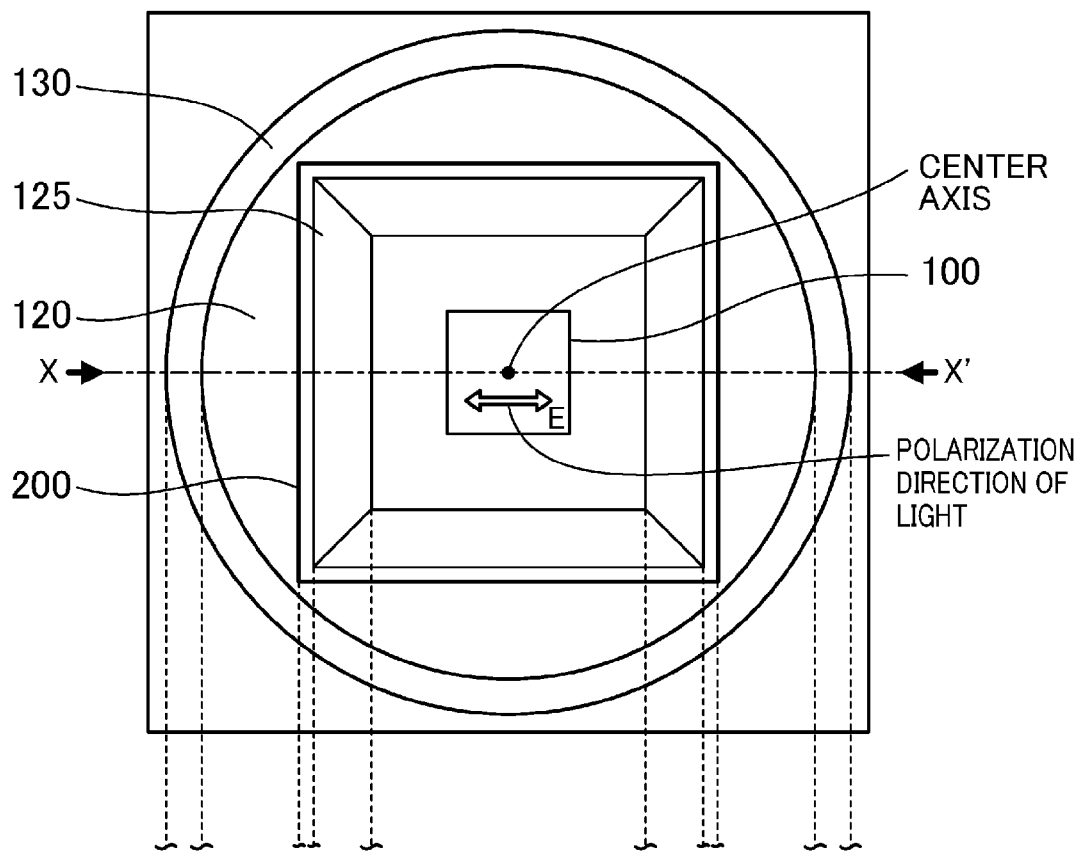
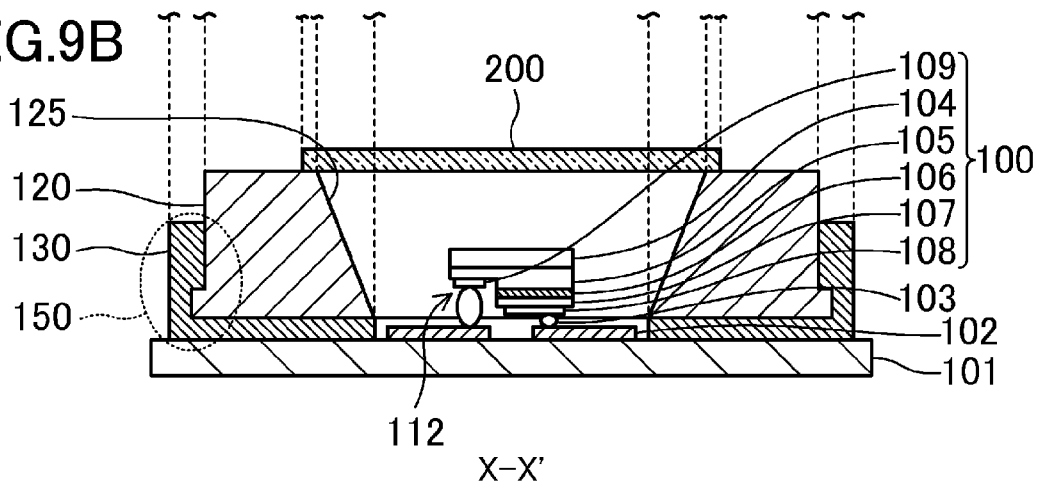

X-X'

X-X'

POLARIZATION DIRECTION OF LIGHT

*m*-PLANE WITHOUT REFLECTOR

*m*-PLANE WITHOUT REFLECTOR ($20\bar{2}\bar{1}$)PLANE WITHOUT REFLECTOR ($20\bar{2}\bar{1}$)PLANE WITHOUT REFLECTOR

NITRIDE SEMICONDUCTOR LIGHT-EMITTING DEVICE

CROSS-REFERENCE TO RELATED APPLICATIONS

This is a continuation of International Application No. PCT/JP2013/003566 filed on Jun. 6, 2013, which claims priority to Japanese Patent Application No. 2012-198718 filed on Sep. 10, 2012. The entire disclosures of these applications are incorporated by reference herein.

BACKGROUND

The present disclosure relates to a nitride semiconductor light-emitting device including a semiconductor light-emitting chip held on a mounting surface of a mounting substrate, having a growth surface that is a nonpolar or semipolar plane, and emitting polarized light, a reflection member having a reflective surface off which the polarized light is reflected, and a coupler holding the reflection member.

Nitride semiconductors containing nitrogen (N) as a group V element have been expected as a material of a short wavelength light-emitting element because of their band gap size. Gallium nitride-based compound semiconductors, in particular, have been actively researched, and blue light-emitting diodes (LEDs), green LEDs, and blue semiconductor laser diodes that use a gallium nitride-based compound semiconductor have been also commercialized.

Gallium nitride-based compound semiconductors include a compound semiconductor obtained by substituting at least one of aluminum (Al) or indium (In) for part of gallium (Ga). Such a nitride semiconductor is represented by the general formula $Al_xGa_yIn_zN$ (where $0 \le x < 1$, $0 < y \le 1$, $0 \le z < 1$, and $x+y+z=1$). The gallium nitride-based compound semiconductors are hereinafter referred to as GaN-based semiconductors.

The replacement of Ga atoms with Al atoms in a GaN-based semiconductor allows the band gap of the GaN-based semiconductor to be wider than that of GaN, and the replacement of Ga atoms with In atoms in a GaN-based semiconductor allows the band gap of the GaN-based semiconductor to be narrower than that of GaN. Thus, not only short wavelength light, such as blue or green light, but also long wavelength light, such as orange or red light, can be emitted. From such a feature, nitride semiconductor light-emitting elements have been expected to be used for, e.g., image display devices and lighting devices.

Nitride semiconductors have a wurtzite crystal structure. In FIGS. 1A, 1B, and 1C, the plane orientations of the wurtzite crystal structure are expressed in four-index notation (hexagonal indices). In four-index notation, crystal planes and the orientations of the planes are expressed using primitive vectors expressed as $a_1$, $a_2$, $a_3$, and c. The primitive vector c extends in a [0001] direction, and an axis in this direction is referred to as a "c-axis." A plane perpendicular to the c-axis is referred to as a "c-plane" or a "(0001) plane." FIG. 1A illustrates, not only the c-plane, but also an a-plane (=(11-20) plane) and an m-plane (=(1-100) plane). FIG. 1B illustrates an r-plane (=(1-102) plane), and FIG. 1C illustrates a (11-22) plane. Herein, the symbol "−" attached to the left of one of parenthesized numbers indicating the Miller indices expediently indicates inversion of the number.

FIG. 2A illustrates a crystal structure of a GaN-based semiconductor using a ball-and-stick model. FIG. 2B is a ball-and-stick model obtained by observing atomic arrangement in the vicinity of the m-plane surface from an a-axis direction. The m-plane is perpendicular to the plane of the paper of FIG. 2B. FIG. 2C is a ball-and-stick model obtained by observing atomic arrangement of a +c-plane surface from an m-axis direction. The c-plane is perpendicular to the plane of the paper of FIG. 2C. As seen from FIGS. 2A and 2B, N atoms and Ga atoms are located on a plane parallel to the m-plane. On the other hand, as seen from FIGS. 2A and 2C, a layer in which only Ga atoms are located, and a layer in which only N atoms are located are formed on the c-plane.

Conventionally, when a semiconductor element is to be fabricated using a GaN-based semiconductor, a c-plane substrate, i.e., a substrate having a (0001) plane as its principal surface, has been used as a substrate on which a nitride semiconductor crystal is grown. In this case, spontaneous electrical polarization is induced in the nitride semiconductor along the c-axis due to the arrangements of Ga and N atoms. Thus, the "c-plane" is referred to as a "polar plane." As a result of the electrical polarization, a piezoelectric field is generated in a quantum well layer forming a portion of a light-emitting layer of a nitride semiconductor light-emitting element and made of InGaN along the c-axis. Due to the generated piezoelectric field, the distributed electrons and holes in the light-emitting layer are displaced, and the internal quantum efficiency of the light-emitting layer is decreased due to a quantum-confined Stark effect of carriers. In order to reduce the decrease in the internal quantum efficiency of the light-emitting layer, the light-emitting layer formed on the (0001) plane is designed to have a thickness equal to or less than 3 nm.

Furthermore, in recent years, consideration has been made to fabricate a light-emitting element using a substrate having an m- or a-plane called a nonpolar plane, or a −r- or (11-22) plane called a semipolar plane as its principal surface. As illustrated in FIG. 1A, m-planes of the wurtzite crystal structure are parallel to the c-axis, and are six equivalent planes orthogonal to the c-plane. For example, in FIG. 1A, a (1-100) plane perpendicular to a [1-100] direction corresponds to one of the m-planes. The other m-planes equivalent to the (1-100) plane include a (−1010) plane, a (10-10) plane, a (−1100) plane, a (01-10) plane, and a (0-110) plane.

As illustrated in FIGS. 2A and 2B, Ga and N atoms on the m-planes are present on the same atomic plane, and thus, electrical polarization is not induced in directions perpendicular to the m-planes. Therefore, when a light-emitting element is fabricated using a semiconductor stacked structure having an m-plane as its growth surface, a piezoelectric field is not generated in a light-emitting layer, and the problem where the internal quantum efficiency is decreased due to the quantum-confined Stark effect of carriers can be solved. This applies also to the a-plane that is a nonpolar plane except the m-planes, and furthermore, even when, instead of the m-plane, the −r- or (11-22) plane called the semipolar plane is used as the growth surface, similar advantages can be provided.

A nitride semiconductor light-emitting element including an active layer having an m- or a-plane, or a −r- or (11-22) plane as a growth surface has polarization characteristics resulting from the structure of the valence band of the active layer.

For example, Japanese Unexamined Patent Publication No. 2008-109098 describes a light-emitting diode device including light-emitting diode chips 10 each including a light-emitting layer 12 having a principal plane 12a, and a package 20 having a chip-arrangement surface 21a on which the light-emitting diode chips 10 are arranged, and configured such that light emitted from the principal plane 12a of the light-emitting layer 12 has a plurality of different intensities depending on the in-plane azimuth angles of the light in the principal plane 12a of the light-emitting layer 12, and at least either the light-emitting diode chips 10 or the package 20 reduces variations in the intensity of light exiting from the package 20 due to the differences among the in-plane azimuth angles of the light in the chip-arrangement surface 21a, in order to reduce the variations in the intensity of light exiting from the package due to the differences among the in-plane azimuth angles of the light in the chip-arrangement surface.

Japanese Unexamined Patent Publication No. 2009-38293 describes a light-emitting device configured such that, in order to prevent diffusion of polarized light, at least part of an inner surface of a mounting base on which a light-emitting element is mounted forms a specular surface.

Japanese Unexamined Patent Publication No. 2009-88353 describes a light-emitting device including a light-emitting element, and a package in order to provide a light-emitting device emitting polarized light with a high polarization ratio. The light-emitting element has a first end surface from which first polarized light is emitted, and a second end surface from which second polarized light is emitted. The package has a first inner wall surface that faces the first end surface and extends in parallel with the first end surface, and a second inner wall surface off which the second polarized light is reflected toward the first inner wall surface.

SUMMARY

The conventional nitride semiconductor light-emitting device including an active layer having a nonpolar or semipolar plane as a growth surface has required more appropriate control over the luminous intensity distribution of emitted light and the degree of polarization thereof.

It is therefore an object of the present disclosure to more appropriately control the luminous intensity distribution of emitted light and the degree of polarization thereof.

In order to solve the problem, a nitride semiconductor light-emitting device according to an aspect of the present disclosure includes: a mounting substrate; a semiconductor light-emitting chip held on a mounting surface of the mounting substrate, having a growth surface that is a nonpolar or semipolar plane, and emitting polarized light; a reflection member surrounding the semiconductor light-emitting chip when viewed in plan and having a reflective surface off which the polarized light is reflected; and a coupler held on the mounting surface of the mounting substrate and holding the reflection member such that the reflection member is rotatable around the semiconductor light-emitting chip.

According to the semiconductor light-emitting device of the present disclosure, the luminous intensity distribution and the degree of polarization of light can be more appropriately controlled. The light distribution angle, in particular, can be controlled, and the degree of polarization of light, in particular, can be maintained. Any one of emitted light the degree of polarization of which is maintained, and emitted light the degree of polarization of which is reduced can be optionally selected.

BRIEF DESCRIPTION OF THE DRAWINGS

FIG. 5A is a plan view of the nitride semiconductor light-emitting device, FIG. 5B is a cross-sectional view taken along the line Y-Y' in FIG. 5A, and FIG. 5C is a cross-sectional view taken along the line Z-Z' in FIG. 5A.

FIG. 7A is a plan view of the nitride semiconductor light-emitting device, FIG. 7B is a cross-sectional view taken along the line Z-Z' in FIG. 7A, and FIG. 7C is a cross-sectional view taken along the line Y-Y' in FIG. 7A.

FIGS. 9A and 9B provide a plan view and a cross-sectional view, respectively, illustrating an example in which the nitride semiconductor light-emitting device illustrated in FIGS. 4A and 4B includes a polarization control member.

DETAILED DESCRIPTION

Figure 1A:
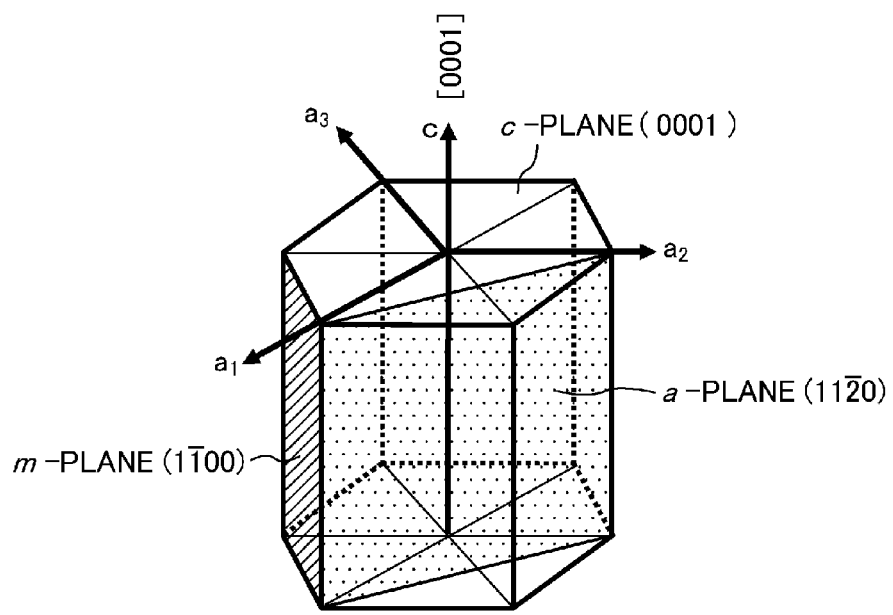
FIG. 1A is a perspective view illustrating primitive vectors $a_1$, $a_2$, $a_3$, and c, and a-, c-, and m-planes of a wurtzite crystal structure.
Figure 1B:
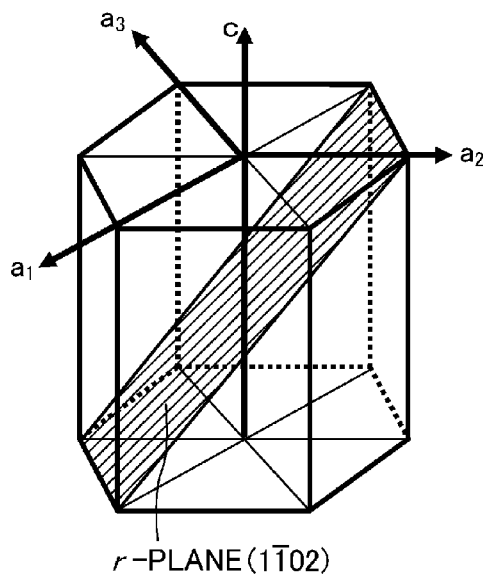
FIG. 1B is a perspective view illustrating an r-plane of the wurtzite crystal structure.
Figure 1C:
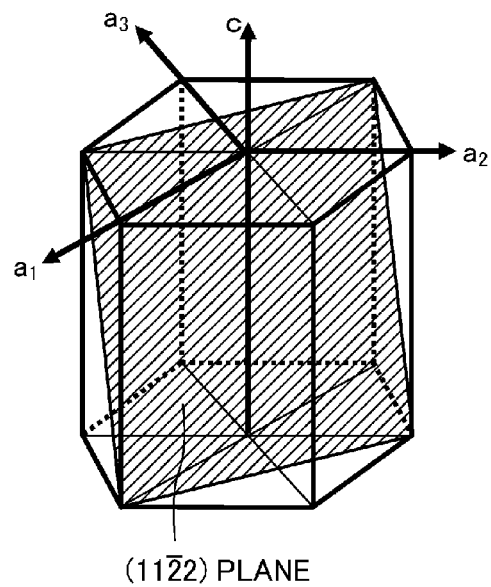
FIG. 1C is a perspective view illustrating a (11-22) plane of the wurtzite crystal structure.
Figure 2A:
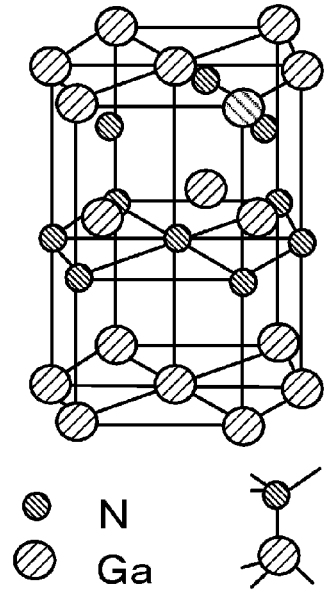
FIGS. 2A-2C illustrate a crystal structure of a GaN-based semiconductor using a ball-and-stick model.
Figure 2B:
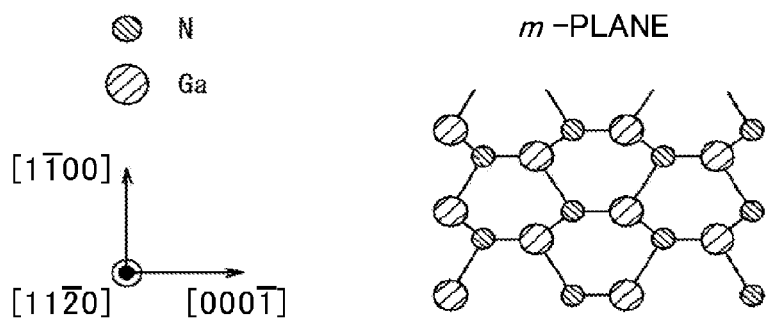
Figure 2C:
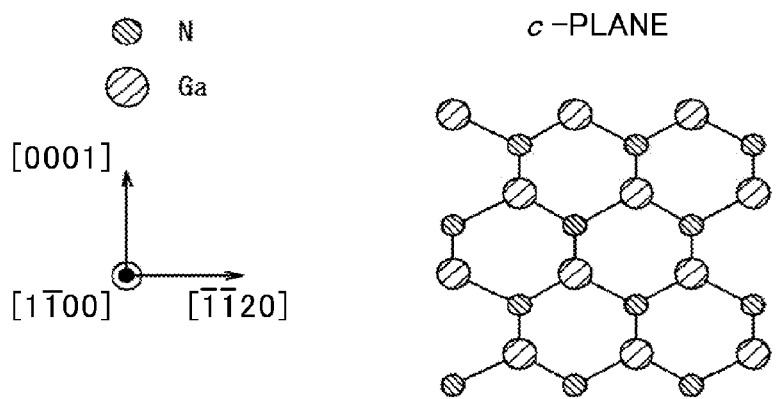

A nitride semiconductor light-emitting device according to an embodiment includes: a mounting substrate; a semiconductor light-emitting chip held on a mounting surface of the mounting substrate, having a growth surface that is a nonpolar or semipolar plane, and emitting polarized light; a reflection member surrounding the semiconductor light-emitting chip when viewed in plan and having a reflective surface off which the polarized light is reflected; and a coupler held on the mounting surface of the mounting substrate and holding the reflection member such that the reflection member is rotatable around the semiconductor light-emitting chip.

In the embodiment, the coupler may have a recess facing an outer circumferential surface of the reflection member and extending in parallel with the mounting surface, and the outer circumferential surface of the reflection member may include a projection fitted into the recess of the coupler.

In the embodiment, the coupler may include a projection facing an outer circumferential surface of the reflection member, and the outer circumferential surface of the reflection member may have a recess which extends in parallel with the mounting surface and into which the projection of the coupler is fitted.

In the embodiment, the coupler may be ring-shaped when viewed in plan from a direction perpendicular to the mounting surface.

In the embodiment, the coupler may include at least three pillar-like members extending in a direction perpendicular to the mounting surface.

In the embodiment, portions of the coupler except the recess into which the projection is fitted do not need to be in contact with the reflection member.

In the embodiment, the coupler may face a bottom portion of the reflection member, the bottom portion of the reflection member may include a projection or a ring-shaped recess, and an upper portion of the coupler may include a ring-shaped recess into which the projection of the reflection member is fitted, or a projection fitted into the recess of the reflection member.

In the embodiment, the nitride semiconductor light-emitting device may further include: a rotation mechanism actuating the reflection member.

In the embodiment, out of an upper surface of the reflection member and an upper surface of the coupler, at least the upper surface of the reflection member may include a marker enabling the determination of an angle of the reflective surface relative to a polarization direction of the polarized light.

In the embodiment, an outer circumferential surface of the reflection member may include a stopper fixing an angle of the reflective surface relative to a polarization direction of the polarized light.

In the embodiment, the reflective surface may include a plurality of reflective surfaces, and the reflective surfaces may be arranged such that a shape formed by the reflective surfaces when viewed in plan from a direction perpendicular to the mounting surface is square.

In the embodiment, the reflective surface may include a plurality of reflective surfaces, and the reflective surfaces may be arranged such that a shape formed by the reflective surfaces when viewed in plan from a direction perpendicular to the mounting surface is rectangular.

In the embodiment, the reflective surface may include a plurality of reflective surfaces, the reflective surfaces may be arranged such that a shape formed by the reflective surfaces when viewed in plan from a direction perpendicular to the mounting surface is square, and the marker or the stopper may be provided such that an angle θ2 can be set at an angle of not less than 0° and not more than 10° or at an angle of not less than 80° and not more than 90°, where the angle θ2 represents an angle between the polarization direction of the polarized light and a side of the shape formed by the reflective surfaces when viewed in plan.

In the embodiment, the reflective surface may include a plurality of reflective surfaces, the reflective surfaces may be arranged such that a shape formed by the reflective surfaces when viewed in plan from a direction perpendicular to the mounting surface is square, and the marker may be provided such that an angle θ2 can be set at an angle of not less than 30° and not more than 60°, where the angle θ2 represents an angle between the polarization direction of the polarized light and a side of the shape formed by the reflective surfaces when viewed in plan.

In the embodiment, one of the reflective surfaces when viewed in cross section taken along a direction perpendicular to the growth surface of the semiconductor light-emitting chip may form a straight line, a curve, or a combination of a straight line and a curve, and an arithmetic average inclination angle Δθ1 may be not less than 20° and not more than 40°, where the arithmetic average inclination angle Δθ1 represents an angle between the reflective surface and a direction of a normal line to the growth surface of the semiconductor light-emitting chip when viewed in cross section along the direction perpendicular to the growth surface of the semiconductor light-emitting chip.

In the embodiment, a surface roughness of the reflective surface may be not more than 100 nm.

In the embodiment, the nitride semiconductor light-emitting device may further include: a polarization control member held on the reflection member and varying a degree of polarization of the polarized light depending on a direction of incidence of the polarized light.

In the embodiment, the polarization control member may be a polarizing plate.

In the embodiment, the polarization control member may be a light-transmissive member having a surface including stripe-shaped projections and depressions.

In the embodiment, the polarization control member may be a semicylindrical light-transmissive member.

In the embodiment, the reflection member may have the reflective surface having an oval or polygonal end when viewed in plan.

In the embodiment, the reflection member may have the reflective surface having a rectangular end when viewed in plan.

In the embodiment, the reflection member may have the reflective surface having a square end when viewed in plan.

Incidentally, a nitride semiconductor active layer having an m-plane as a growth surface emits light having a high electric field intensity principally along the a-axis. When a light-emitting element emits polarized light, it is theoretically predicted that the light emitted from the light-emitting element will exhibit the luminous intensity distribution where the intensity of the emitted light increases in a direction perpendicular to the polarization direction of the light. In other words, the light emitted from the light-emitting element exhibits an uneven radiation pattern (luminous intensity distribution). Furthermore, it is theoretically predicted that light having a high electric field intensity along a specific crystal direction of a nitride semiconductor will be emitted also from each of semipolar planes, such as –r-, (20-21), (20-2-1), (10-1-3), and (11-22) planes, and other nonpolar planes, such as a-planes, and the emitted light will exhibit the luminous intensity distribution where the intensity of the emitted light increases in a direction perpendicular to the polarization direction of the light.

The polarization direction of light from a nitride semiconductor active layer having an a-plane as a growth surface has been known to be along the m-axis. Therefore, it is predicted that the light will exhibit the luminous intensity distribution where the intensity of the emitted light increases in a direction perpendicular to the m-axis.

The polarization direction of light from a nitride semiconductor active layer having a (20-2-1) or (20-21) plane that is a semipolar plane as a growth surface has been known to correspond to the [−12-10] direction. Therefore, it is predicted that the light will exhibit the luminous intensity distribution where the intensity of the emitted light increases in a direction perpendicular to the [−12-10] direction.

When the In content of a nitride semiconductor active layer having a (10-1-3) plane that is a semipolar plane as a growth surface is high, the polarization direction of light from the nitride semiconductor active layer has been known to correspond to the [−12-10] direction, and when the In content of the nitride semiconductor active layer is low, the polarization direction of the light has been known to correspond to the [11-23] direction. Therefore, it is predicted that the light will exhibit the luminous intensity distribution where when the In content of the active layer is high, the intensity of the emitted light increases in a direction perpendicular to the [−12-10] direction, and when the In content of the active layer is low, the intensity of the emitted light increases in a direction perpendicular to the [11-23] direction.

When the In content of a nitride semiconductor active layer having a (11-22) plane that is a semipolar plane as a growth surface is high, the polarization direction of light from the nitride semiconductor active layer has been known to be along the m-axis, and when the In content of the nitride semiconductor active layer is low, the polarization direction of the light has been known to correspond to the [−1-123] direction. Therefore, it is predicted that the light will exhibit the intensity distribution where when the In content of the active layer is high, the intensity of the emitted light increases in a direction perpendicular to the m-axis, and when the In content of the active layer is low, the intensity of the emitted light increases in a direction perpendicular to the [−1-123] direction.

Light having a high electric field intensity along a specific direction is herein referred to as "polarized light." For example, light having a high electric field intensity along an X-axis is referred to as "polarized light along the X-axis," and in this case, a direction along the X-axis is referred to as a "polarization direction." The "polarized light along the X-axis" does not mean only linearly polarized light along the X-axis, and may include linearly polarized light along other axes. More specifically, the "polarized light along the X-axis" means light including a light component that transmits through a "polarizer having a polarization transmission axis along the X-axis" and has higher intensity (electric field intensity) than a light component transmitting through a "polarizer having a polarization transmission axis along another axis." Therefore, the "polarized light along the X-axis" includes incoherent light including not only linearly polarized light and elliptically polarized light along the X-axis, but also linearly polarized light and elliptically polarized light in various directions.

When the polarization transmission axis of a polarizer is rotated about the optical axis, the degree of polarization of light is defined by the following expression (A):

Degree of Polarization=|$I$max−$I$min|/|$I$max+$I$min|   (A)

where Imax is the highest electric field intensity of light transmitting through the polarizer, and Imin is the lowest electric field intensity thereof.

When the polarization transmission axis of the polarizer is parallel to the X-axis, the electric field intensity of "light polarized along the X-axis" and transmitting through the polarizer is Imax, and when the polarization transmission axis of the polarizer is parallel to the Y-axis, the electric field intensity of the light transmitting through the polarizer is Imin. The electric field intensity Imin of completely linearly polarized light is equal to 0, and thus, the degree of polarization is equal to one. By contrast, the difference between the electric field intensity Imax of completely depolarized light and the electric field intensity Imin thereof is equal to zero, and thus, the degree of polarization is equal to zero.

A nitride semiconductor light-emitting element including an active layer having an m-plane as a growth surface emits polarized light principally along the a-axis as described above. In this case, the nitride semiconductor light-emitting element emits also polarized light along the c-axis and polarized light along the m-axis. However, the intensity of each of the polarized light along the c-axis and the polarized light along the m-axis is lower than that of the polarized light along the a-axis.

Herein, an active layer having an m-plane as a growth surface is used as an example, and attention is focused on polarized light along the a-axis. However, also when a semipolar plane, such as a –r-, (20-21), (20-2-1), (10-1-3), or (11-22) plane, or another nonpolar plane, such as an a-plane, is used as the growth surface, similar statements apply to polarized light in a specific crystal direction.

Herein, "m-planes" include not only planes completely parallel to the m-planes, but also planes inclined at an angle of about ±5° or less from the m-planes. The "m-planes" herein also include step-like surfaces each including a plurality of m-plane regions parallel to the m-planes. Planes inclined slightly from the m-planes are much less affected by spontaneous electrical polarization. Furthermore, the planes inclined slightly from the m-planes microscopically have properties similar to those of step-like surfaces including many m-plane regions that are not inclined from the m-planes. In addition, in some cases, in a crystal growth technique, a semiconductor layer is more easily epitaxially grown on a substrate having a crystal orientation inclined slightly from a desired orientation than on a substrate having a crystal orientation exactly identical with the desired orientation. Therefore, it may be useful to slightly incline a crystal plane in order to improve the crystal quality of the semiconductor layer to be epitaxially grown or increase the crystal growth rate of the semiconductor layer while reducing the influence of spontaneous electrical polarization to a sufficient level.

Similar statements apply to "a-planes," "(20-21) planes," "(20-2-1) planes," "(10-1-3) planes," "–r-planes," and "(11-22) planes," and thus, the "a-planes," the "(20-21) planes," the "(20-2-1) planes," the "(10-1-3) planes," the "–r-planes," and the "(11-22) planes" herein each include not only planes completely parallel to corresponding ones of the "a-planes," the "(20-21) planes," the "(20-2-1) planes," the "(10-1-3) planes," the "–r-planes," and the "(11-22) planes," but also planes inclined at an angle of about ±5° or less from the corresponding ones of the "a-planes," the "(20-21) planes," the "(20-2-1) planes," the "(10-1-3) planes," the "–r-planes," and the "(11-22) planes."

A nitride semiconductor light-emitting device includes a semiconductor light-emitting chip made of a nitride semiconductor, and a reflector. The reflector may be referred to as a cavity. The nitride semiconductor light-emitting device is placed on a mounting substrate. The mounting substrate may be referred to as a package. A surface of the mounting substrate on which the semiconductor light-emitting chip is held is referred to as a mounting surface. The reflector has a reflective surface configured to change the direction of light emitted from the semiconductor light-emitting chip.

Conventionally, the azimuth angle dependence of the luminous intensity distribution of a semiconductor light-emitting chip emitting polarized light and the azimuth angle dependence of the degree of polarization of light from the semiconductor light-emitting chip have not been examined to an adequate degree; therefore, the influence of a reflective surface of a reflector on the luminous intensity distribution and the degree of polarization of light has not been revealed.

Japanese Unexamined Patent Publication No. 2008-109098 describes a method for placing a semiconductor light-emitting chip, and the shape of each of a mounting surface and a reflector surface, in order to reduce the asymmetry of the luminous intensity distribution. However, no consideration has been given to the degree of polarization of light.

Japanese Unexamined Patent Publication No. 2009-38293 describes a reflector having a reflective surface serving as a specular surface, in order to maintain the degree of polarization of light. However, no consideration has been given to the luminous intensity distribution.

Japanese Unexamined Patent Publication No. 2009-88353 describes a reflector structure configured to allow the polarization direction of light emitted from a second end surface of a nitride semiconductor light-emitting chip to be identical with the polarization direction of light emitted from a first end surface thereof, in order to increase the degree of polarization of light. However, no consideration has been given to the luminous intensity distribution.

<Degree of Polarization of Light from Semiconductor Light-Emitting Chip Emitting Polarized Light and Luminous Intensity Distribution of Semiconductor Light-Emitting Chip>

Prior to description of an embodiment, the degree of polarization of light from a semiconductor light-emitting chip emitting polarized light and the luminous intensity distribution of the semiconductor light-emitting chip will be described.

First, definitions of directions of light emitted from a semiconductor light-emitting chip 100 made of a nitride semiconductor, and a method for measuring the luminous intensity distribution and the degree of polarization of the light will be described with reference to FIGS. 3A-3D. First, the direction perpendicular to an m-plane that is a growth surface of an active layer of the semiconductor light-emitting chip 100 corresponds to a Z-axis, the polarization direction of light emitted from the active layer corresponds to an X-axis, and the direction perpendicular to both the Z-axis and the X-axis corresponds to a Y-axis. The Z-axis is referred to also as the normal line direction. When the growth surface of the active layer is an m-plane, the Z-axis corresponds to the m-axis, the X-axis corresponds to the a-axis, and the Y-axis corresponds to the c-axis.

A plane L perpendicularly intersecting the active layer 106 is defined. The angle between the plane L and the polarization direction of light, i.e., the X-axis, is defined as φ, and when the angle φ is a specific value φ1 (unit: degree [°]), the plane L is defined as a plane $L_{φ1}$. Furthermore, in the plane $L_{φ1}$, the angle between the Z-axis (the normal line direction) and emitted light is defined as an azimuth angle χ. A plane used to measure the luminous intensity distribution is defined by the plane $L_{φ1}$, and the azimuth angle within which the luminous intensity distribution is measured is defined by the azimuth angle χ. A cross-sectional view taken along the plane $L_{φ1}$ is referred to as the "cross-sectional view along the plane $L_{φ1}$."

Figure 3A:
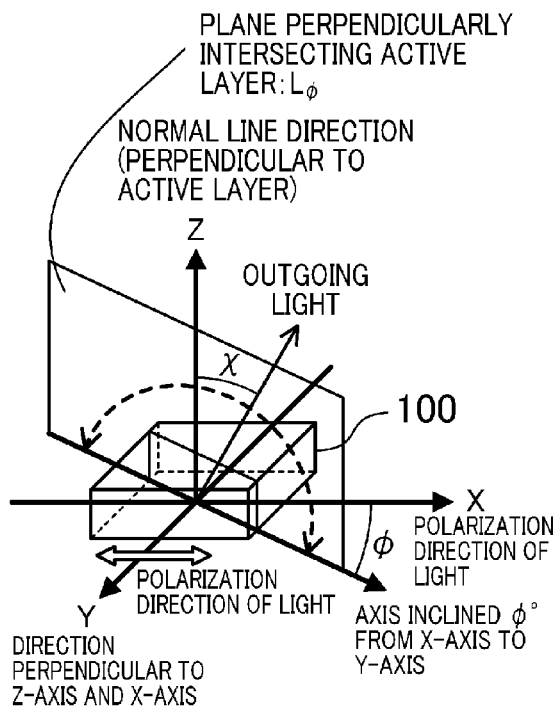
FIG. 3A is a perspective view illustrating the relationship among the polarization direction of light from a semiconductor light-emitting chip, a measurement plane L, and the azimuth angle $\chi$ of the light in connection with measurement of the degree of polarization of the light and the luminous intensity distribution.
Figure 3B:
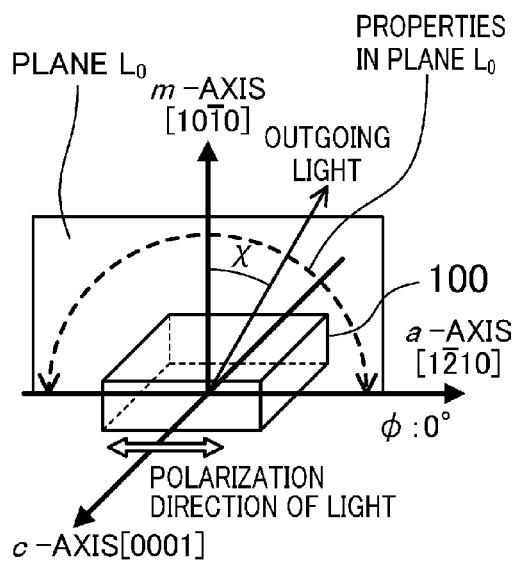
FIG. 3B is a perspective view illustrating the relationship among the polarization direction of light in a plane $L_0$, the measurement plane L, and the azimuth angle $\chi$ of the light, where the normal line to a growth surface of the semiconductor light-emitting chip is along the m-axis.
Figure 3C:
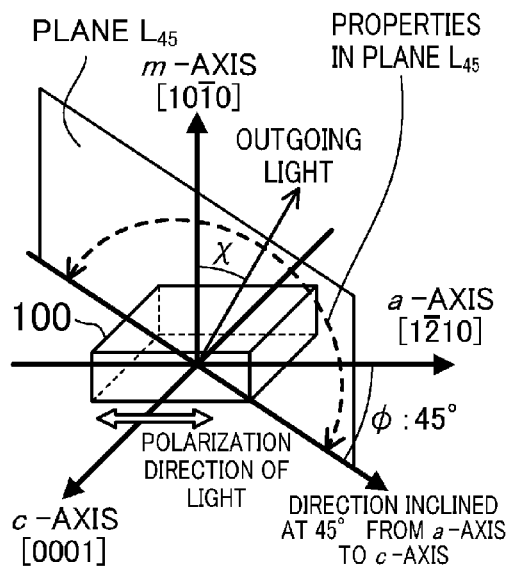
FIG. 3C is a perspective view illustrating the relationship among the polarization direction of light in a plane $L_{45}$, the measurement plane L, and the azimuth angle $\chi$ of the light, where the normal line is along the m-axis.
Figure 3D:
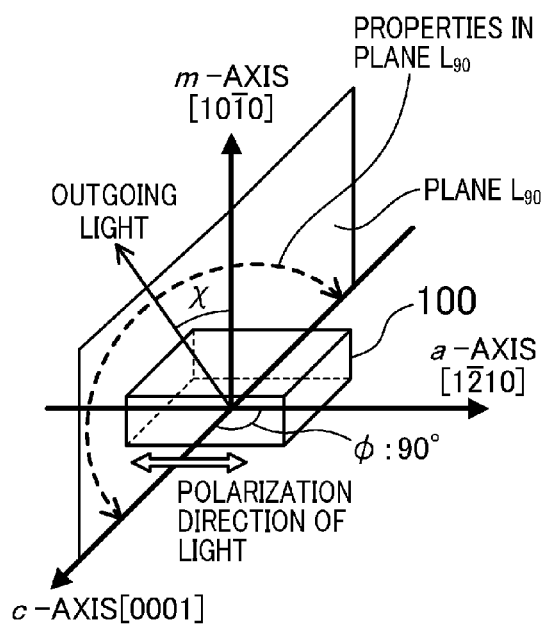
FIG. 3D is a perspective view illustrating the relationship among the polarization direction of light in a plane $L_{90}$, the measurement plane L, and the azimuth angle $\chi$ of the light, where the normal line is along the m-axis.

FIGS. 3B, 3C, and 3D illustrate specific examples in each of which the growth surface of the active layer is an m-plane.

FIG. 3B illustrates measurement axes along which the luminous intensity distribution in a plane $L_0$ and the degree of polarization of light therein are measured, where the growth surface of the active layer is an m-plane. In this case, the plane $L_0$ corresponds to the plane defined by the m-axis and the a-axis.

FIG. 3C illustrates measurement axes along which the luminous intensity distribution in a plane $L_{45}$ and the degree of polarization of light therein are measured, where the growth surface of the active layer is an m-plane. In this case, the plane $L_{45}$ includes the m-axis, and corresponds to a plane inclined at an angle of 45° from the a-axis.

FIG. 3D illustrates a measurement axis along which the luminous intensity distribution in a plane $L_{90}$ and the degree of polarization of light therein are measured, where the growth surface of the active layer is an m-plane. In this case, the plane $L_{90}$ corresponds to the plane defined by the m-axis and the c-axis.

The luminous intensity distribution of the semiconductor light-emitting chip 100 including the active layer emitting polarized light and the profile indicating the degree of polarization of light emitted from the semiconductor light-emitting chip 100 vary among the measurement planes, i.e., the plane $L_0$, the plane $L_{45}$, and the plane $L_{90}$. This phenomenon will be described in detail in comparative examples described below.

The luminous intensity distribution in the plane $L_{45}$ is similar to that in the plane $L_{90}$, and when the azimuth angle χ is in the range from −80° to −10° or the range from 10° to 80°, the light intensity is much higher than when the azimuth angle χ is equal to 0°, i.e., the intensity of light emitted along the normal line direction.

When the azimuth angle χ is in the range from −80° to +80°, the intensity of light in the plane $L_{90}$ is high, and a high degree of polarization of light in the plane $L_{90}$ is maintained. When the azimuth angle χ is 0°, the degree of polarization of light in the plane $L_0$ is highest, and when the absolute value of the azimuth angle χ is greater than 80, the degree of polarization of the light gently decreases. Similarly to the degree of polarization of the light in the plane $L_0$, when the azimuth angle χ is 0°, the degree of polarization of light in the plane $L_{45}$ is highest. However, when the absolute value of the azimuth angle χ is greater than 80, the degree of polarization of light in the plane $L_{45}$ significantly decreases, and when the azimuth angle χ is not more than −40° or not less than 40°, the degree of polarization of the light therein is reduced to substantially one half or less of that obtained when the azimuth angle χ is equal to 0°. Furthermore, when the azimuth angle χ is not more than −50° or not less than 50°, the degree of polarization of light in the plane $L_{45}$ is reduced to substantially one third or less of that obtained when the azimuth angle χ is equal to 0°. The azimuth angle dependence of each of the luminous intensity distribution and the degree of polarization of light has not been known.

The present inventors arrived at the following embodiment based on new characteristics, i.e., the azimuth angle dependence of each of the luminous intensity distribution and the degree of polarization of light. Specifically, the present inventors focused attention on the characteristics in which the intensity of light emitted in the plane $L_{90}$ to have an azimuth angle χ within the range from −80° to 80° is high, and the degree of polarization of the light is high.

Specifically, when light emitted in the plane $L_{90}$ to have an azimuth angle χ within the range from −80° to 80° is concentrated in the normal line direction, the degree of polarization of the light in the normal line direction can be maintained. Furthermore, when light emitted in the plane $L_{45}$ to have an azimuth angle χ within the range from −80° to −40° or within the range from 40° to 80° is not concentrated in the normal line direction, the rate of reduction in the degree of polarization of the light in the normal line direction can be decreased.

In contrast, the present inventors focused attention also on the characteristics in which the intensity of light emitted in the plane $L_{45}$ to have an azimuth angle χ within the range from −80° to −40° or within the range from 40° to 80° is extremely high, and the degree of polarization of the light is low.

Specifically, when light emitted in the plane $L_{45}$ to have an azimuth angle χ within the range from −80° to −40° or within the range from 40° to 80° is concentrated in the normal line direction, the intensity of the light in the normal line direction can be increased, and the degree of polarization of the light can be simultaneously reduced. Furthermore, when light emitted in the plane $L_{45}$ to have an azimuth angle χ within the range from −80° to −50° or within the range from 50° to 80° is concentrated in the normal line direction, the intensity of the light in the normal line direction can be increased, and the degree of polarization of the light can be simultaneously further reduced.

Embodiment

A nitride semiconductor light-emitting device according to an embodiment of the present disclosure will be described with reference to FIGS. 4A and 4B.

Figure 4A:
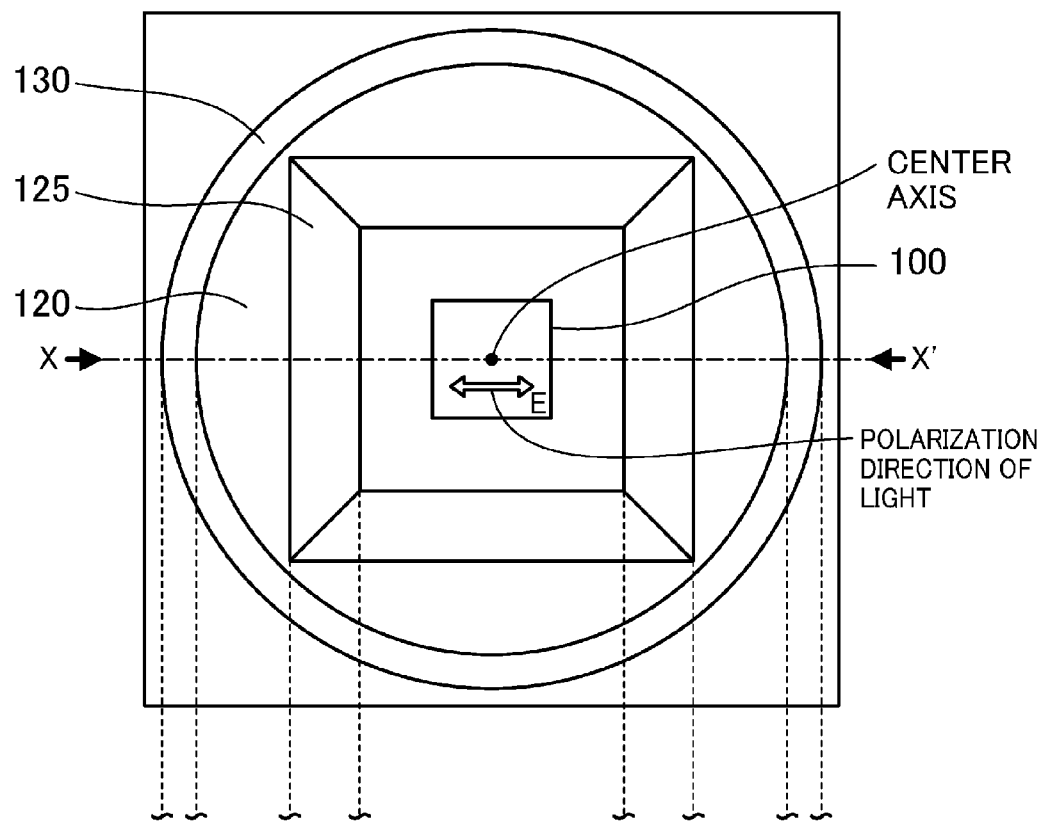
FIG. 4A is a schematic plan view illustrating a nitride semiconductor light-emitting device according to an embodiment.
Figure 4B:
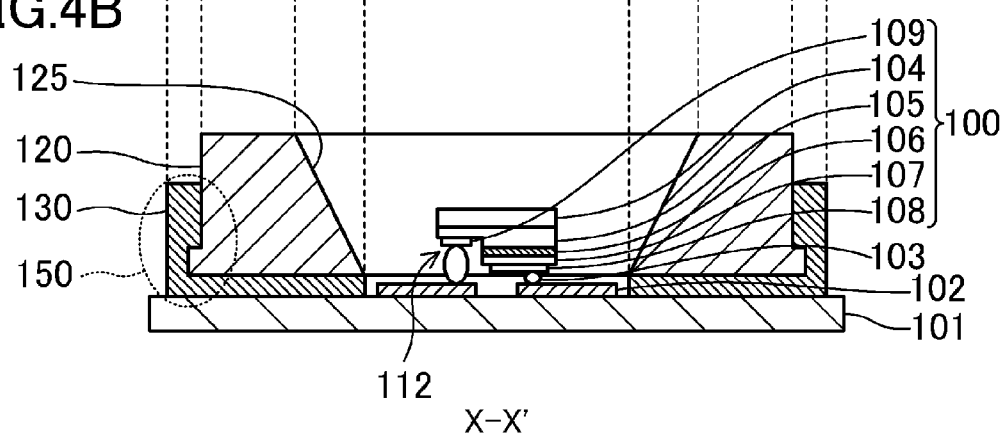
FIG. 4B is a cross-sectional view taken along the line X-X' in FIG. 4A.

FIG. 4A illustrates the configuration of the nitride semiconductor light-emitting device according to this embodiment when viewed in plan, and FIG. 4B is a cross-sectional view taken along the line X-X'. A cross section taken along the line X-X' corresponds to the plane $L_0$. The nitride semiconductor light-emitting device according to this embodiment includes a mounting substrate 101, a semiconductor light-emitting chip 100 mounted on the mounting substrate 101 and emitting polarized light, a reflector 120 that is a reflection member having a plurality of reflective surfaces surrounding the semiconductor light-emitting chip 100, and a coupler 130 supporting the side and bottom surfaces of the reflector 120. In this embodiment, the reflector 120 and the coupler 130 forms a rotation mechanism 150 that is held on the mounting substrate 101 and supports the reflector 120 such that the reflector 120 is rotatable around the semiconductor light-emitting chip 100.

As illustrated in FIG. 4B, the nitride semiconductor light-emitting chip 100 includes a substrate 104 having a GaN layer having an m-plane as the principal surface and the growth surface (hereinafter referred to as the m-plane GaN layer), an n-type nitride semiconductor layer 105 formed on the principal surface of the GaN layer of the substrate 104, an active layer 106 formed on the n-type nitride semiconductor layer 105 and made of a nitride semiconductor, a p-type nitride semiconductor layer 107 formed on the active layer 106, a p-side electrode 108 formed on and in contact with the p-type nitride semiconductor layer 107, and an n-side electrode 109 formed on and in contact with an exposed region of the n-type nitride semiconductor layer 105. The active layer 106 has a nonpolar or semipolar plane as the growth surface, and emits polarized light. In this embodiment, a light-emitting diode (LED) chip can be used as the semiconductor light-emitting chip 100. Similar statements apply to the following variations.

The growth surface of each of the n-type nitride semiconductor layer 105, the active layer 106, and the p-type nitride semiconductor layer 107 is substantially parallel to m-planes. In other words, the layers 105, 106, and 107 are stacked along the m-axis. Another layer may be formed between the n-type nitride semiconductor layer 105 and the active layer 106. Furthermore, another layer may be formed between the active layer 106 and the p-type nitride semiconductor layer 107. Here, a GaN-based semiconductor will be described as an example nitride semiconductor. The GaN-based semiconductor includes a semiconductor represented by the general expression $Al_xIn_yGa_zN$ (where $0 \le x < 1$, $0 \le y < 1$, $0 < z \le 1$, and $x+y+z=1$).

The semiconductor light-emitting chip 100 is mounted such that its p-side electrode 108 and its n-side electrode 109 each face a corresponding one of interconnect electrodes 102 placed on a mounting surface of the mounting substrate 101. Specifically, the semiconductor light-emitting chip 100 is electrically connected through bumps 103 to the interconnect electrodes 102 on the mounting substrate 101, and is held on the interconnect electrodes 102 with the bumps 103 interposed therebetween. Such a structure is referred to as the flip-chip structure. One of the interconnect electrodes 102 is connected to the p-side electrode 108, and the other one thereof is connected to the n-side electrode 109. Note that the flip-chip structure is merely an example. The substrate 104 may be mounted on the mounting surface with the p-side electrode 108 and the n-side electrode 109 facing upward from the mounting substrate 101 by, e.g., junction-up mounting or face-up mounting, and the manner in which the semiconductor light-emitting chip 100 is mounted can be appropriately selected. An insulative material, such as alumina (aluminum oxide), aluminum nitride (AlN), or a glass epoxy resin, a metal material containing, e.g., aluminum (Al), copper (Cu), or tungsten (W), a semiconductor material, such as silicon (Si) or germanium (Ge), or a composite of the materials can be used as the principal material forming the mounting substrate 101. Metal, such as aluminum (Al), silver (Ag), gold (Au), or copper (Cu), can be used as a material of the interconnect electrodes 102.

The substrate 104 may be made of only a GaN layer, or may include a layer except a GaN layer. The layer except the GaN layer may be an m-plane GaN substrate, an m-plane SiC substrate, an r-plane sapphire substrate, an m-plane sapphire substrate, or an a-plane sapphire substrate. Furthermore, the substrate 104 may be removed.

The n-type nitride semiconductor layer 105 is made of, e.g., n-type $Al_uGa_vIn_wN$ (where $0 \le u \le 1$, $0 \le v \le 1$, $0 \le w \le 1$, and $u+v+w=1$). For example, silicon (Si) can be used as an n-type dopant.

The active layer 106 includes a plurality of barrier layers made of $In_YGa_{1-Y}N$ (where $0 \le Y < 1$), and at least one well layer vertically interposed between an adjacent pair of the barrier layers and made of $In_XGa_{1-X}N$ (where $0 < X \le 1$). The well layer included in the active layer 106 may be a single layer. Alternatively, the active layer 106 may have a multiple quantum well (MQW) structure in which well layers and barrier layers are alternately stacked. The wavelength of light emitted from the semiconductor light-emitting chip 100 depends on the In content ratio x of an $In_xGa_{1-x}N$ semiconductor that is a semiconductor composition of the well layer.

The p-type nitride semiconductor layer 107 is made of, e.g., a p-type $Al_sGa_tN$ (where $0 \le s \le 1$, $0 \le t \le 1$, and $s+t=1$) semiconductor. For example, magnesium (Mg) can be used as a p-type dopant. As the p-type dopant, instead of Mg, zinc (Zn) or beryllium (Be), for example, may be used. The Al content ratio s of the p-type nitride semiconductor layer 107 may be uniform along the thickness thereof, or may vary along the thickness thereof in a continuous or stepwise manner. The thickness of the p-type nitride semiconductor layer 107 is, e.g., about 0.05-2 μm. The Al content ratio s of a portion of the p-type nitride semiconductor layer 107 near an upper surface thereof, i.e., a portion thereof near the interface between the p-type nitride semiconductor layer 107 and the p-side electrode 108, may be zero. In other words, the portion of the p-type nitride semiconductor layer 107 near the upper surface thereof may be a GaN layer. In this case, the GaN layer may contain a high concentration of p-type impurities, and may function as a contact layer with the p-side electrode 108.

The p-side electrode 108 may cover substantially the entire surface of the p-type nitride semiconductor layer 107. The p-side electrode 108 is made of, e.g., a layered structure (Pd/Pt) in which a palladium (Pd) layer and a platinum (Pt) layer are stacked. In order to increase the reflectivity of emitted light, a layered structure (Ag/Pt) in which a silver (Ag) layer and a platinum (Pt) layer are stacked, or a layered structure (Pd/Ag/Pt) in which a Pd layer, an Ag layer, and a Pt layer are sequentially stacked may be used as the p-side electrode 108.

The n-side electrode 109 is made of, e.g., a layered structure (Ti/Pt) in which a titanium (Ti) layer and a platinum (Pt) layer are stacked. In order to increase the reflectivity of emitted light, a layered structure (Ti/Al/Pt) in which a Ti layer, an Al layer, and a Pt layer are sequentially stacked may be used.

The semiconductor light-emitting chip 100 is one of pieces into which a wafer including stacked semiconductor layers is singulated along the a- and c-axes and which are square or rectangular when viewed in plan. In this case, a c-plane of a nitride semiconductor is easily cleaved, and thus, a singulation process step can be simplified. Alternatively, the semiconductor light-emitting chip 100 may be one of pieces into which the wafer is singulated along directions inclined at an angle of not less than 0° and not more than 45° from the a- and c-axes. In this case, planes that are difficult to be cleaved are exposed on the side surfaces of the semiconductor light-emitting chip 100. This exposure tends to cause the side surfaces of the semiconductor light-emitting chip 100 to be uneven. The uneven surfaces improve the light extraction efficiency at which emitted light is extracted from the uneven surfaces.

Figure 5A:
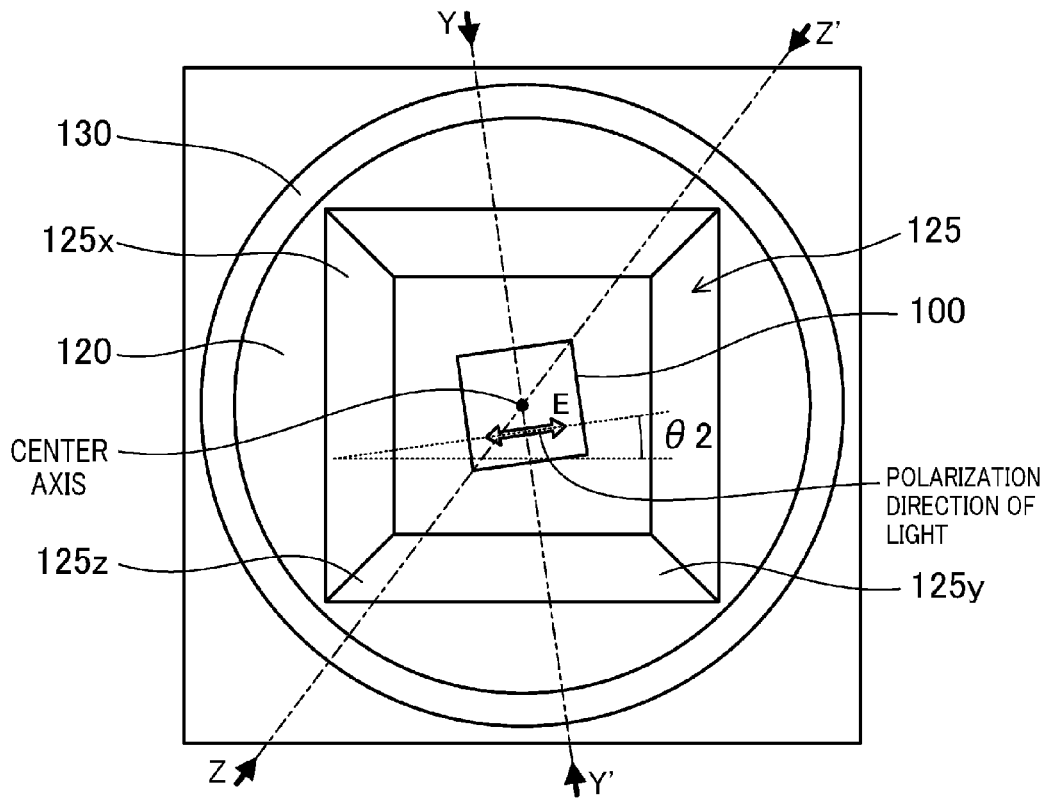
FIGS. 5A-5C are schematic diagrams for explaining an advantage of the nitride semiconductor light-emitting device according to the embodiment.
Figure 5B:
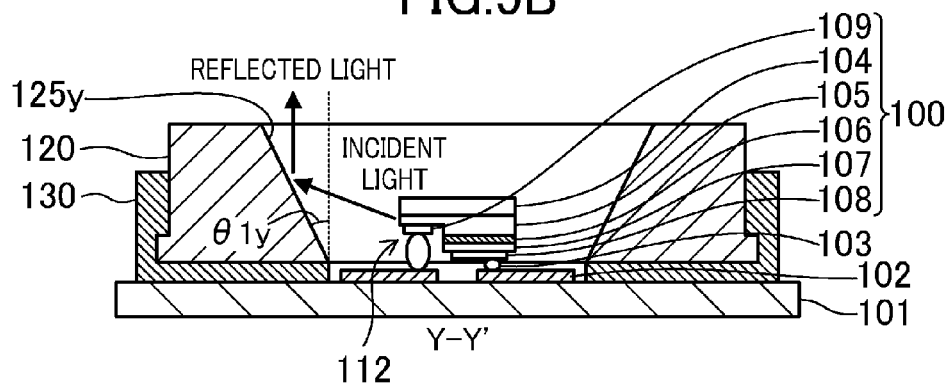
Figure 5C:
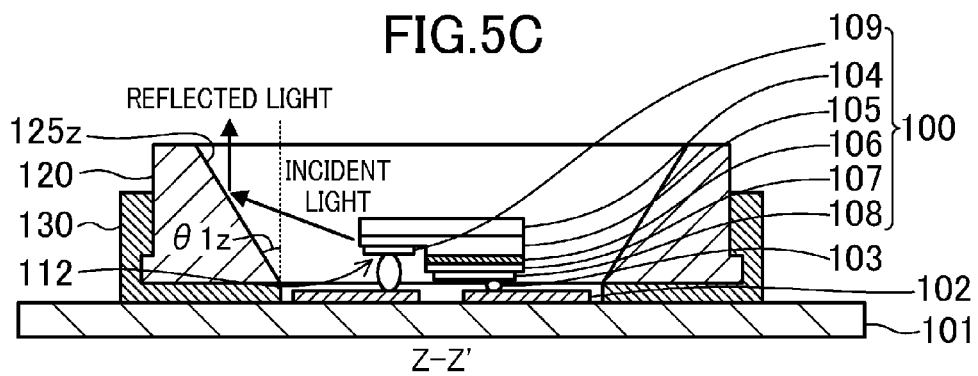

In this embodiment, as illustrated in FIGS. 5A-5C, the reflective surfaces 125x and 125y of the reflector 120 improve the symmetry of the luminous intensity distribution, and play a significant role in controlling the degree of polarization of light.

High-intensity light having a high degree of polarization enters the reflective surfaces 125y intersecting the plane $L_{90}$ forming an angle of 90° relative to the polarization direction of polarized light. When the angle θ1y is one half of the azimuth angle χ, light is reflected off the reflective surfaces 125y in the normal line direction. Therefore, in order to reflect emitted light having an azimuth angle χ within the range from 40° to 80° in the normal line direction, the angle θ1y can be within the range from 20° to 40°. Furthermore, in order to reflect emitted light having an azimuth angle χ within the range from 50° to 80° in the normal line direction, the angle θ1y can be within the range from 25° to 40°. Thus, high-intensity light having a high degree of polarization can be concentrated in the normal line direction, and thus, the degree of polarization of light in the normal line direction is maintained.

Low-intensity light the degree of polarization of which is not so high enters the reflective surfaces 125x intersecting the plane $L_0$ parallel to the polarization direction of polarized light. Therefore, light entering the reflective surfaces 125x does not need to be intentionally reflected in the normal line direction. However, even when the light is reflected in the normal line direction, the reflected light insignificantly affects the degree of polarization of light, because the intensity of the original light is low. Specifically, in order to reduce the asymmetry of the luminous intensity distribution, the angle θ1x formed by each of the reflective surfaces 125x can be set substantially equal to the angle θ1y.

A feature of the quadrangular reflector 120 is that the angle θ1z between each of regions of the reflective surfaces 125 where the reflective surfaces 125x cross the reflective surfaces 125y, i.e., each of the reflective surfaces 125z when viewed in cross section taken along the line Z-Z' (along the plane $L_{45}$), and the normal line direction is larger than each of the angle θ1x and the angle θ1y.

Figure 6:
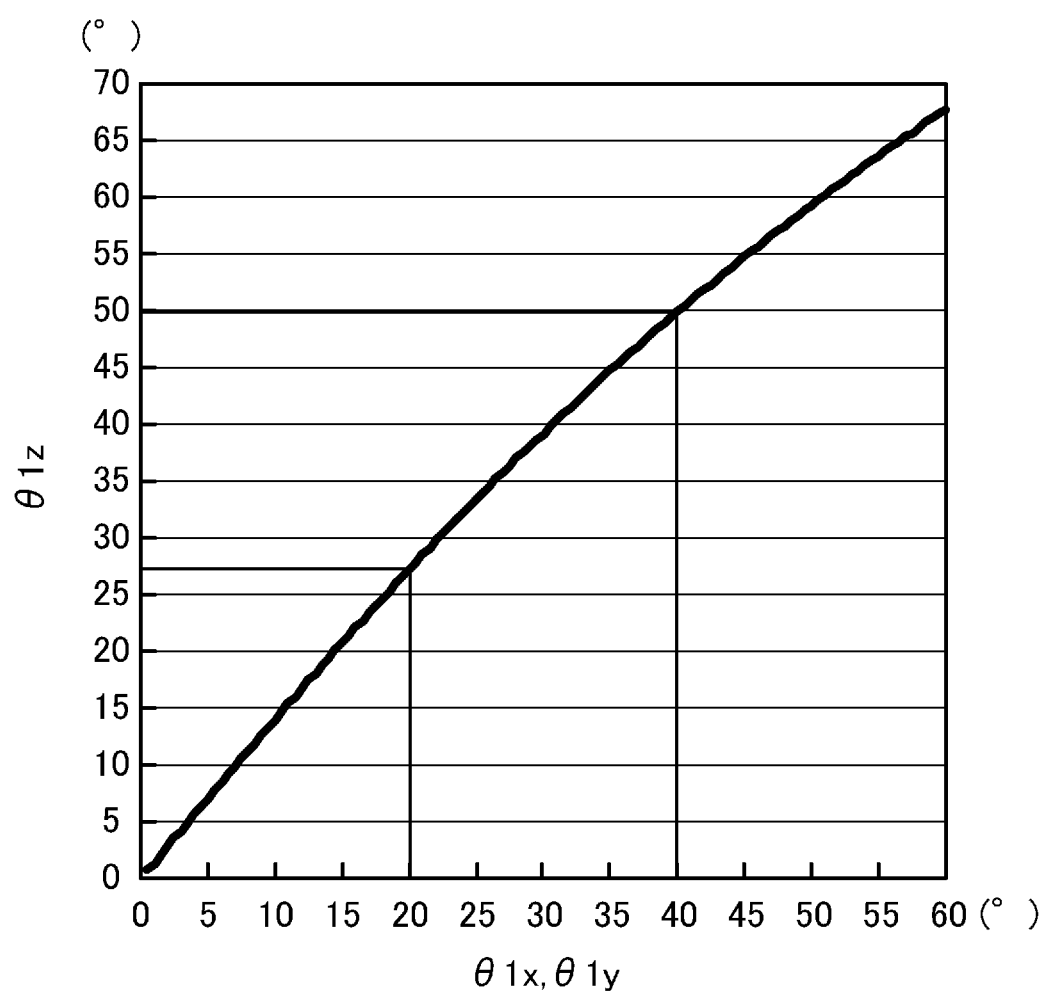
FIG. 6 is a graph illustrating the relationship between an angle $\theta 1x$ or an angle $\theta 1y$ from a reflector forming a portion of the nitride semiconductor light-emitting device according to the embodiment and an angle $\theta 1z$ therefrom, where the angle $\theta 1x$ and the angle $\theta 1y$ are equal to each other.

FIG. 6 illustrates the relationship between the angle θ1x or the angle θ1y and the angle θ1z, where the angle θ1x and the angle θ1y are equal to each other. When the angle θ1y is within the appropriate range from 20° to 40°, the angle θ1z is about 10° larger than the angle θ1y. When the angle θ2 is within the range from 0° to 10°, light entering the reflective surfaces 125z has properties substantially equivalent to the properties of light in the plane $L_{45}$. Specifically, high-intensity light having a low degree of polarization enters the reflective surfaces 125z. However, since, in this case, the angle θ1z is about 10° larger than the angle θ1y, light is reflected off the reflective surfaces 125z to spread in directions away from the normal line direction. Therefore, while the quadrangular reflector 120 located as above allows high-intensity light having a high degree of polarization to be concentrated in the normal line direction, the quadrangular reflector 120 can make it difficult to concentrate high-intensity light having a low degree of polarization in the normal line direction. Consequently, while the asymmetry of the luminous intensity distribution is reduced, the degree of polarization of light in the normal line direction can be maintained.

Figure 7A:
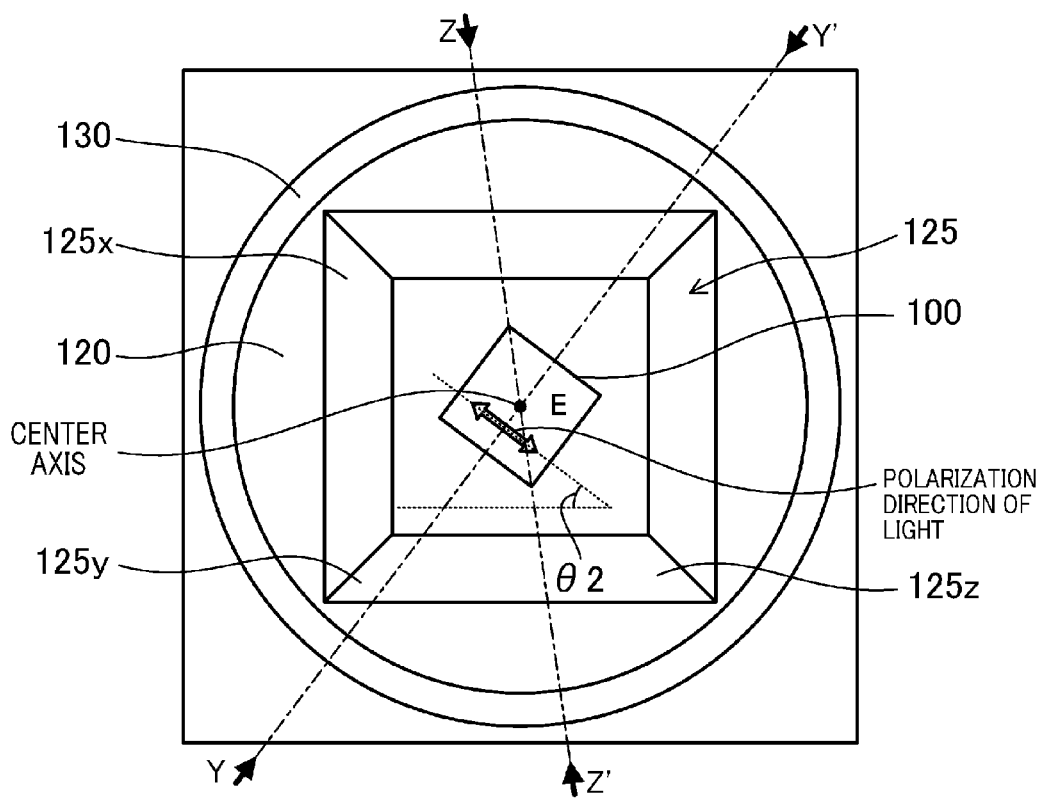
FIGS. 7A-7C are schematic diagrams for explaining another advantage of the nitride semiconductor light-emitting device according to the embodiment.
Figure 7B:
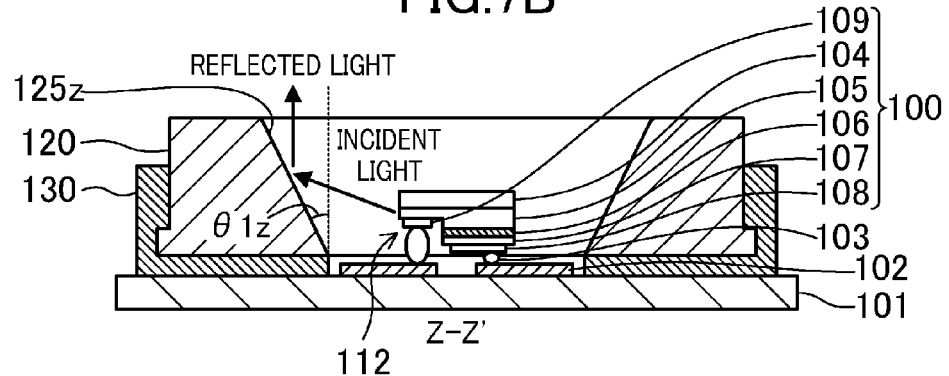
Figure 7C:
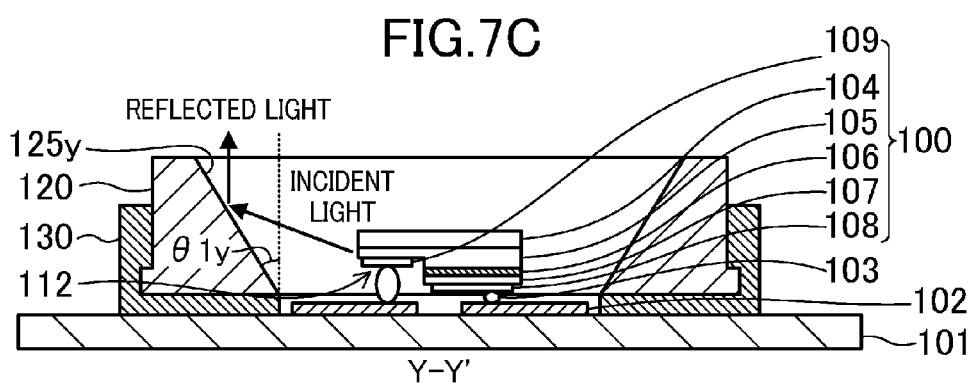

In contrast, when the angle θ2 is within the range from 30° to 60° as illustrated in FIG. 7, light entering the reflective surfaces 125y has properties substantially equivalent to the properties of light in the plane $L_{90}$. Specifically, high-intensity light having a high degree of polarization enters the reflective surfaces 125y. However, since, in this case, the angle θ1y is about 10° larger than the angle θ1z, light is reflected off the reflective surfaces 125y to spread in directions away from the normal line direction. Therefore, while the reflector 120 located as above allows high-intensity light having a low degree of polarization to be concentrated in the normal line direction, the reflector 120 can make it difficult to concentrate high-intensity light having a high degree of polarization in the normal line direction. Consequently, while the asymmetry of the luminous intensity distribution is reduced, the degree of polarization of light in the normal line direction can be reduced.

In this embodiment, the arithmetic average inclination angle Δθ1z can be set at an angle larger than the arithmetic average inclination angle Δθ1y, where the arithmetic average inclination angle Δθ1y represents the angle between a reflective surface and the direction of the normal line to the growth surface of the semiconductor light-emitting chip when viewed in cross section taken along the plane $L_{90}$, and the arithmetic average inclination angle Δθ1z represents the angle between a reflective surface and the direction of the normal line to the growth surface of the semiconductor light-emitting chip when viewed in cross section taken along the plane $L_{45}$. When the angle Δθ1z is larger than the angle Δθ1y, light is reflected off the reflective surfaces 125z to spread in directions away from the normal line direction. Conversely, the angle Δθ1y can be set at an angle larger than the angle Δθ1z. When the angle Δθ1y is larger than the angle Δθ1z, light is reflected off the reflective surfaces 125y to spread in directions away from the normal line direction.

Here, while the definition of the arithmetic average inclination angle Δθ1y herein is similar to that defined in Japanese Industrial Standard (JIS) B0601-1994, the reference direction of the angle herein is different from that of the angle defined in JIS B0601-1994. In other words, while the arithmetic average inclination angle RΔa defined in JIS is an angle relative to a horizontal direction, the arithmetic average inclination angle Δθ1y herein is an angle relative to the normal line direction. Specifically, the arithmetic average inclination angle Δθ1y herein is given by the following expression 1:

$$\Delta\theta 1y = \frac{1}{n-1}\sum_{i=1}^{n-1}\left\{\tan^{-1}\left|\left(\frac{\Delta Y}{\Delta D_i}\right)\right|\right\} = \frac{1}{n-1}\sum_{i=1}^{n-1}\left\{90° - \tan^{-1}\left|\left(\frac{\Delta D_i}{\Delta Y}\right)\right|\right\} = 90° - R\Delta a$$ [Expression 1]

where $\Delta D_i$ represents a deviation from the normal line direction when the curved surface is sectioned at regular intervals ΔY in a lateral direction (a direction perpendicular to the normal line direction).

In order to actually measure the arithmetic average inclination angle Δθ1y, the arithmetic average inclination angle RΔa of a reflective surface 125 is measured using a laser microscope, and the measured value is subtracted from 90° to obtain the arithmetic average inclination angle Δθ1y herein. Specifically, even when a region of the reflective surface 125 has an angle θ1 that is not within the range from 20° to 40° relative to the normal line direction, the effect of reducing the degree of polarization of light herein can be obtained as long as regions of the reflective surface 125 have an average angle within the range from 20° to 40° relative to the normal line direction.

In this embodiment, the center of the semiconductor light-emitting chip 100 corresponds to the center of the quadrangle formed by the reflective surfaces 125 of the reflector 120 disposed on the mounting substrate 101 when viewed in plan. Furthermore, the center axis of rotation of the rotation mechanism 150 corresponds to the center of the semiconductor light-emitting chip 100 when viewed in plan. Thus, the reflector 120 rotates about the center axis of rotation of the rotation mechanism 150 such that the center of the semiconductor light-emitting chip 100 is identical with the center axis of rotation of the rotation mechanism 150.

The outer circumferential surface of the reflector 120 is circular when viewed in plan. A lower portion of the outer circumferential surface of the reflector 120 includes a projection projecting outward. The reflector 120 is designed such that the center of the shape formed by the outer circumferential surface of the reflector 120 when viewed in plan is substantially identical with the center of the quadrangle formed by the reflective surfaces 125 when viewed in plan. The reflector 120 is held by the coupler 130 forming a portion of the rotation mechanism 150.

The coupler 130 is held on the mounting substrate 101. The coupler 130 is ring-shaped, and its inner circumferential surface is circular when viewed in plan. A bottom portion of the coupler 130 has an opening in which the semiconductor light-emitting chip 100 is placed, and the coupler 130 further includes a cylindrical portion extending vertically upward from an outer portion of the bottom portion. The coupler 130 is designed such that the center of the cylindrical portion of the coupler 130 when viewed in plan is substantially identical with the center of the semiconductor light-emitting chip 100 when viewed in plan. The inner circumferential surface of the cylindrical portion of the coupler 130 has a recess when viewed in cross section. The projection formed on the outer circumferential surface of the reflector 120 is fitted into the recess formed in the inner circumferential surface of the cylindrical portion of the coupler 130, and the inner circumferential surface of the cylindrical portion of the coupler 130 and the inside bottom surface of the coupler 130 are in contact with the outer circumferential surface of the reflector 120 and the bottom surface thereof, respectively. Therefore, while the projection is fitted into the recess, the outer circumferential surface of the reflector 120 and the bottom surface thereof slide over the inner circumferential surface of the cylindrical portion of the coupler 130, and the inside bottom surface of the coupler 130, respectively. Thus, the reflector 120 is rotatable relative to the coupler 130.

Figure 8:
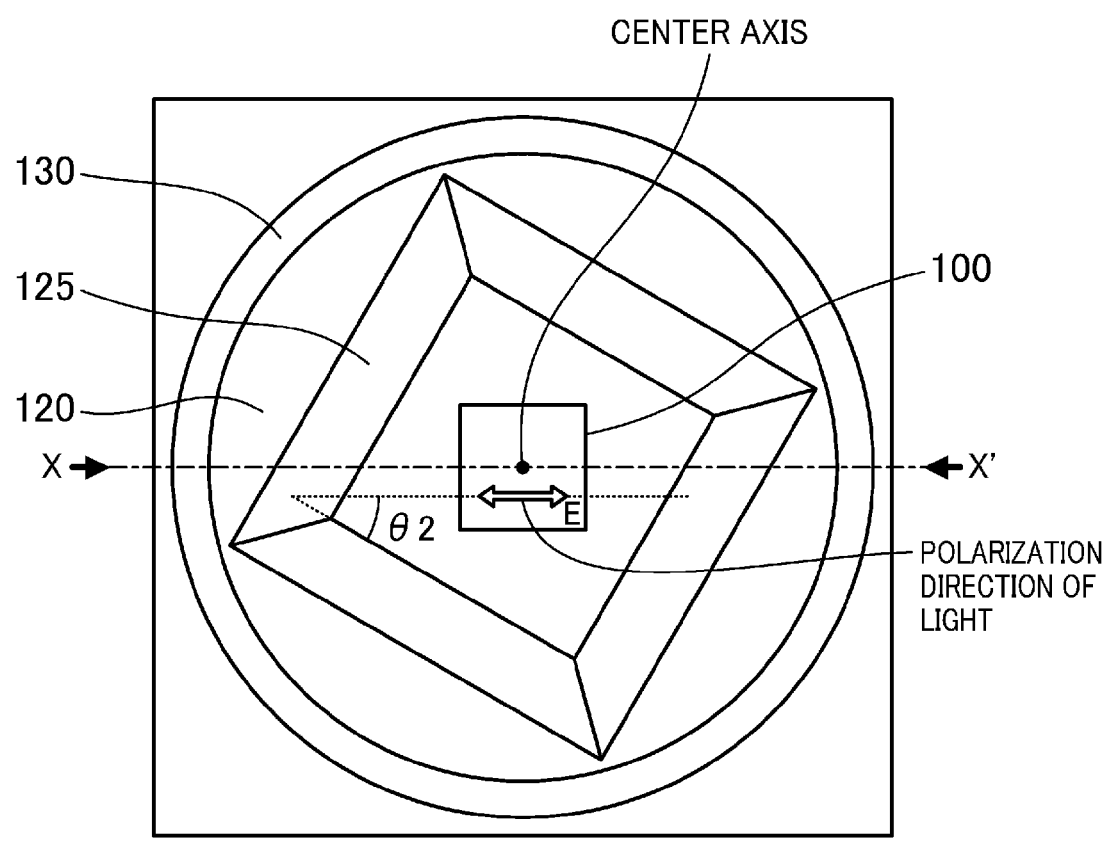
FIG. 8 is a plan view illustrating the condition where a reflector of the nitride semiconductor light-emitting device according to the embodiment is rotated by an angle $\theta 2$.

FIG. 8 illustrates an example in which the reflector 120 in FIG. 4A is rotated at an angle of 30° from the polarization direction of light. As such, the provision of the rotation mechanism 150 configured to optionally rotate the reflector 120 on the mounting surface allows a user to set the angle θ2 between the polarization direction of light from the semiconductor light-emitting chip 100 and one of the reflective surfaces 125 of the reflector 120 at an optional angle. For example, when the angle θ2 is set within the range from 0° to 10° or within the range from 80° to 90°, this can provide a semiconductor light-emitting device emitting light having a high degree of polarization. When the angle θ2 is set within the range from 30° to 60°, this can provide a semiconductor light-emitting device emitting light having a low degree of polarization. When the angle θ2 is set within the range from 10° to 30° or within the range from 60° to 80°, this can provide a semiconductor light-emitting device emitting light having an intermediate degree of polarization.

The projection of the reflector 120 may be continuously formed around the outer circumferential surface of the reflector 120. Alternatively, the reflector 120 may include projections at discontinuous locations. When the reflector 120 includes projections at discontinuous locations, at least three projections can be formed.

The recess formed in the inner circumferential surface of the coupler 130 may be circumferentially continuous. Alternatively, recesses may be formed in discontinuous portions of the inner circumferential surface. Also when the angle θ2 to be set is limited within a predetermined angle range, recesses may be formed in discontinuous portions of the inner circumferential surface.

The projection of the reflector 120 does not always need to be formed on the lower portion of the outer circumferential surface of the reflector 120, and can be formed on a portion of the reflector 120 facing the inner circumferential surface of the coupler 130.

The nitride semiconductor light-emitting device according to this embodiment may further include a polarization control member 200 varying the degree of polarization of polarized light depending on the direction of incidence of the polarized light. For example, as illustrated in FIGS. 9A and 9B, the nitride semiconductor light-emitting device according to this embodiment includes a mounting substrate 101, a semiconductor light-emitting chip 100 mounted on the mounting substrate 101 to emit polarized light, a reflection member 120 having reflective surfaces 125 off which the polarized light is reflected, a polarization control member 200 held on the reflection member 120 and varying the degree of polarization of the polarized light depending on the direction of incidence of the polarized light, and a rotation mechanism 150 held on the mounting substrate 101, and holding the reflection member 120 and the polarization control member 200 such that the reflection member 120 is rotatable around the semiconductor light-emitting chip 100.

For example, a polarizing plate or a polarizing film can be used as the polarization control member 200. An absorption axis of the polarizing plate or the polarizing film is parallel to two opposite sides of the shape formed by the reflective surfaces 125 when viewed in plan. The user can set the angle θ2 between the polarization direction of light from the semiconductor light-emitting chip 100 and the absorption axis of the polarization control member 200 at an optional angle. For example, when the angle θ2 is set within the range from 0° to 10°, this can provide a nitride semiconductor light-emitting device emitting light having a high degree of polarization. When the angle θ2 is set within the range from 30° to 90°, this can provide a nitride semiconductor light-emitting device emitting light having a low degree of polarization.

Figure 10A:
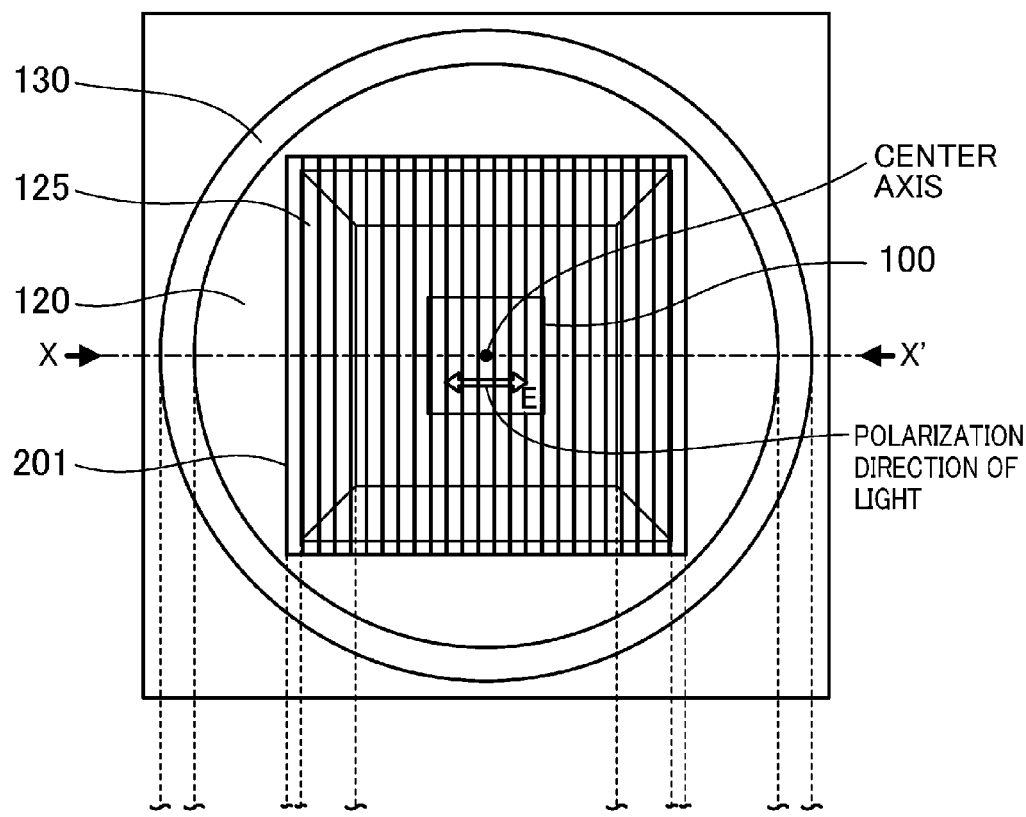
FIGS. 10A and 10B provide a plan view and a cross-sectional view, respectively, illustrating another example in which the nitride semiconductor light-emitting device illustrated in FIGS. 4A and 4B includes a polarization control member.
Figure 10B:
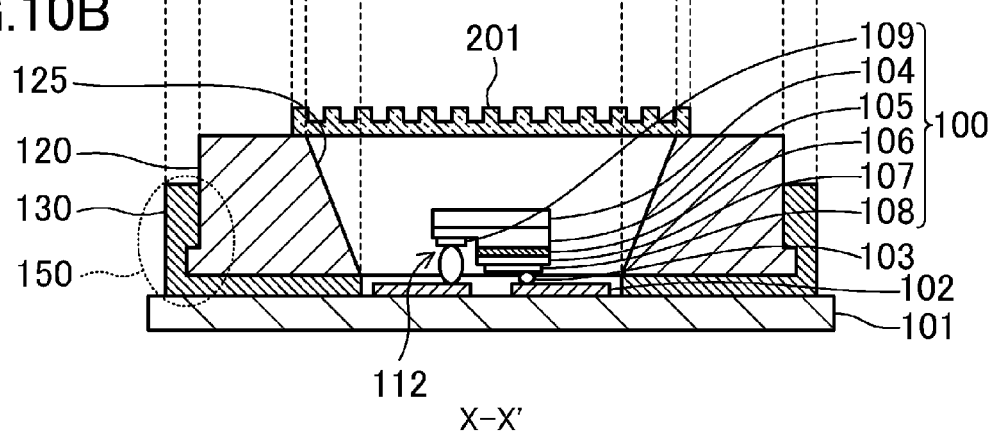

FIG. 10 illustrates an example in which a light-transmissive member 201 having a surface including stripe-shaped projections and depressions is used as the polarization control member 200. The direction of extension of the stripe-shaped projections and depressions is parallel to two opposite sides of the shape formed by the reflective surfaces 125 when viewed in plan. The user can set the angle θ2 between the polarization direction of light from the semiconductor light-emitting chip 100 and the direction of extension of the stripe-shaped projections and depressions of the light-transmissive member 201 at an optional angle. For example, when the angle θ2 is set within the range from 0° to 10°, this can provide a nitride semiconductor light-emitting device emitting light having a high degree of polarization. When the angle θ2 is set within the range from 30° to 90°, this can provide a nitride semiconductor light-emitting device emitting light having a low degree of polarization. For example, a silicone resin, an acrylic resin, or glass can be used as a material of the light-transmissive member 201 having a surface including stripe-shaped projections and depressions. The width of an upper portion of each of the projections among the stripe-shaped projections and depressions can be not less than 100 nm and not more than 10 μm. The width of the bottom of each of the recesses can be not less than 100 nm and not more than 10 μm. The cross-sectional shape of each of the projections can be any one of various shapes, such as a rectangle, a triangle, or a trapezoid.

Figure 11A:
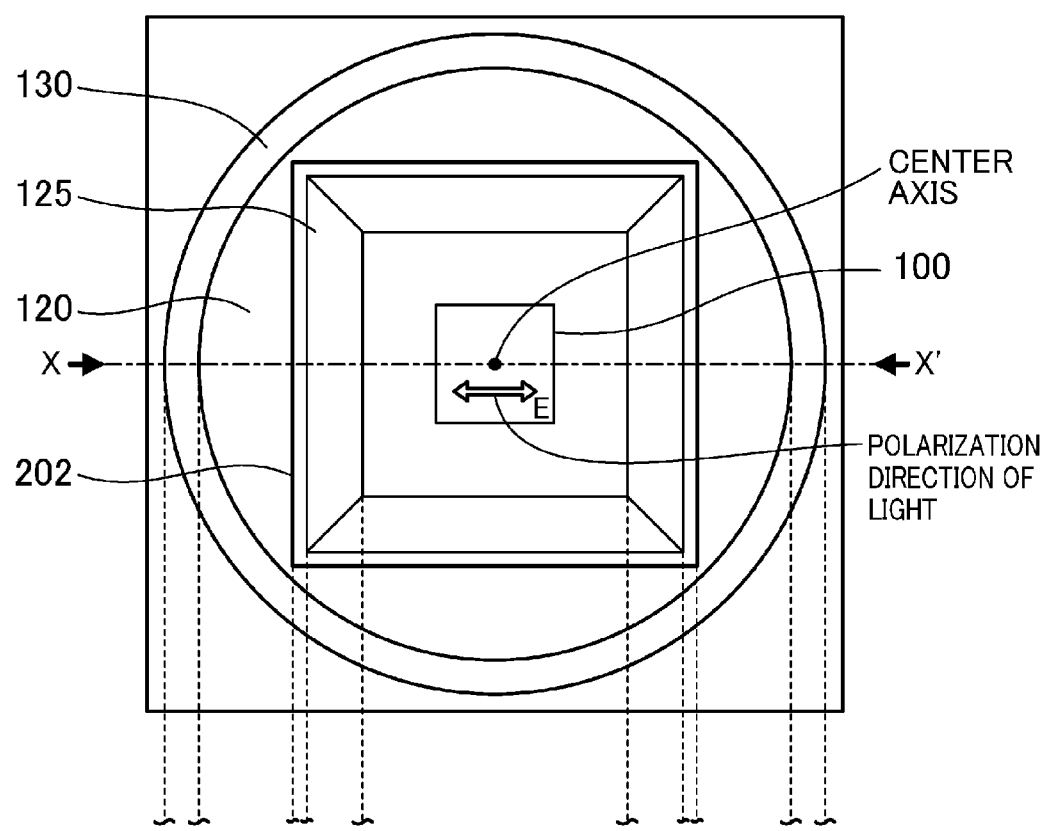
FIGS. 11A and 11B provide a plan view and a cross-sectional view, respectively, illustrating still another example in which the nitride semiconductor light-emitting device illustrated in FIGS. 4A and 4B includes a polarization control member.
Figure 11B:
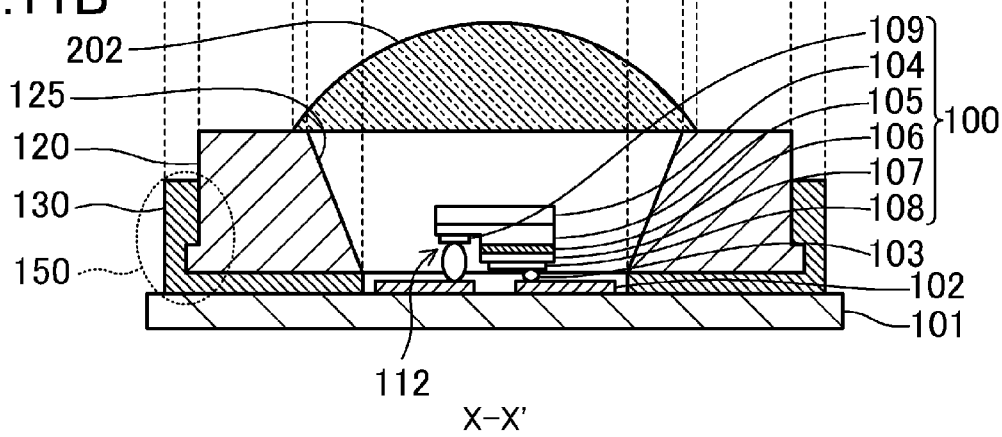

FIG. 11 illustrates an example in which a semicylindrical light-transmissive member 202 is used as the polarization control member 200. A cross section of the semicylindrical light-transmissive member 202 does not need to be perfectly semicircular, and may form a shape corresponding to a portion of a semicircle. The axis of the semicylindrical light-transmissive member 202 is parallel to two opposite sides of the shape formed by the reflective surfaces 125 when viewed in plan. The user can set the angle θ2 between the polarization direction of light from the semiconductor light-emitting chip 100 and the axis of the semicylindrical light-transmissive member 202 at an optional angle. For example, when the angle θ2 is set within the range from 0° to 10°, this can provide a nitride semiconductor light-emitting device emitting light having a high degree of polarization. When the angle θ2 is set within the range from 30° to 60°, this can provide a nitride semiconductor light-emitting device emitting light having a low degree of polarization. For example, a silicone resin, an acrylic resin, or glass can be used as a material of the semicylindrical light-transmissive member 202.

As illustrated in FIG. 4B, the reflector 120 surrounds the semiconductor light-emitting chip 100. In other words, the side surfaces of the semiconductor light-emitting chip 100 face the corresponding inner surfaces of the reflector 120, i.e., the corresponding reflective surfaces 125. The shape formed by the reflective surfaces 125 when viewed in plan may be elliptical, polygonal, rectangular, or square.

(First Variation of Embodiment)

Figure 12:
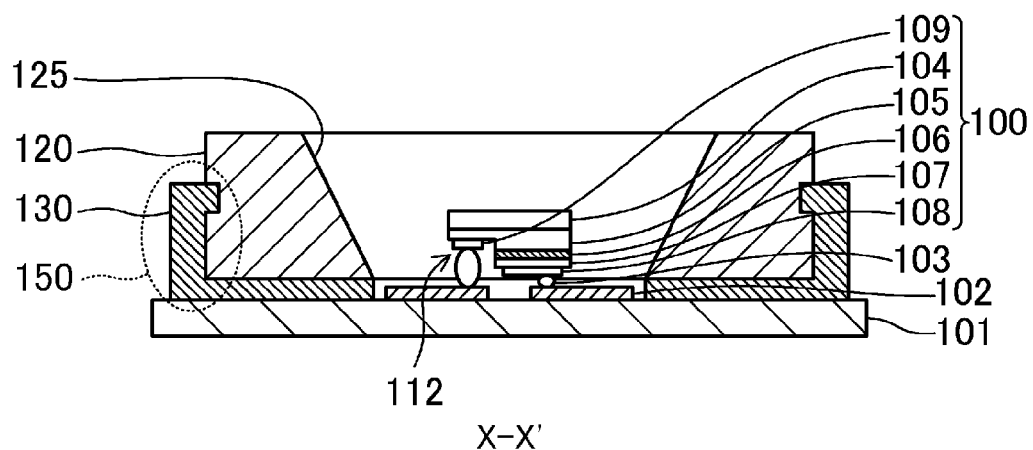
FIG. 12 is a cross-sectional view illustrating a nitride semiconductor light-emitting device according to a first variation of the embodiment.

FIG. 12 illustrates the configuration of a nitride semiconductor light-emitting device according to a first variation of this embodiment when viewed in cross section taken along the line X-X'. In FIG. 12, the same characters as those given to components of the nitride semiconductor light-emitting device illustrated in FIGS. 4A and 4B are used to represent equivalent components. Similar statements apply also to a second variation and subsequent variations. As illustrated in FIG. 12, in the first variation, the outer circumferential surface of a reflector 120 has a recess. The inner circumferential surface of a cylindrical portion of a coupler 130 includes a projection fitted into the recess formed in the outer circumferential surface of the reflector 120. Thus, while the projection is fitted into the recess, the outer circumferential surface of the reflector 120 and the bottom surface thereof slide over the inner circumferential surface of the cylindrical portion of the coupler 130 and the inside bottom surface of the coupler 130, respectively.

The projection of the coupler 130 may be circumferentially continuously formed in the inner circumferential surface of the coupler 130. Alternatively, the coupler 130 may include projections at discontinuous locations. When the coupler 130 includes projections at discontinuous locations, at least three projections can be formed.

The recess formed in the outer circumferential surface of the reflector 120 may be circumferentially continuous. Alternatively, recesses may be formed in discontinuous portions of the outer circumferential surface. Also when the angle θ2 to be set is limited within a predetermined angle range, recesses can be formed in discontinuous portions of the outer circumferential surface.

(Second Variation of Embodiment)

Figure 13:
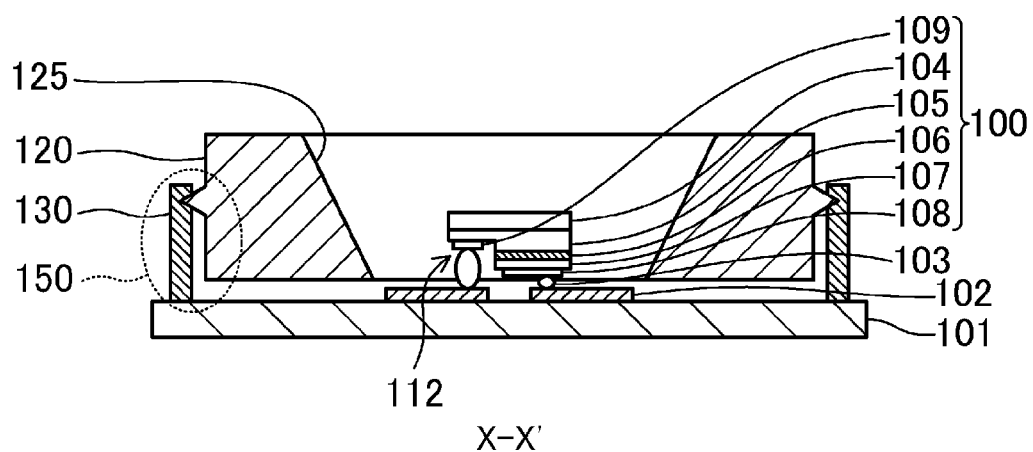
FIG. 13 is a cross-sectional view illustrating a nitride semiconductor light-emitting device according to a second variation of the embodiment.

FIG. 13 illustrates the configuration of a nitride semiconductor light-emitting device according to a second variation of this embodiment when viewed in cross section taken along the line X-X'. As illustrated in FIG. 13, in the second variation, a projection formed on the outer circumferential surface of a reflector 120 is wedge-shaped or triangular when viewed in cross section. Furthermore, a coupler 130 does not include a bottom portion, and includes only a cylindrical portion. A circumferential recess formed in the inner circumferential surface of the cylindrical portion is wedge-shaped or triangular when viewed in cross section. An acute-angled front end portion of the projection formed on the outer circumferential surface of the reflector 120 is fitted into the recess formed in the inner circumferential surface of the coupler 130. Thus, the reflector 120 slides in the recess of the coupler 130, and the coupler 130 slides over the projection of the reflector 120; thus, portions of the outer circumferential surface of the reflector 120 except the projection are not in contact with the inner circumferential surface of the coupler 130. The bottom surface of the reflector 120 is not in contact with both the coupler 130 and a mounting substrate 101. Thus, the area of contact between the reflector 120 and the coupler 130 significantly decreases, and the friction between the reflector 120 and the coupler 130 during rotation of the reflector 120 is consequently reduced to enable smooth rotation of the reflector 120.

The projection of the reflector 120 may be continuously formed around the outer circumferential surface of the reflector 120. Alternatively, the reflector 120 may include projections at discontinuous locations. When the reflector 120 includes projections at discontinuous locations, at least three projections can be formed.

The recess formed in the inner circumferential surface of the coupler 130 may be circumferentially continuous. Alternatively, recesses may be formed in discontinuous portions of the inner circumferential surface. Also when the angle θ2 to be set is limited within a predetermined angle range, recesses can be formed in discontinuous portions of the inner circumferential surface.

(Third Variation of Embodiment)

Figure 14:
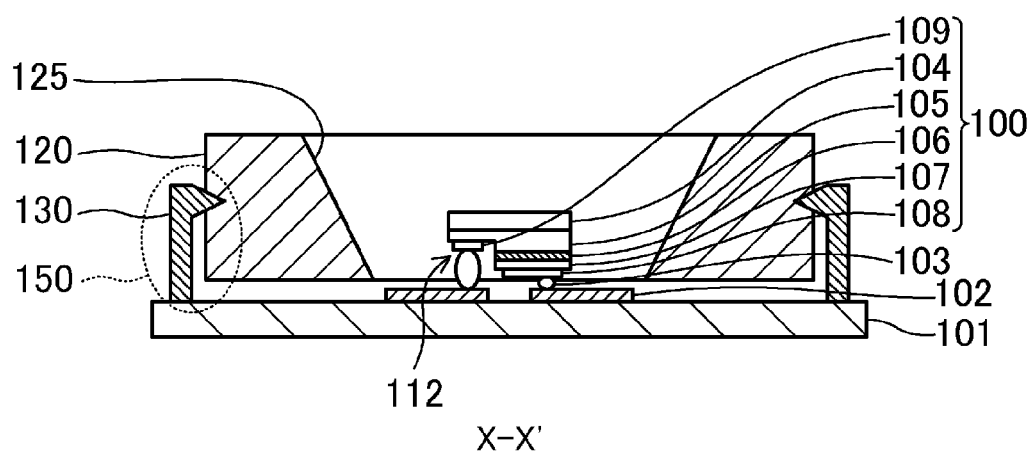
FIG. 14 is a cross-sectional view illustrating a nitride semiconductor light-emitting device according to a third variation of the embodiment.

FIG. 14 illustrates the configuration of a nitride semiconductor light-emitting device according to a third variation of this embodiment when viewed in cross section taken along the line X-X'. As illustrated in FIG. 14, in the third variation, a continuous recess formed in the outer circumferential surface of a reflector 120 is wedge-shaped or triangular when viewed in cross section. Furthermore, a coupler 130 does not include a bottom portion, and includes only a cylindrical portion. A projection formed on the inner circumferential surface of the cylindrical portion is wedge-shaped or triangular when viewed in cross section. An acute-angled front end portion of the projection formed on the inner circumferential surface of the coupler 130 is fitted into the recess formed in the outer circumferential surface of the reflector 120. Thus, the reflector 120 slides over the projection of the coupler 130, and the coupler 130 slides in the recess of the reflector 120; thus, portions of the outer circumferential surface of the reflector 120 except the recess are not in contact with the inner circumferential surface of the coupler 130. The bottom surface of the reflector 120 is not in contact with both the coupler 130 and a mounting substrate 101. Thus, the area of contact between the reflector 120 and the coupler 130 significantly decreases, and the friction between the reflector 120 and the coupler 130 during rotation of the reflector 120 is consequently reduced to enable smooth rotation of the reflector 120.

The projection of the coupler 130 may be circumferentially continuously formed in the inner circumferential surface of the coupler 130. Alternatively, the coupler 130 may include projections at discontinuous locations. When the coupler 130 includes projections at discontinuous locations, at least three projections can be formed.

The recess formed in the outer circumferential surface of the reflector 120 may be circumferentially continuous. Alternatively, recesses may be formed in discontinuous portions of the outer circumferential surface. Also when the angle θ2 to be set is limited within a predetermined angle range, recesses can be formed in discontinuous portions of the outer circumferential surface.

(Fourth Variation of Embodiment)

Figure 15A:
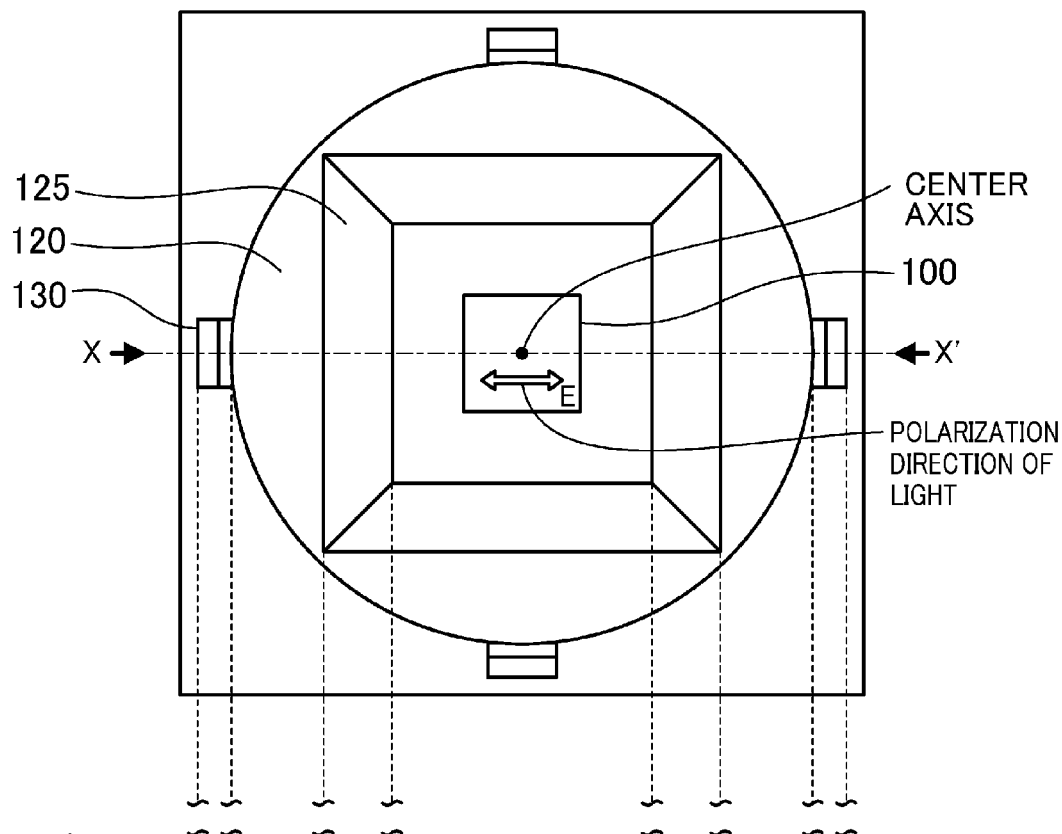
FIG. 15A is a schematic plan view illustrating a nitride semiconductor light-emitting device according to a fourth variation of the embodiment.
Figure 15B:
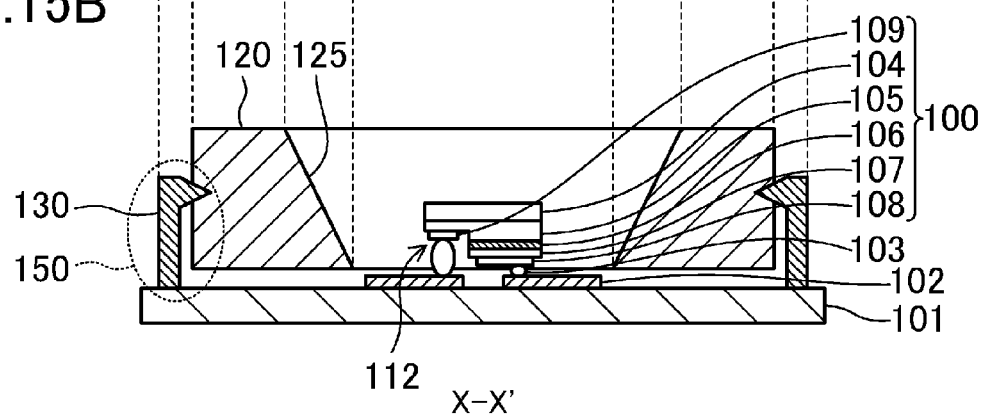
FIG. 15B is a cross-sectional view taken along the line X-X' in FIG. 15A.

FIGS. 15A and 15B are a plan view and a cross-sectional view, respectively, illustrating a nitride semiconductor light-emitting device according to a fourth variation of this embodiment. As illustrated in FIG. 15A, in the fourth variation, instead of a cylindrical coupler 130, a plurality of pillar-like couplers 130, here four pillar-like couplers 130, are provided. The inner surface of each of the pillar-like couplers 130 facing a reflector 120 includes a projection that is wedge-shaped or triangular when viewed in cross section. Front end portions of the projections of the couplers 130 are fitted into a circumferential recess that is formed in the outer circumferential surface of the reflector 120 and is wedge-shaped or triangular when viewed in cross section. Thus, the reflector 120 slides over the projections of the couplers 130, and the couplers 130 slide in the recess of the reflector 120; thus, portions of the outer circumferential surface of the reflector 120 except the recess are not in contact with the inner circumferential surface of the coupler 130. The bottom surface of the reflector 120 is not in contact with both the coupler 130 and a mounting substrate 101. Thus, the area of contact between the reflector 120 and the coupler 130 significantly decreases, and the friction between the reflector 120 and the coupler 130 during rotation of the reflector 120 is consequently reduced to enable smooth rotation of the reflector 120.

As such, the couplers 130 according to this variation do not surround the outer circumferential surface of the reflector 120, and are discretely located when viewed in plan. The positioning of the couplers 130 can further reduce the area of contact between the reflector 120 and the couplers 130 to reduce the friction therebetween during rotation of the reflector 120. This reduction enables smooth rotation of the reflector 120. Furthermore, the couplers 130 can be each reduced in size and weight. If the number of the discretely located couplers 130 is not less than three, the joint strength between the reflector 120 and the mounting substrate 101 is maintained. Thus, the reflector 120 tends to be steady during the rotation of the reflector 120.

The recess formed in the outer circumferential surface of the reflector 120 may be circumferentially continuous. Alternatively, recesses may be formed in discontinuous portions of the outer circumferential surface. Also when the angle θ2 to be set is limited within a predetermined angle range, recesses can be formed in discontinuous portions of the outer circumferential surface.

(Fifth Variation of Embodiment)

Figure 16A:
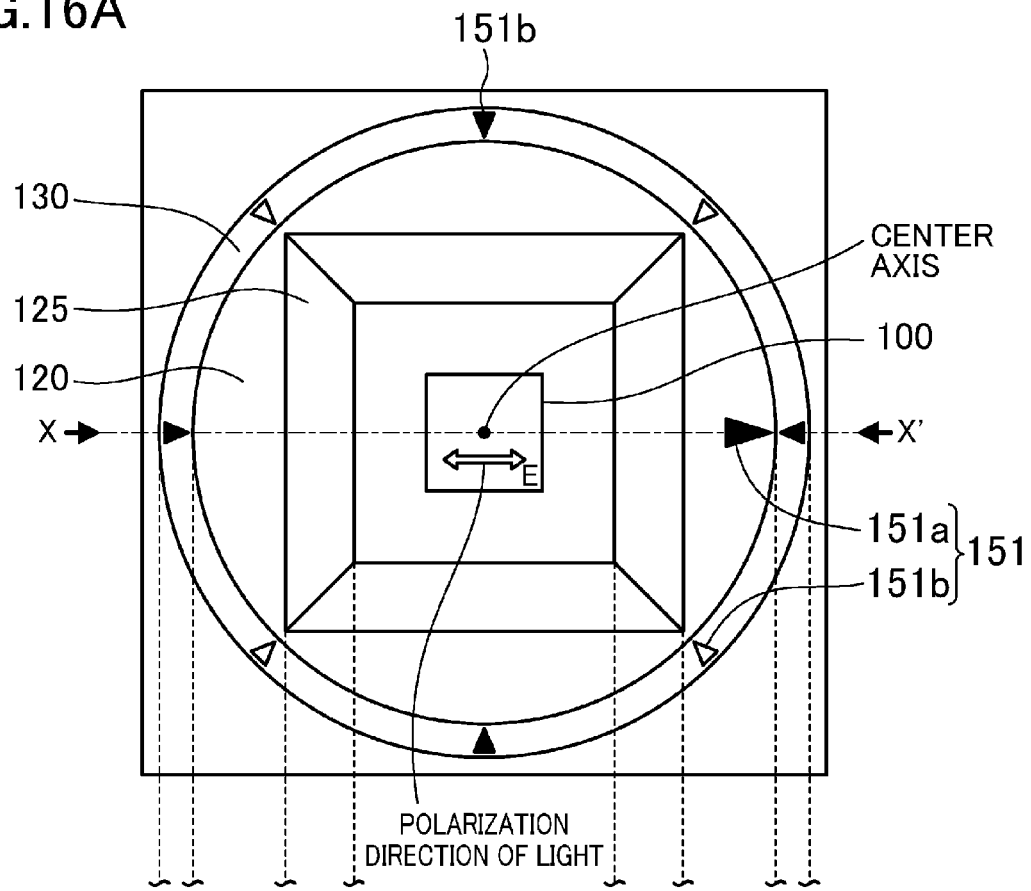
FIG. 16A is a schematic plan view illustrating a nitride semiconductor light-emitting device according to a fifth variation of the embodiment.
Figure 16B:
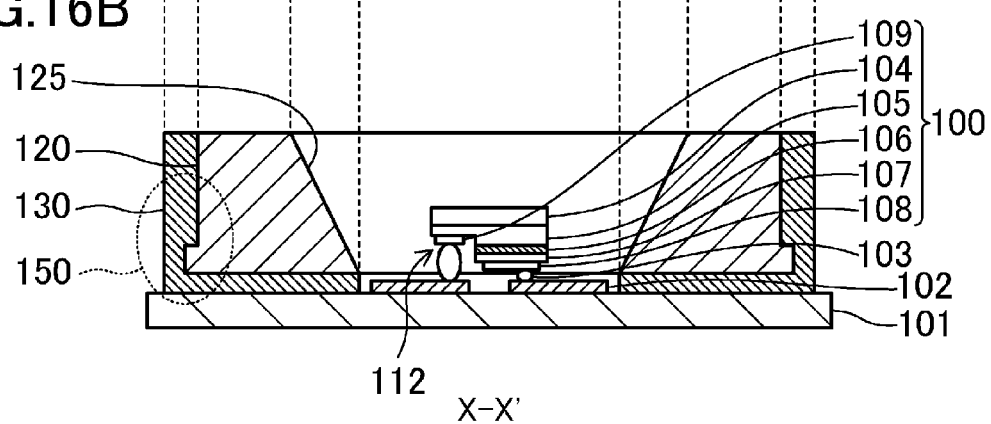
FIG. 16B is a cross-sectional view taken along the line X-X' in FIG. 16A.

FIGS. 16A and 16B are a plan view and a cross-sectional view, respectively, illustrating a nitride semiconductor light-emitting device according to a fifth variation of this embodiment. As illustrated in FIGS. 16A and 16B, components forming the nitride semiconductor light-emitting device according to the fifth variation are substantially equivalent to those forming the nitride semiconductor light-emitting device according to the embodiment.

As illustrated in FIG. 16A, unlike the nitride semiconductor light-emitting device according to the embodiment, markers 151 are formed on the upper surface of the nitride semiconductor light-emitting device according to the fifth variation to enable the recognition of the relative rotational positions of a reflector 120 and a coupler 130.

Specifically, a first marker 151a is formed on the upper surface of the reflector 120, and second markers 151b are formed on the upper surface of the coupler 130.

The markers 151 each have a size that can be visually recognized, and can each have a maximum length of 100 μm or more. As such, the markers 151 each having a size that can be visually recognized are disposed on the reflector 120 and the coupler 130 to allow a user to easily determine the angle θ2 between the polarization direction of light from a semiconductor light-emitting chip 100 and one of reflective surfaces 125 of the reflector 120.

Thus, in the nitride semiconductor light-emitting device of this variation, the degree of polarization of reflected light can be easily determined based on the position of the first marker 151a corresponding to the angle θ2.

The number of first markers 151a merely needs to be at least one. Since the first marker 151a is located on the reflector 120 that is a rotator, the ease of visual recognition of the angle θ2 increases with decreasing number of first markers 151a. In contrast, the number of the second markers 151b is preferably not less than two. The second markers 151b may be provided such that, in particular, the ranges of angles θ2 from 0° to 10° and from 80° to 90°, within which the degree of polarization of light is high, and the range of angles θ2 from 30° to 60°, within which the degree of polarization of light is low, can be visually recognized. The second markers 151b may be provided on a mounting substrate 101.

The markers 151 may be formed as recesses, for example, by scratching. Alternatively, the markers 151 may be formed, for example, by painting.

The projection of the reflector 120 may be continuously formed around the outer circumferential surface of the reflector 120. Alternatively, the reflector 120 may include projections at discontinuous locations. When the reflector 120 includes projections at discontinuous locations, at least three projections can be formed.

The recess formed in the inner circumferential surface of the coupler 130 may be circumferentially continuous. Alternatively, recesses may be formed in discontinuous portions of the inner circumferential surface. Also when the angle θ2 to be set is limited within a predetermined angle range, recesses can be formed in discontinuous portions of the inner circumferential surface.

(Sixth Variation of Embodiment)

Figure 17A:
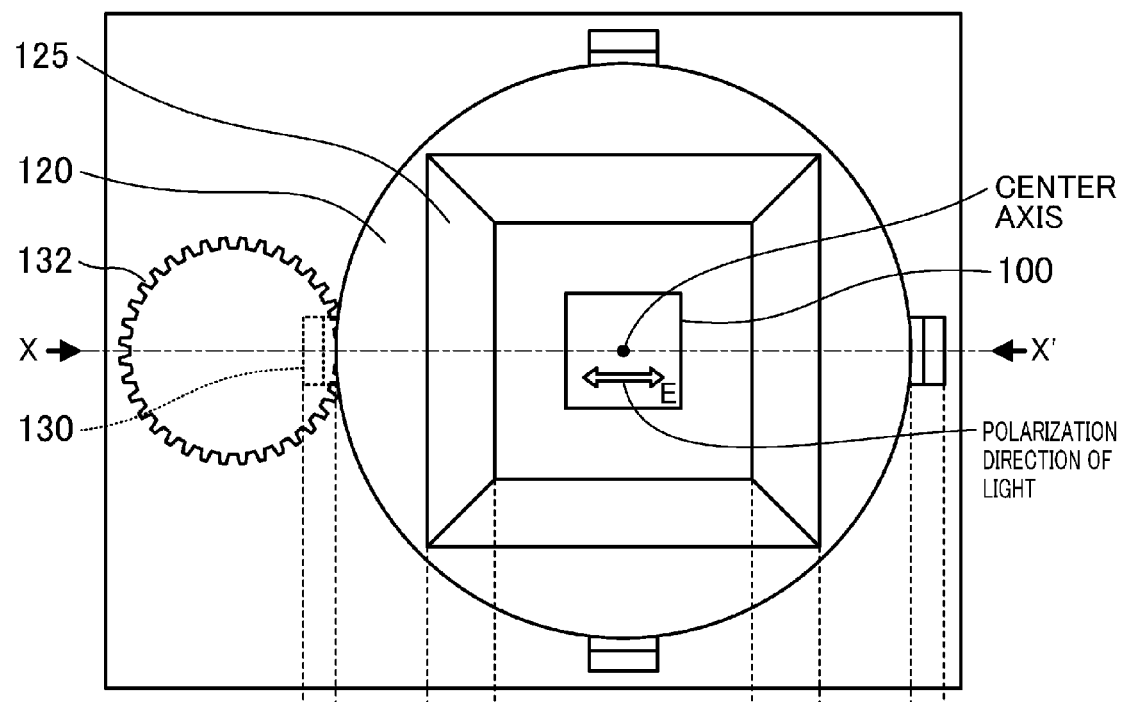
FIG. 17A is a schematic plan view illustrating a nitride semiconductor light-emitting device according to a sixth variation of the embodiment.
Figure 17B:
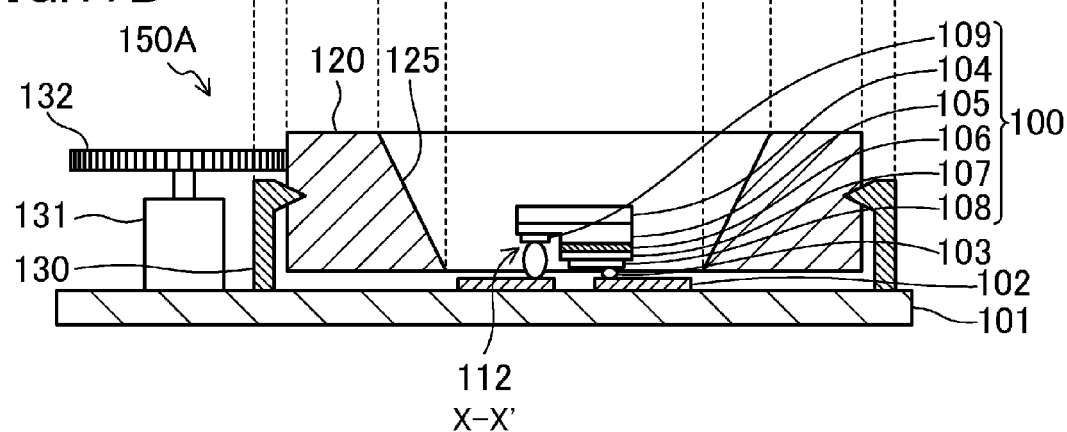
FIG. 17B is a cross-sectional view taken along the line X-X' in FIG. 17A.

FIGS. 17A and 17B are a plan view and a cross-sectional view, respectively, illustrating a nitride semiconductor light-emitting device according to a sixth variation of this embodiment. As illustrated in FIG. 17A, the nitride semiconductor light-emitting device according to the sixth variation includes not only the components of the fourth variation but also a rotation mechanism 150A including a stepping motor 131 for rotating a reflector 120, and a gear 132 connected to a rotation shaft of the stepping motor 131 to actuate the reflector 120 through the application of pressure to the outer circumferential surface of the reflector 120. The stepping motor 131 enables electrical control over the angle θ2 between the polarization direction of light from a semiconductor light-emitting chip 100 and one of reflective surfaces 125 of the reflector 120 from outside the nitride semiconductor light-emitting device.

(Seventh Variation of Embodiment)

Figure 18A:
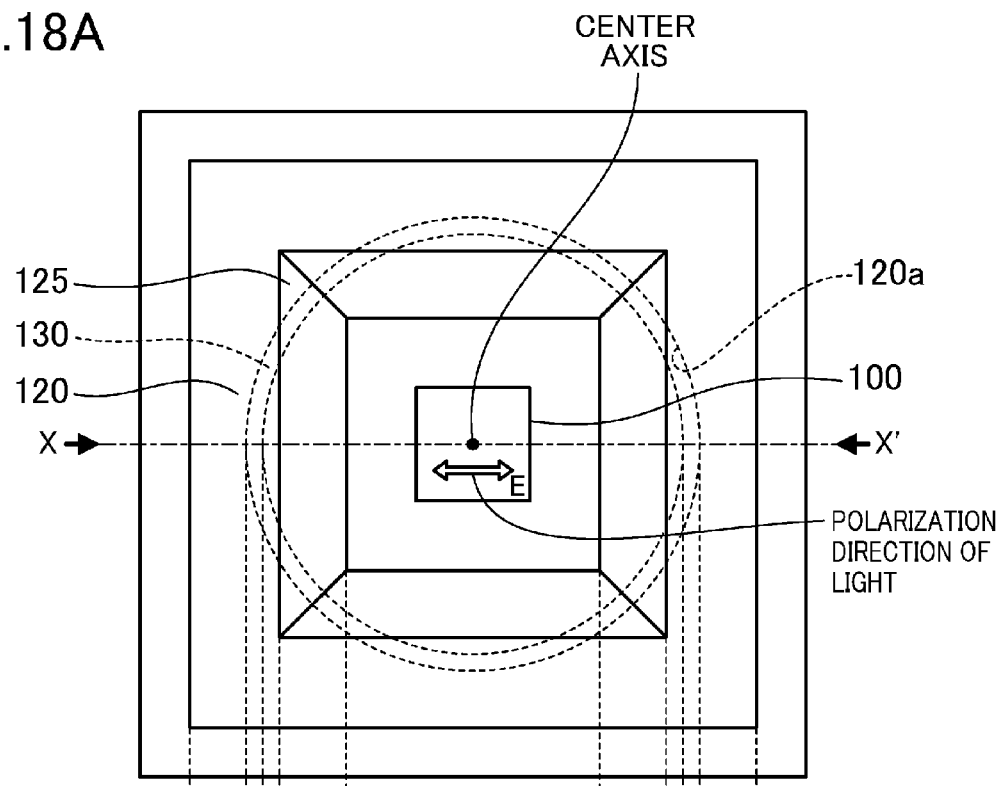
FIG. 18A is a schematic plan view illustrating a nitride semiconductor light-emitting device according to a seventh variation of the embodiment.
Figure 18B:
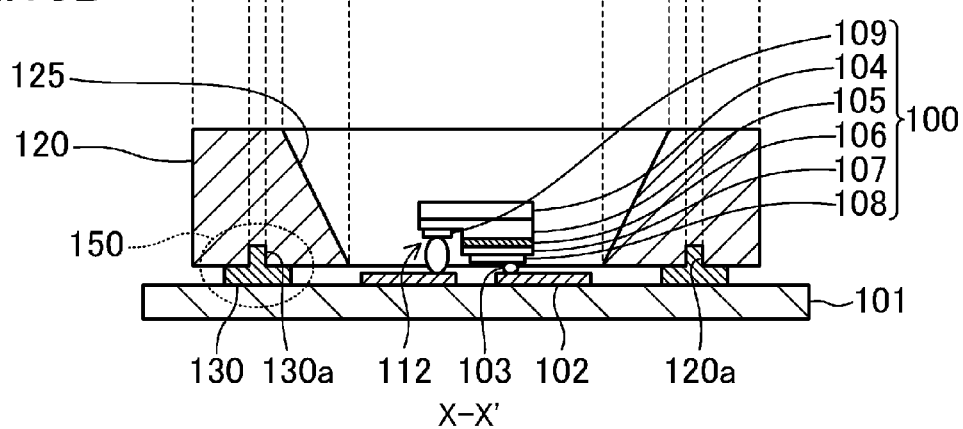
FIG. 18B is a cross-sectional view taken along the line X-X' in FIG. 18A.

FIGS. 18A and 18B are a plan view and a cross-sectional view, respectively, illustrating a nitride semiconductor light-emitting device according to a seventh variation of this embodiment. As illustrated in FIG. 18A, the shape of the outer circumferential surface of a reflector 120 according to the seventh variation when viewed in plan is a quadrangle similar to the shape formed by a plurality of reflective surfaces 125 of the reflector 120 when viewed in plan. However, the quadrangular outside shape of the reflector 120 when viewed in plan is merely an example, and the outside shape thereof when viewed in plan can be optional.

Furthermore, as illustrated in FIG. 18B, the reflector 120 according to this variation has a bottom surface including a groove 120a that forms a recess-like shape when viewed in cross section and is ring-shaped when viewed in plan. The reflector 120 is designed such that the center of the ring-shaped groove 120a is substantially identical with the center of the quadrangle formed by the reflective surfaces 125 when viewed in plan.

The reflector 120 according to this variation is held on a mounting substrate 101, and is supported by a ring-shaped coupler 130 having an upper surface including a projection 130a. The coupler 130 is designed such that the center of the ring-shaped coupler 130 is substantially identical with the center of a semiconductor light-emitting chip 100.

The projection 130a on the upper surface of the coupler 130 is fitted into the groove 120a formed in the bottom surface of the reflector 120, and the reflector 120 slides over the coupler 130. Thus, the reflector 120 is rotatable relative to the coupler 130.

Since, as such, in this variation, a rotation mechanism 150 is disposed on the bottom surface of the reflector 120, the shape of the outer circumferential surface of the reflector 120 when viewed in plan can be optional.

The rotation mechanism 150 according to this variation includes the groove 120a of the reflector 120, and the projection 130a of the coupler 130 fitted into the groove 120a. However, the reflector 120 may include a projection projecting downward, and the upper surface of the coupler 130 may have a groove into which the projection of the reflector 120 is fitted.

(Eighth Variation of Embodiment)

Figure 19A:
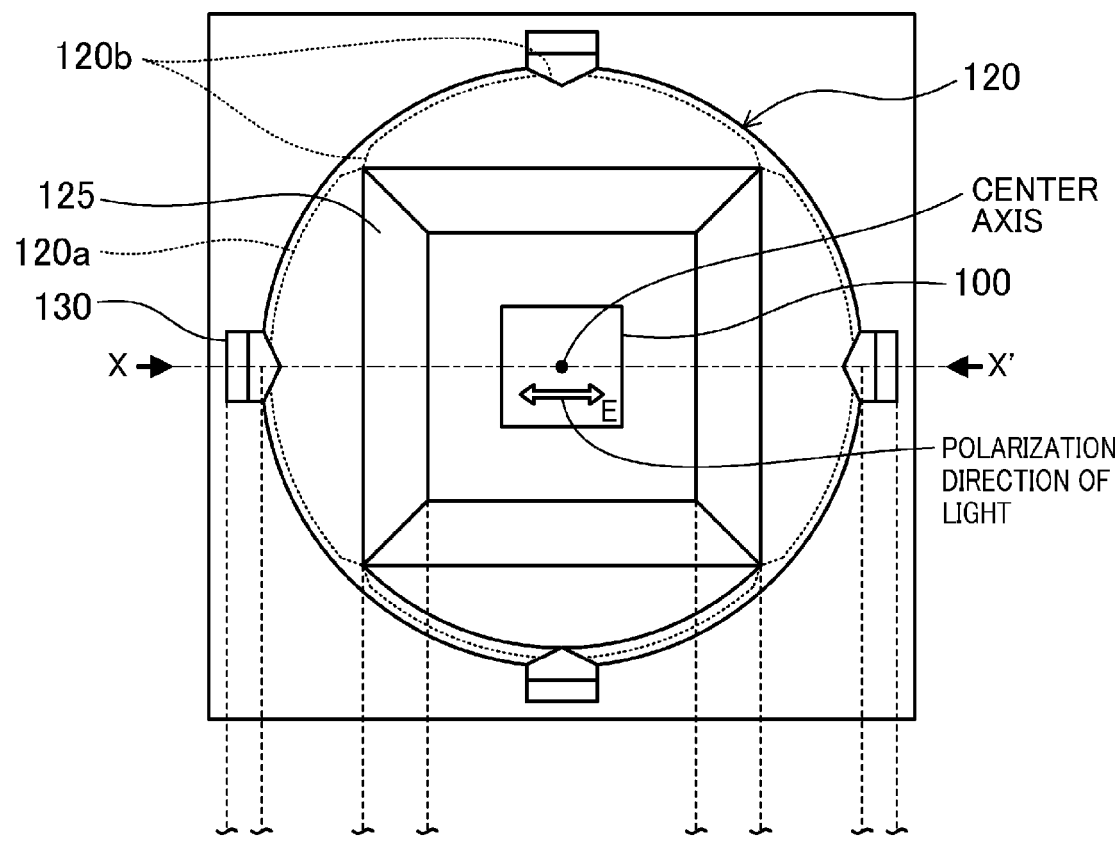
FIG. 19A is a schematic plan view illustrating a nitride semiconductor light-emitting device according to an eighth variation of the embodiment.
Figure 19B:
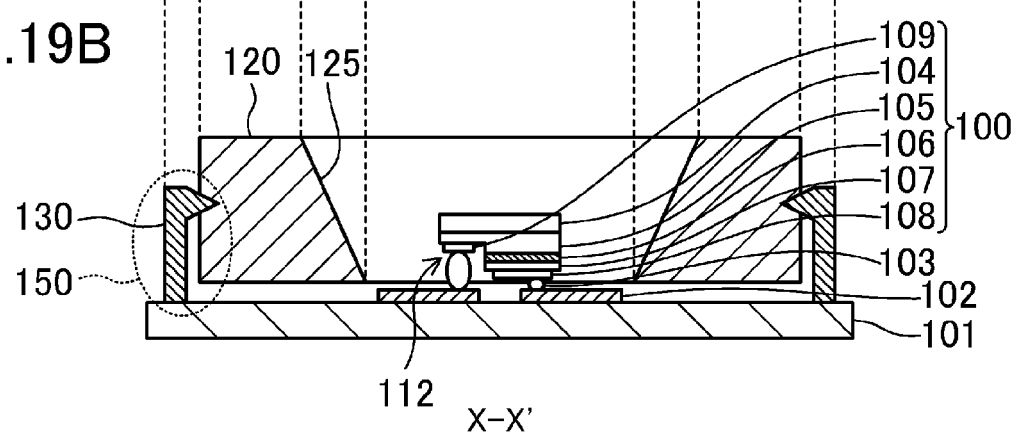
FIG. 19B is a cross-sectional view taken along the line X-X' in FIG. 19A.

FIGS. 19A and 19B are a plan view and a cross-sectional view, respectively, illustrating a nitride semiconductor light-emitting device according to an eighth variation of this embodiment. As illustrated in FIG. 19A, a plurality of pillar-like couplers 130, here four pillar-like couplers 130, are provided. A groove 120a and stopper recesses 120b are formed in the outer circumferential surface of the reflector 120. The groove 120a is formed along the entire perimeter of the reflector 120. The stopper recesses 120b are each shaped such that a front end portion of a projection of one of the couplers 130 is fitted into the stopper recess 120b. The stopper recesses 120b are formed in the reflector 120 such that the reflector 120 is fixed at desired angles. During rotation of the reflector 120, the couplers 130 open outward, and the reflector 120 slides over the front end portions of the projections of the couplers 130 in the groove 120a, and is stably fixed at angles at which the stopper recesses 120b are formed. The stopper recesses 120b can be formed at angles that increase the degree of polarization of light, or angles that decrease the degree of polarization of light.

As such, the nitride semiconductor light-emitting device according to the eighth variation of this embodiment has a stopper structure that can stably fix the reflector 120 at predetermined angles, and thus, can prevent the reflector 120 from unintentionally rotating due to the influence of disturbances, such as vibrations during use of the device. Furthermore, a user does not need to determine the angle of rotation of the reflector 120 as required, and an optimum angle can be easily selected.

Next, a material of each of the reflectors 120 and a material of each of the couplers 130 used in the embodiment and its variations will be exemplified.

A metal material, such as aluminum (Al) or silver (Ag), a resin material, or a ceramic material can be used as a material of the reflector 120. The reflector 120 made of a metal material can be manufactured by pressing with dies. The reflector 120 made of a resin material can be manufactured by injection molding with molds. The reflector 120 made of a ceramic material can be manufactured by pressure molding with molds. A material having high linear reflectivity can be used as a material of the reflective surfaces 125 of the reflector 120. The material having high linear reflectivity herein denotes a material having a linear reflectivity that is higher than the diffuse reflectivity of the material. For example, aluminum or silver having a surface roughness of not greater than 100 nm can be used. Alternatively, aluminum or silver, for example, may be deposited on the surface of, e.g., a resin material or a ceramic material. The reflector 120 and the reflective surfaces 125 do not need to be made of an identical material. A material having high linear reflectivity may be used as a material of only the reflective surfaces 125.

A metal material, such as aluminum (Al), copper (Cu), or iron (Fe), or a resin material, for example, can be used as a material of the coupler 130. The coupler 130 made of a metal material can be manufactured by pressing with dies. The coupler 130 made of a resin material can be manufactured by injection molding with molds. Since the coupler 130 is a member for holding the reflector 120, a material of the coupler 130 can be selected from wear-resistant materials. For example, the coating of a surface of the coupler 130 being in contact with the reflector 120 with diamond-like carbon (DLC) increases the resistance to wear during the slide of the reflector 120 over the coupler 130.

The markers 151 according to the fifth variation can be used also in the embodiment and the first through fourth, sixth, and seventh variations. When the markers 151 are used in the sixth and seventh variations, the markers 151 are provided on the reflector 120.

In the sixth variation, the nitride semiconductor light-emitting device according to the fourth variation further includes the stepping motor 131. However, the nitride semiconductor light-emitting device including the stepping motor 131 is not limited to the nitride semiconductor light-emitting device according to the fourth variation. The stepping motor 131 can be used also in, e.g., the embodiment and the first through third, fifth, and seventh variations. However, when the stepping motor 131 is used in the fifth variation illustrated in FIG. 16, the outer circumferential surface of the reflector 120 needs to be exposed. Furthermore, when the stepping motor 131 is used in the seventh variation illustrated in FIG. 18, the shape of the outer circumferential surface of the reflector 120 when viewed in plan needs to be circular.

In the embodiment and the first through third and fifth variations, the shape of the outer circumferential surface of the coupler 130 when viewed in plan is not limited to a circular shape. It may be, for example, polygonal.

Figure 20A:
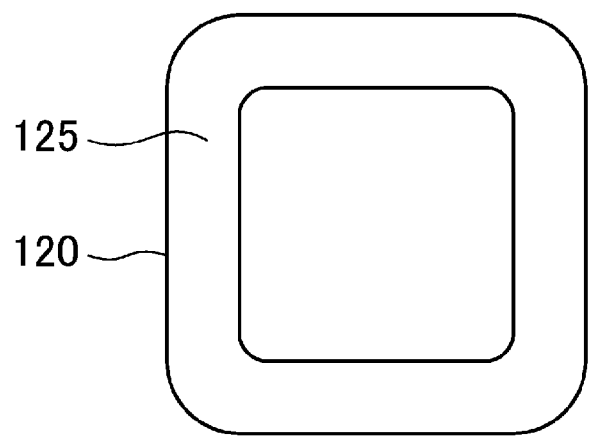
FIGS. 20A-20C are schematic plan views illustrating variations of the shape formed by reflective surfaces of the reflector when viewed in plan.
Figure 20B:
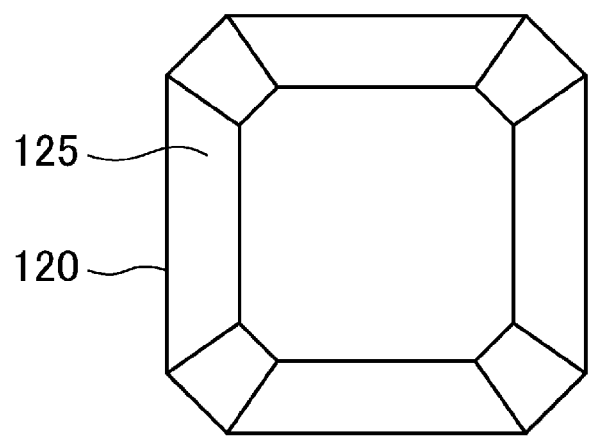
Figure 20C:
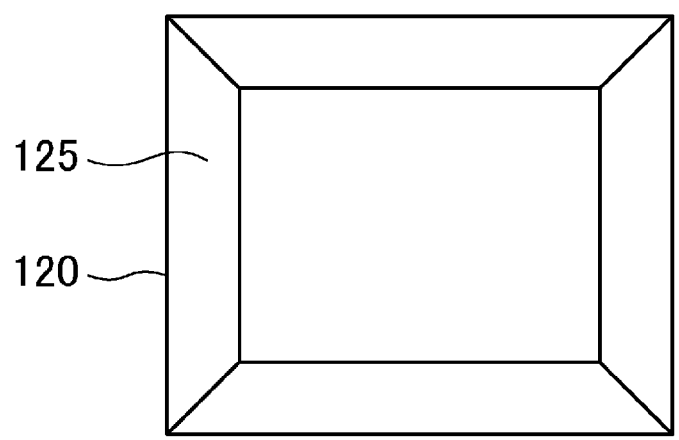

In the embodiment and the first through seventh variations, the shape formed by the reflective surfaces when viewed in plan is not limited to a square shape. FIGS. 20A-20C illustrate various shapes formed by the reflective surfaces 125 when viewed in plan. As illustrated in FIG. 20A, the shape formed by the reflective surface 125 when viewed in plan may be a square shape having corner portions each with a curved surface. Alternatively, as illustrated in FIG. 20B, the shape formed by the reflective surfaces 125 when viewed in plan may be an octagonal shape in which a square shape has corner portions each with a small flat plane. Alternatively, as illustrated in FIG. 20C, the shape formed by the reflective surfaces 125 when viewed in plan may be rectangular. When the shape is rectangular, the length of a long side of the rectangular shape may be not greater than 2.2 times the length of a short side of the rectangular shape.

In each of the embodiment and its variations, only one semiconductor light-emitting chip 100 is mounted on the mounting substrate 101. However, the number of semiconductor light-emitting chips 100 is not limited to one. A plurality of semiconductor light-emitting chips may be mounted. However, in this case, the polarization directions of light emitted from such semiconductor light-emitting chips are preferably identical.

(Fabrication Method)

A method for fabricating a semiconductor light-emitting device according to the embodiment will be described hereinafter with reference to FIGS. 4A-4C.

First, an n-type nitride semiconductor layer 105 is epitaxially grown on the principal surface of a substrate 104 having an m-plane as its principal surface and made of n-type GaN by a metal organic chemical vapor deposition (MOCVD) method or any other method. Specifically, for example, silicon (Si) is used as an n-type dopant, trimethylgallium (TMG (Ga(CH$_3$)$_3$)) being a gallium (Ga) source, and ammonia (NH$_3$) being a nitrogen (N) source are supplied to the substrate 104, and the about 1-3-μm-thick n-type nitride semiconductor layer 105 made of GaN is formed at a growth temperature of about 900-1100° C. In this stage, the substrate 104 is a substrate at the wafer level, and a plurality of light-emitting structures forming semiconductor light-emitting devices can be fabricated at once.

Next, an active layer 106 made of a nitride semiconductor is grown on the n-type nitride semiconductor layer 105. The active layer 106 has an InGaN/GaN multiple quantum well (MQW) structure in which, for example, 3-15-nm-thick well layers made of In$_{1-x}$Ga$_x$N and 6-30-nm-thick barrier layers made of GaN are alternately stacked. When the well layers made of In$_{1-x}$Ga$_x$N are formed, the growth temperature may be decreased to a temperature of about 700-800° C. to ensure incorporation of indium (In) into the well layers being grown. The wavelength of emitted light is selected based on the intended use of the semiconductor light-emitting device, and the In content ratio x is determined based on the wavelength. For example, when the wavelength is 450 nm (blue light wavelength), the In content ratio x can be 0.25-0.27. When the wavelength is 520 nm (green light wavelength), the In content ratio x can be 0.40-0.42. When the wavelength is 630 nm (red light wavelength), the In content ratio x can be 0.56-0.58.

Next, a p-type nitride semiconductor layer 107 is epitaxially grown on the active layer 106. Specifically, for example, Cp$_2$Mg (bis(cyclopentadienyl)magnesium) is used as p-type impurities, TMG and NH$_3$ are supplied, as materials, to the substrate 104, and the about 50-500-nm-thick p-type nitride semiconductor layer 107 made of p-type GaN is formed on the active layer 106 at a growth temperature of about 900-1100° C. The p-type nitride semiconductor layer 107 may contain an about 15-30-nm-thick p-type AlGaN layer. The formation of the p-type AlGaN layer can reduce the overflow of electrons that are carriers. An undoped GaN layer may be formed between the active layer 106 and the p-type nitride semiconductor layer 107.

Next, in order to activate Mg with which the p-type nitride semiconductor layer 107 is doped, the p-type nitride semiconductor layer 107 is thermally treated at a temperature of about 800-900° C. for about 20 minutes.

Next, a semiconductor stacked structure including the substrate 104, the n-type nitride semiconductor layer 105, the active layer 106, and the p-type nitride semiconductor layer 107 is partially etched by lithography and dry etching using a chlorine (Cl$_2$) gas. Thus, a recess 112 is formed by removing a portion of the p-type nitride semiconductor layer 107, a portion of the active layer 106, and a portion of the n-type nitride semiconductor layer 105 to expose a region of the n-type nitride semiconductor layer 105.

Next, an n-side electrode 109 is selectively formed on and in contact with the exposed region of the n-type nitride semiconductor layer 105. Here, for example, a multilayer film (Ti/Pt layer) of titanium (Ti) and platinum (Pt) is formed as the n-side electrode 109.

Next, a p-side electrode 108 is selectively formed on and in contact with the p-type nitride semiconductor layer 107. For example, a multilayer film (Pd/Pt layer) of palladium (Pd) and platinum (Pt) is formed as the p-side electrode 108. Thereafter, heat treatment is performed to alloy an interface region between the Ti/Pt layer and the n-type nitride semiconductor layer 105 and an interface region between the Pd/Pt layer and the p-type nitride semiconductor layer 107. The order in which the n-side electrode 109 and the p-side electrode 108 are formed is not particularly limited.

Next, a (back) surface of the substrate 104 opposite to the n-type nitride semiconductor layer 105 is polished to reduce the thickness of the substrate 104 by a predetermined amount.

The wafer-level substrate 104 is singulated into individual semiconductor light-emitting chips 100 corresponding to a plurality of semiconductor light-emitting devices fabricated as above. Examples of this singulation process include various processes, such as laser dicing and cleavage. The individual semiconductor light-emitting chips 100 into which the substrate 104 has been singulated are each mounted on a mounting surface of a mounting substrate 101.

The reflector 120 and the coupler 130 may be assembled before the semiconductor light-emitting chip 100 is mounted on the mounting substrate 101. Specifically, the reflector 120 is previously fitted to the coupler 130, and then, the coupler 130 to which the reflector 120 has been fitted can be bonded onto the mounting substrate 101.

When a coupler 130 is bonded to the mounting substrate 101 together with a reflector 120, the semiconductor light-emitting chip 100 may be mounted on the mounting substrate 101 before the coupler 130 is bonded to the mounting substrate 101. Alternatively, after the coupler 130 has been bonded to the mounting substrate 101, the semiconductor light-emitting chip 100 may be mounted on the mounting substrate 101.

A metal film for forming interconnect electrodes is formed on the surface of the mounting substrate 101 through a film formation process, such as sputtering or plating. Thereafter, a desired resist pattern is formed on the formed metal film by, e.g., lithography. Thereafter, the resist pattern is transferred to the metal film by dry etching or wet etching to form interconnect electrodes 102 each having a desired electrode shape.

Next, a plurality of bumps 103 are formed on predetermined portions of the interconnect electrodes 102. Gold (Au) is preferably used as a constituent material of the bumps 103. The bumps 103 each having a diameter of about 40-80 μm can be formed with a bump bonder. The bumps 103 can be formed by Au plating instead of with a bump bonder. Subsequently, the interconnect electrodes 102 on which the plurality of bumps 103 have been formed are electrically connected to the electrodes of the semiconductor light-emitting chip 100 by, e.g., ultrasonic welding.

As such, the semiconductor light-emitting device according to the first embodiment can be obtained.

EXAMPLES

First Example

Figure 21:
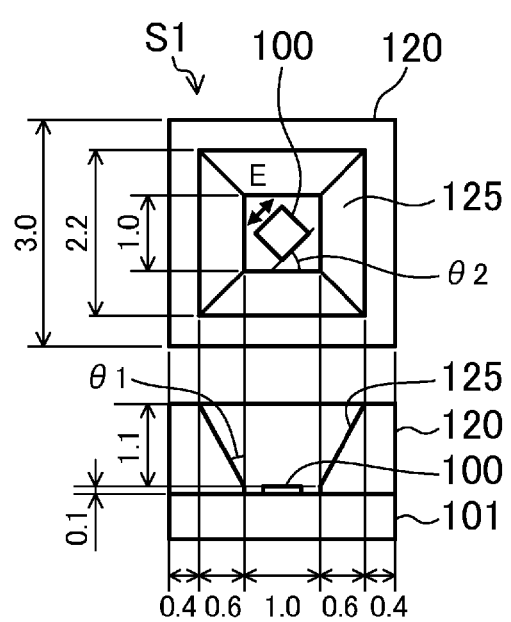
FIG. 21 provides a plan view and a cross-sectional view illustrating a nitride semiconductor light-emitting device including a reflector S1 according to a first example.

A semiconductor light-emitting device according to a first example will be described hereinafter with reference to FIG. 21. The dimensions in FIG. 21 are expressed in units of millimeters (mm). The same characters as those in the first embodiment are used to represent equivalent components. These characters and units are similar to those in other examples.

First, a method for fabricating a semiconductor light-emitting chip 100 forming a portion of the semiconductor light-emitting device according to the first example and including an active layer having a growth surface that is an m-plane will be schematically described.

First, a 2-μm-thick n-type nitride semiconductor layer made of n-type GaN, an active layer having a three-period quantum well structure including a quantum well layer made of InGaN and a barrier layer made of GaN, and a 0.5-μm-thick p-type nitride semiconductor layer made of p-type GaN were formed on a wafer-level n-type GaN substrate having an m-plane as its principal surface by, e.g., an MOCVD method.

A Ti/Al layer was formed as an n-side electrode, and an Ag layer was formed as a p-side electrode. Thereafter, the back surface of the n-type GaN substrate is polished to reduce the thickness of the n-type GaN substrate to a thickness of 100 μm.

Subsequently, grooves having a depth of about several tens of μm from the surface of the wafer were formed in the wafer including light-emitting structures along the c-axis, i.e., the [0001] direction, and the a-axis, i.e., the [11-20] direction, with laser beams. Thereafter, the wafer was broken into semiconductor light-emitting chips 100 made of an m-plane GaN-based semiconductor and having sides each having a length of 450 μm.

Subsequently, one of the fabricated semiconductor light-emitting chips 100 was mounted on a mounting substrate 101 made of AlN by flip-chip mounting. The thickness of the mounting substrate 101 made of AlN was about 0.7 mm. Interconnect electrodes 102 having a thickness of about 4 μm and made of silver (Ag) were formed on the mounting substrate 101.

As such, a semiconductor light-emitting device including the active layer having a growth surface that is an m-plane was fabricated. In this state, no reflector 120 is provided. The measured wavelength of light emitted from the semiconductor light-emitting device at an operating current of 10 mA was 445 nm. The polarization direction of the emitted light is along the a-axis, and the degree of polarization of light measured along the m-axis corresponding to the normal line direction was 0.68. Such a semiconductor light-emitting device that does not include a reflector 120 corresponds to a semiconductor light-emitting device according to a first comparative example.

Separately from the semiconductor light-emitting chip, a reflector S1 made of aluminum and having a plurality of reflective surfaces 125 arranged such that the shape formed by the reflective surfaces 125 when viewed in plan is square was fabricated by pressing. The azimuth angle χ of light reflected off the reflective surfaces 125 of the reflector S1 was within the range from 42.5° to 78.7°. The angle θ1 between each of the reflective surfaces 125 and the normal line direction was 28.6°. The fabricated reflector S1 had the reflective surfaces 125 having a height of 100 μm or less from the top surface of the mounting substrate 101 and forming an angle θ1 of 0°.

Figure 22:
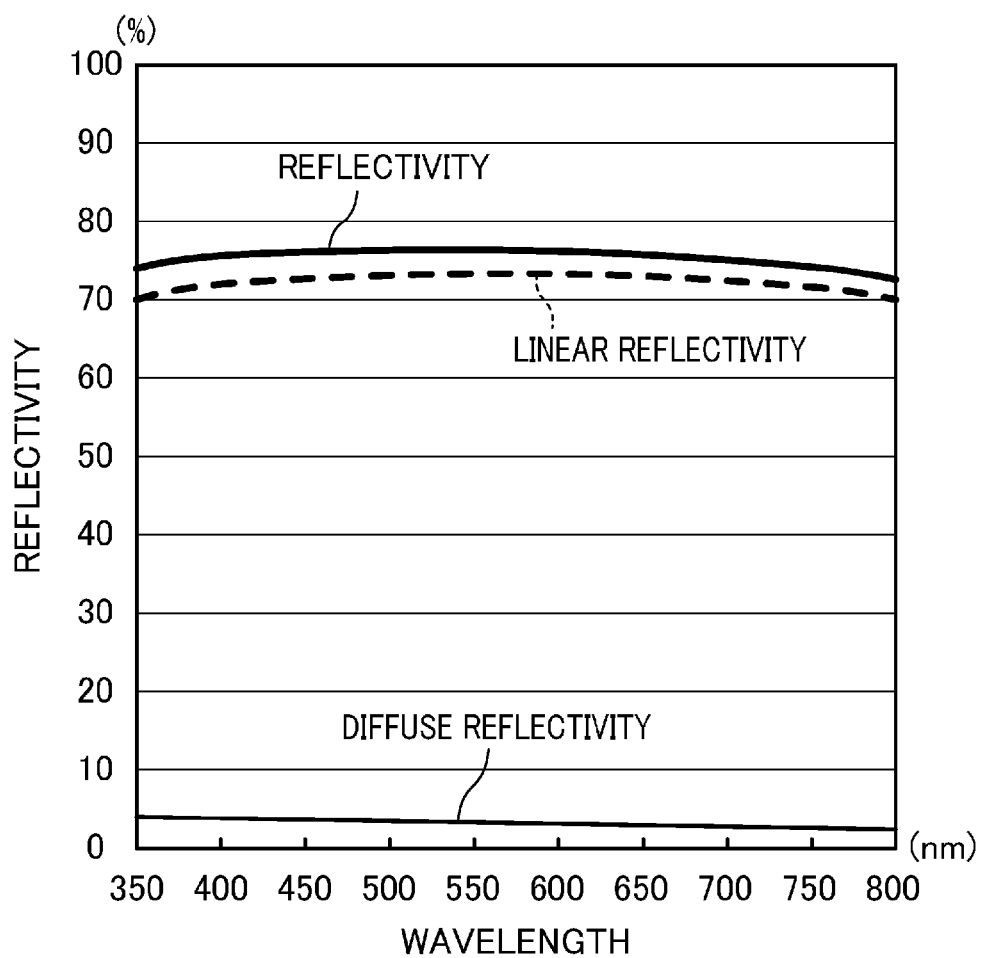
FIG. 22 is a graph illustrating the reflectivities of a reflective surface of the reflector made of aluminum according to the first example.

FIG. 22 illustrates results of measuring the reflectivities of one of the reflective surfaces 125 of the reflector S1. In the measurement of the reflectivities, light beams having wavelengths within the range from 350 nm to 800 nm were measured using a spectrophotometer (UV-VIS) made by JASCO Corporation. In the measurement, the linear reflectivity and the diffuse reflectivity of each of the light beams were measured, and the sum of the linear reflectivity and the diffuse reflectivity was defined as the total reflectivity. FIG. 22 shows that the total reflectivity of a reflective surface of the fabricated reflector 120 made of aluminum is not less than 73%, and the proportion of the linear reflectivity to the total reflectivity is not less than 95%. This shows that the reflector S1 is a reflector having high linear reflectivity.

The reflector S1 made of aluminum and fabricated separately from a mounting substrate 101 as described above was bonded onto the mounting substrate 101 on which the semiconductor light-emitting chip 100 is mounted. Thus, the semiconductor light-emitting device including the reflector S1 made of aluminum according to the first example was fabricated. A plurality of semiconductor light-emitting devices in which the angles θ2 are 0°, 6°, 8°, 12°, 13°, 18°, 25°, 30°, 40°, and 45° were fabricated without adjusting the angle θ2 by using a rotation mechanism, where θ2 represents an angle between the polarization direction of light from the semiconductor light-emitting chip 100 and a side of the square formed by the reflective surfaces 125 when viewed in plan.

Here, when the reflective surfaces 125 are arranged such that the shape formed by the reflective surfaces 125 when viewed in plan is square, the square has high symmetry when viewed in plan; therefore, when the angle θ2 is greater than 45°, the properties of such a semiconductor light-emitting device are equivalent to those obtained when the angle θ2 is equal to the angle θ2 subtracted from 90°. For this reason, the properties of semiconductor light-emitting devices in which the angles θ2 are within the range from 0° to 45° merely needs to be examined.

Figure 23A:
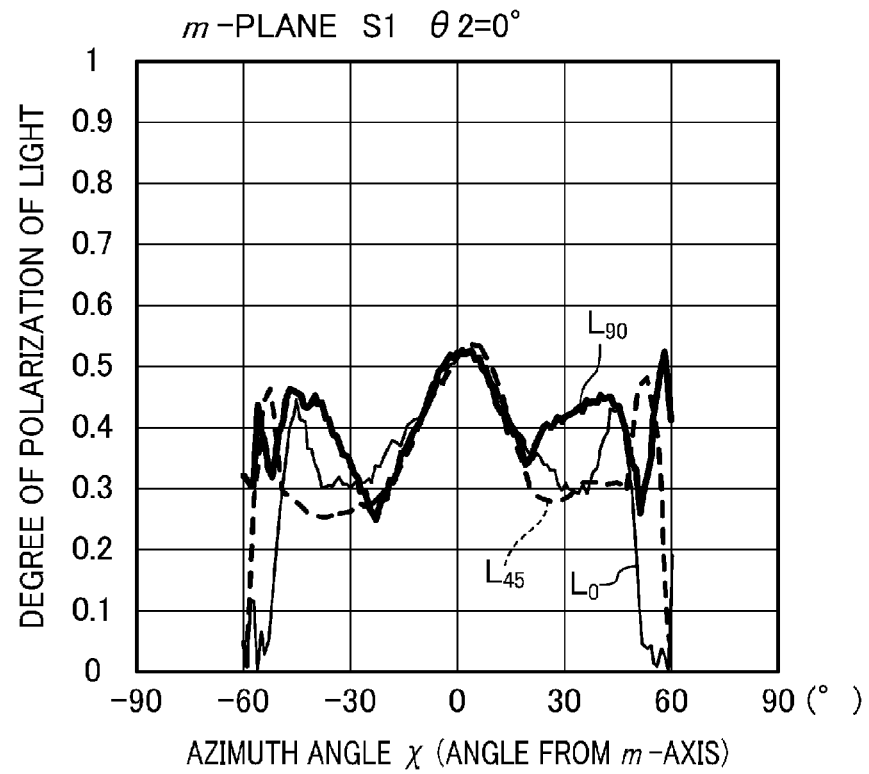
FIG. 23A is a graph illustrating the degree of polarization of light from a nitride semiconductor light-emitting device including a reflector S1 in which an angle θ2 is 0°.
Figure 23B:
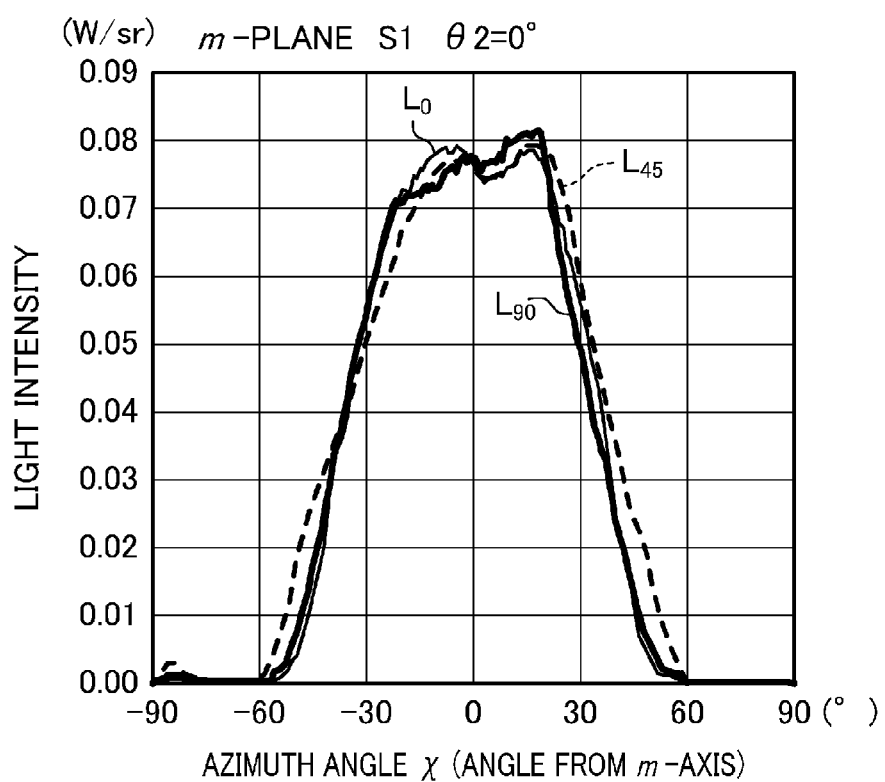
FIG. 23B is a graph illustrating the luminous intensity distribution of the semiconductor light-emitting device including the reflector S1 in which an angle θ2 is 0°.

FIGS. 23A and 23B illustrate the degree of polarization of light from a semiconductor light-emitting device including a reflector S1 in which the angle θ2 between the polarization direction of polarized light and a side of the square formed by reflective surfaces 125 of the reflector S1 when viewed in plan is set at 0°, and the luminous intensity distribution of the semiconductor light-emitting device, respectively. The thin solid line in each of these figures illustrates the corresponding property in the plane $L_0$, the broken line therein illustrates the corresponding property in the plane $L_{45}$, and the thick solid line therein illustrates the corresponding property in the plane $L_{90}$. As illustrated in FIG. 23A, the degree of polarization of light in the normal line direction (χ=0°) is 0.53. The luminous intensity distribution illustrated in FIG. 23B shows that the light distribution angle in the plane $L_0$ is 73.0°, and the light distribution angle in the plane $L_{90}$ is 69.1°. Here, the light distribution angle is a full width at half maximum, and corresponds to the range between the angles at which when the light intensity in the normal line direction is 100, the light intensity is 50. The light distribution angle is referred to also as the angle of beam spread or the divergence angle of light.

Figure 24A:
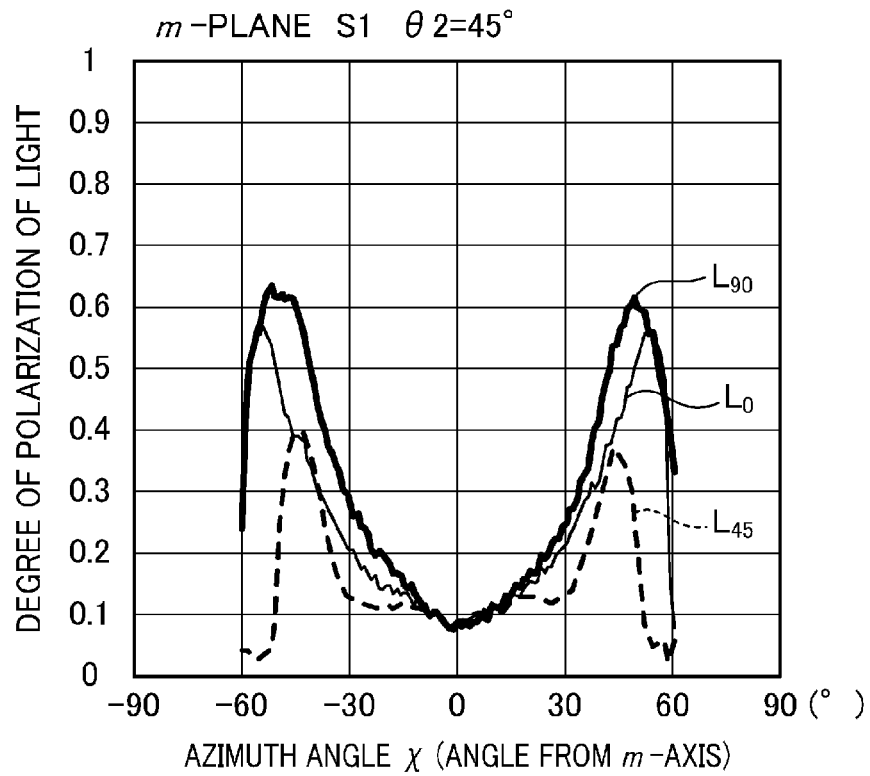
FIG. 24A is a graph illustrating the degree of polarization of light from the nitride semiconductor light-emitting device including the reflector S1 in which the angle θ2 is 45°.
Figure 24B:
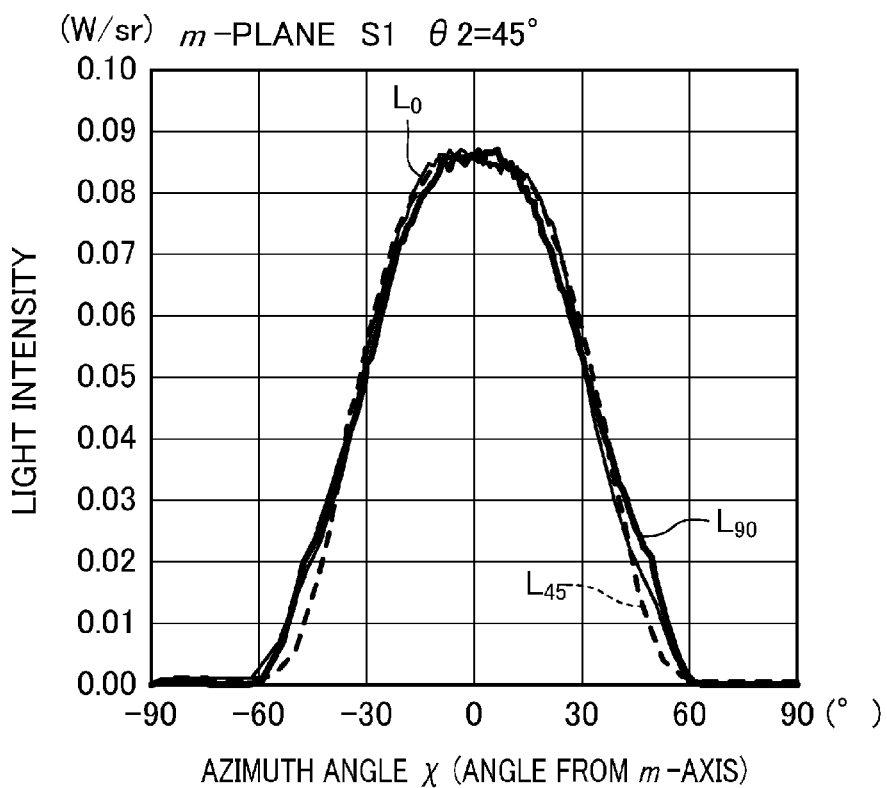
FIG. 24B is a graph illustrating the luminous intensity distribution of the nitride semiconductor light-emitting device including the reflector S1 in which the angle θ2 is 45°.

FIGS. 24A and 24B illustrate the degree of polarization of light from a semiconductor light-emitting device including a reflector S1 in which the angle θ2 is set at 45°, and the luminous intensity distribution of the semiconductor light-emitting device, respectively. The thin solid line in each of these figures illustrates the corresponding property in the plane $L_0$, the broken line therein illustrates the corresponding property in the plane $L_{45}$, and the thick solid line therein illustrates the corresponding property in the plane $L_{90}$. As illustrated in FIG. 24A, the degree of polarization of light in the normal line direction (χ=0°) is 0.07, which is much lower than when the angle θ2 is 0°. Furthermore, the degree of polarization of light in the normal line direction is lower than when any one of the circular reflectors is used. The luminous intensity distribution illustrated in FIG. 24B shows that the light distribution angle in the plane $L_0$ is 70.6°, and the light distribution angle in the plane $L_{90}$ is 71.4°.

Figure 25:
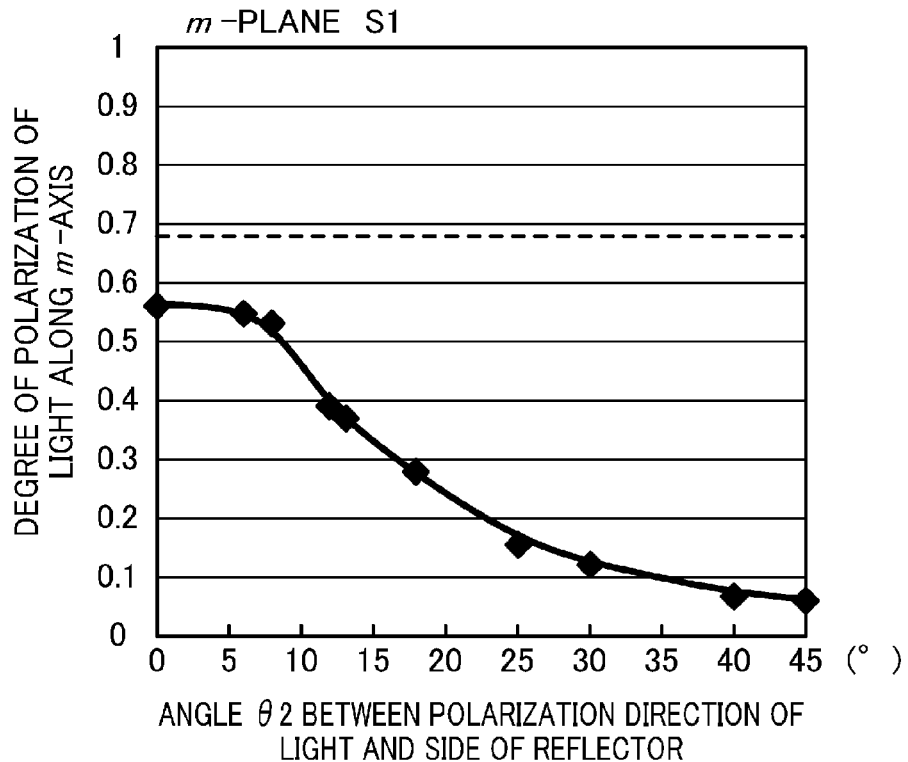
FIG. 25 is a graph illustrating the relationship between the angle θ2 and the degree of polarization of light in the normal line direction according to the first example.

FIG. 25 illustrates the relationship between the angle θ2 and the degree of polarization of light in the normal line direction. The broken line in this figure illustrates 0.68, i.e., the degree of polarization of light from the semiconductor light-emitting device that does not include a reflector according to the first comparative example in the normal line direction. When the angle θ2 is greater than 10°, the degree of polarization of light in the normal line direction sharply decreases.

Figure 26:
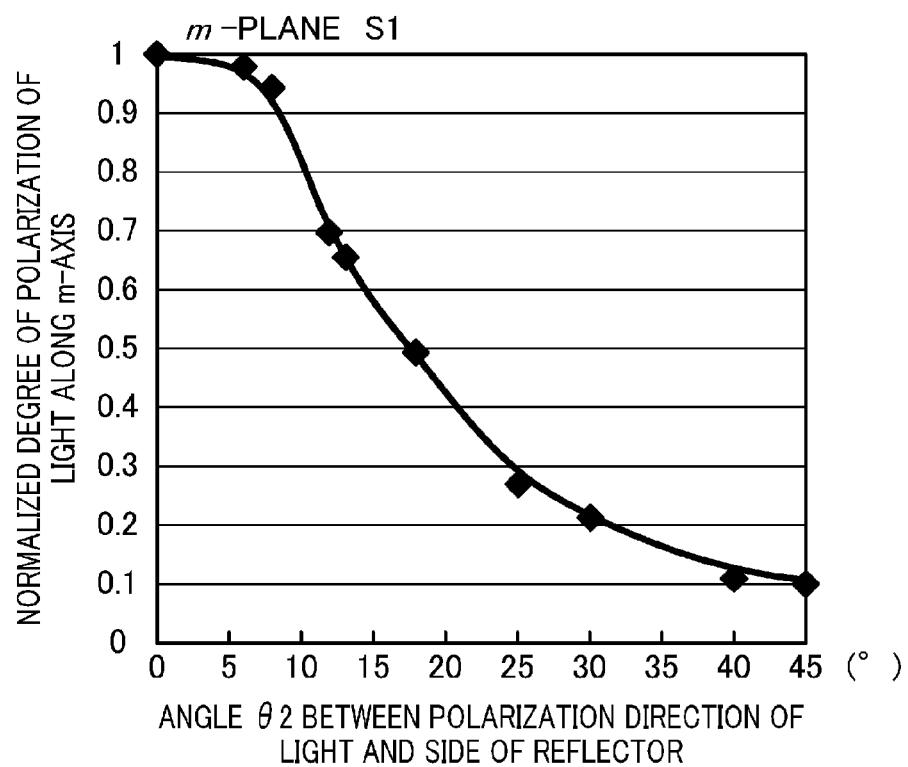
FIG. 26 is a graph illustrating the relationship between the angle θ2 and the normalized degree of polarization of light in the normal line direction according to the first example.

FIG. 26 illustrates the relationship between the angle θ2 and the normalized degree of polarization of light in the normal line direction. Here, the normalized degree of polarization of light is a value obtained by normalizing the degree of polarization of light relative to the degree of polarization of light in the normal line direction from a semiconductor light-emitting device in which the angle θ2 is 0°. FIG. 26 shows that when the angle θ2 is not less than 0° and not more than 10°, the rate of reduction in the normalized degree of polarization of light can be decreased to 10% or less. FIG. 26 further shows that an angle θ2 of not less than 30° and not more than 45° reduces the normalized degree of polarization of light to substantially 20%.

Second Example

A semiconductor light-emitting device according to a second example will be described hereinafter.

In the second example, a growth surface of an active layer of a semiconductor light-emitting chip 100 is a semipolar (20-2-1) plane. A wafer-level n-type GaN substrate having a (20-2-1) plane as its principal surface was used as a substrate of the semiconductor light-emitting chip 100. In a process of singulating the substrate into semiconductor light-emitting chips 100, grooves having a depth of about several tens of μm from the surface of the wafer were formed in the wafer along the [10-14] direction and the [1-210] direction with laser beams. Thereafter, the wafer was broken into semiconductor light-emitting chips 100 having sides each having a length of 450 μm. Other processes are similar to those in the first example. As such, a semiconductor light-emitting device including an active layer having a growth surface that is a semipolar (20-2-1) plane was fabricated. In this state, no reflector 120 is provided. The measured wavelength of light emitted from the semiconductor light-emitting device at an operating current of 10 mA was 441 nm. The polarization direction of the emitted light is along the [1-210] direction, and the degree of polarization of light measured along the [20-2-1] direction corresponding to the normal line direction was 0.65. Such a semiconductor light-emitting device that does not include a reflector 120 corresponds to a semiconductor light-emitting device according to a second comparative example.

Similarly to the first example, a reflector S1 was bonded onto a mounting substrate 101 on which the semiconductor light-emitting chip 100 was previously mounted. The azimuth angle χ of light reflected off reflective surfaces 125 of the reflector S1 was within the range from 42.5° to 78.7°, and the angle θ1 between each of the reflective surfaces 125 and the normal line direction was 28.6°. A plurality of semiconductor light-emitting devices in which the angles θ2 are 0°, 9°, 12°, 15°, 16°, 21°, 30°, 41°, and 45° were fabricated, where θ2 represents an angle between the polarization direction of light from the semiconductor light-emitting chip 100 and a side of the square formed by the reflective surfaces 125 when viewed in plan.

Here, when the reflective surfaces 125 are arranged such that the shape formed by the reflective surfaces 125 is square, the square has high symmetry when viewed in plan; therefore, the properties of semiconductor light-emitting devices in which the angles θ2 are within the range from 0° to 45° merely needs to be examined.

Figure 27:
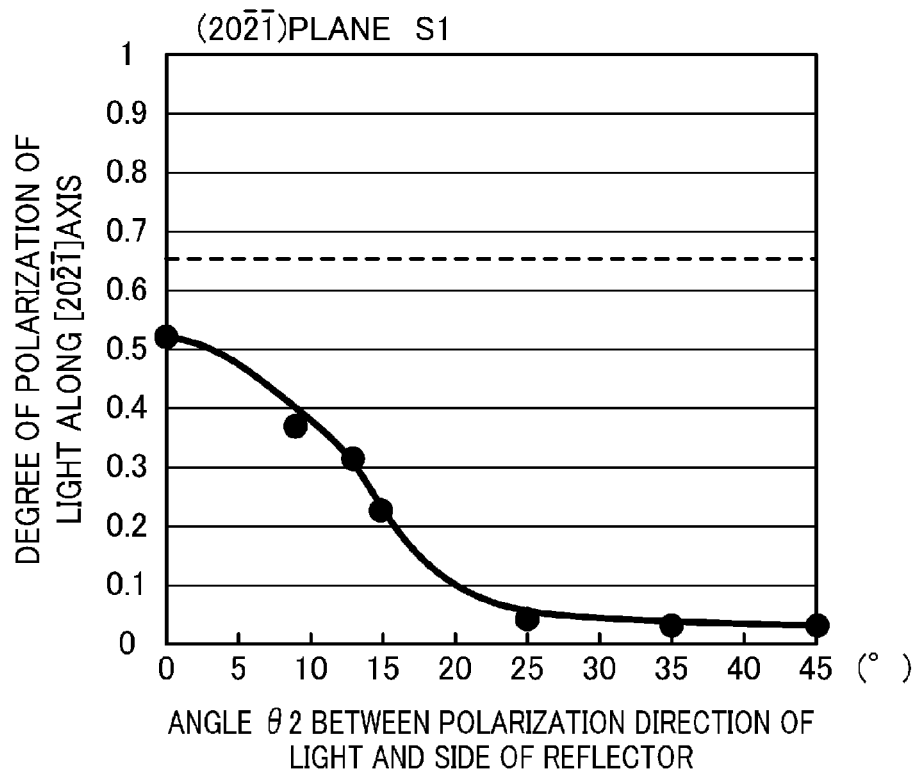
FIG. 27 is a graph illustrating the relationship between the angle θ2 and the degree of polarization of light in the normal line direction according to a second example.

FIG. 27 illustrates the relationship between the angle θ2 and the degree of polarization of light in the normal line direction. The broken line in this figure illustrates 0.65, i.e., the degree of polarization of light in the normal line direction from the semiconductor light-emitting device that does not include a reflector according to the second comparative example.

Figure 28:
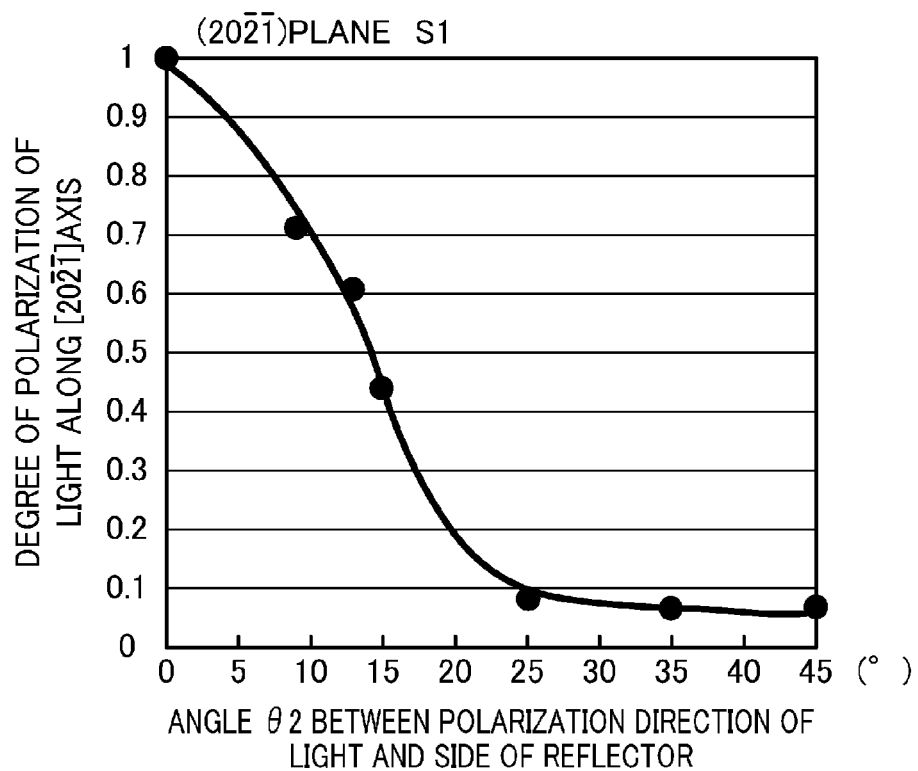
FIG. 28 is a graph illustrating the relationship between the angle θ2 and the normalized degree of polarization of light in the normal line direction according to the second example.

FIG. 28 illustrates the relationship between the angle θ2 and the normalized degree of polarization of light in the normal line direction. Here, the normalized degree of polarization of light is a value obtained by normalizing the degree of polarization of light relative to the degree of polarization of light in the normal line direction from a semiconductor light-emitting device in which the angle θ2 is 0°. A comparison between FIGS. 26 and 28 shows that these graphs have substantially the same shape.

FIG. 28 shows that when the angle θ2 is not less than 0° and not more than 10°, the rate of reduction in the normalized degree of polarization of light can be decreased to about 30%. FIG. 28 further shows that when the angle θ2 is not less than 30° and not more than 45°, the normalized degree of polarization of light can be less than 10%.

As described above, the nitride semiconductor light-emitting device according to each of this embodiment, its variations, and the examples includes a rotation mechanism 150 including a reflector 120, and a coupler 130 holding the reflector 120 such that the reflector 120 is rotatable within the mounting surface, and thus, allows the angle θ2 between the polarization direction of light from a semiconductor light-emitting chip 100 and a corresponding one of reflective surfaces 125 of the reflector 120 to be set at an optional value.

For example, the angle θ2 set within the range from 0° to 10° or the range from 80° to 90° can provide a semiconductor light-emitting device emitting light having a high degree of polarization.

The angle θ2 set within the range from 30° to 60° can provide a semiconductor light-emitting device emitting light having a low degree of polarization.

The angle θ2 set within the range from 10° to 30° or the range from 60° to 80° can provide a semiconductor light-emitting device emitting light having an intermediate degree of polarization.

First Comparative Example

A semiconductor light-emitting device according to a first comparative example will be described hereinafter with reference to FIGS. 29A and 29B.

Figure 29A:
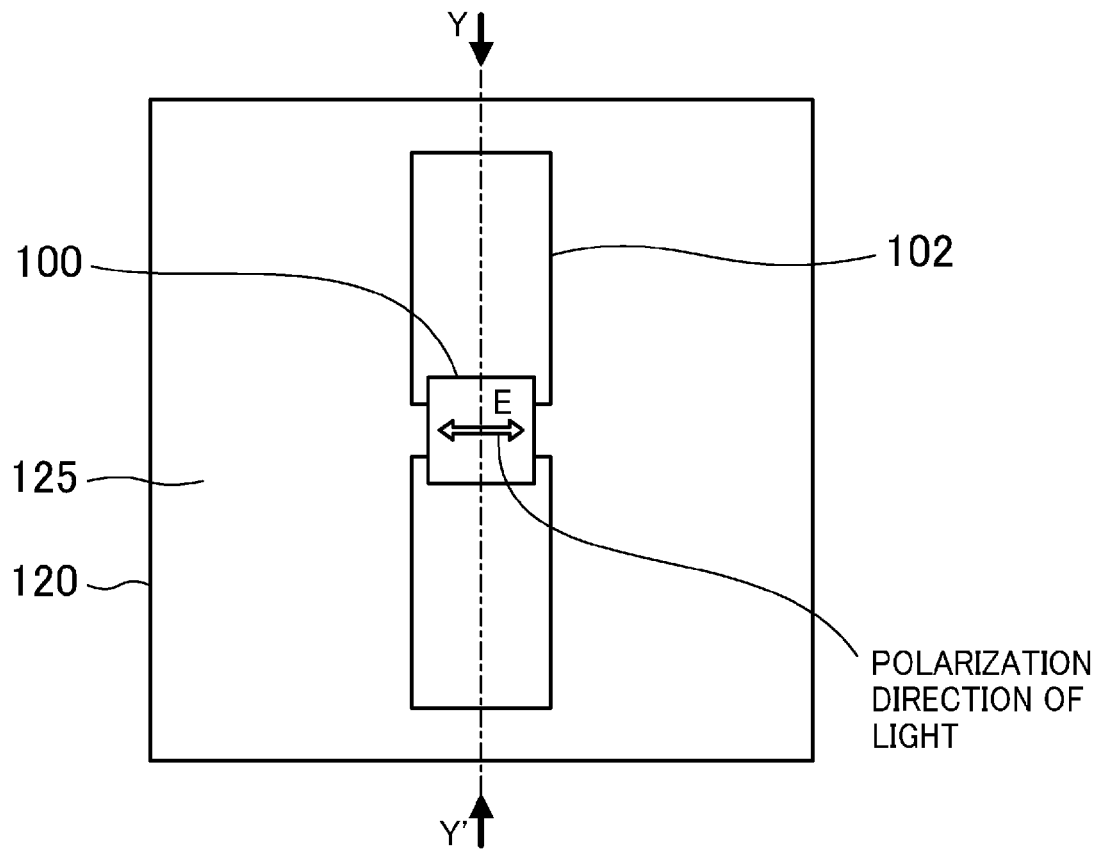
FIG. 29A is a schematic plan view illustrating a semiconductor light-emitting device according to a first comparative example.
Figure 29B:
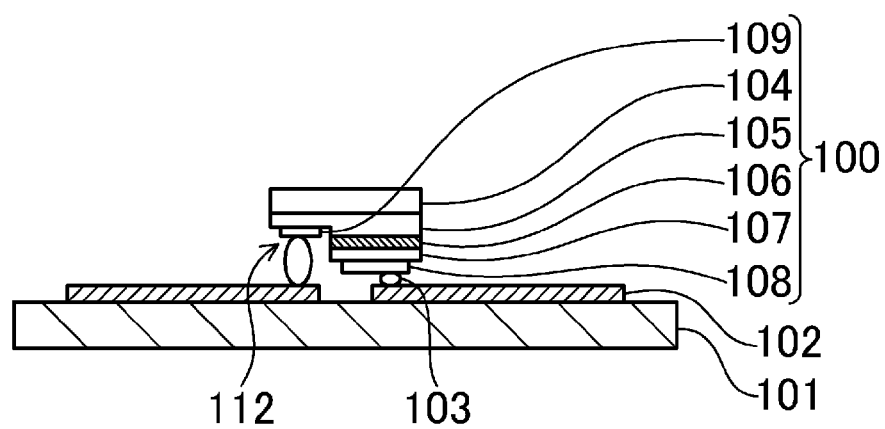
FIG. 29B is a cross-sectional view taken along the line Y-Y' in FIG. 29A.

As illustrated in FIGS. 29A and 29B, the semiconductor light-emitting device according to the first comparative example includes a semiconductor light-emitting chip 100 including an active layer having a growth surface that is an m-plane, and does not include a reflector 120.

A semiconductor light-emitting chip 100 fabricated in a manner similar to that in the first example was mounted on a mounting substrate 101. In this state, the measured wavelength of light emitted from the semiconductor light-emitting device at an operating current of 10 mA was 445 nm. The degree of polarization of light emitted along the normal line direction was 0.68.

Figure 30A:
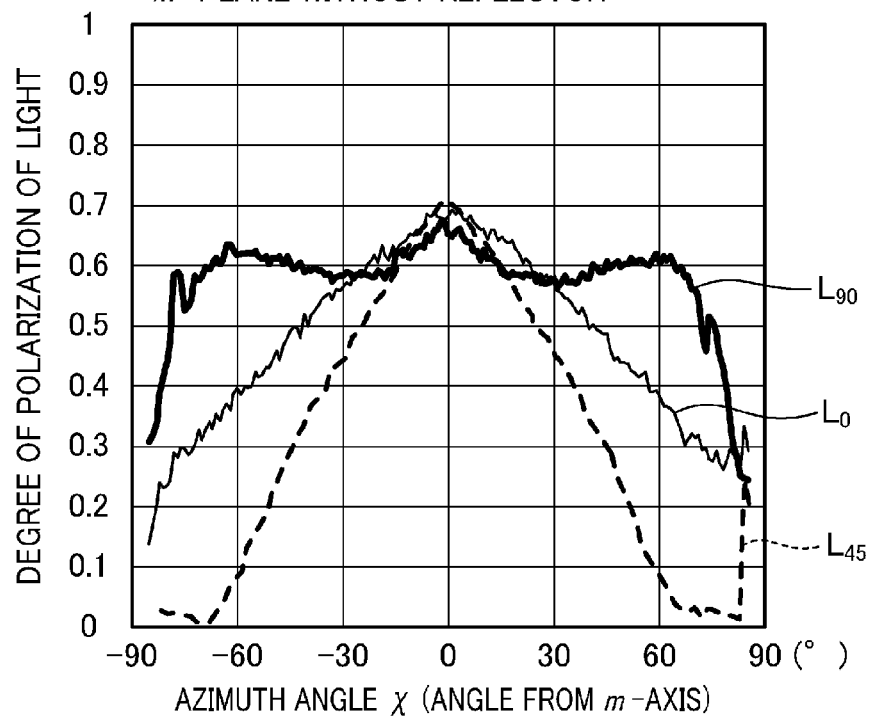
FIG. 30A is a graph illustrating the degree of polarization of light from the semiconductor light-emitting device according to the first comparative example.
Figure 30B:
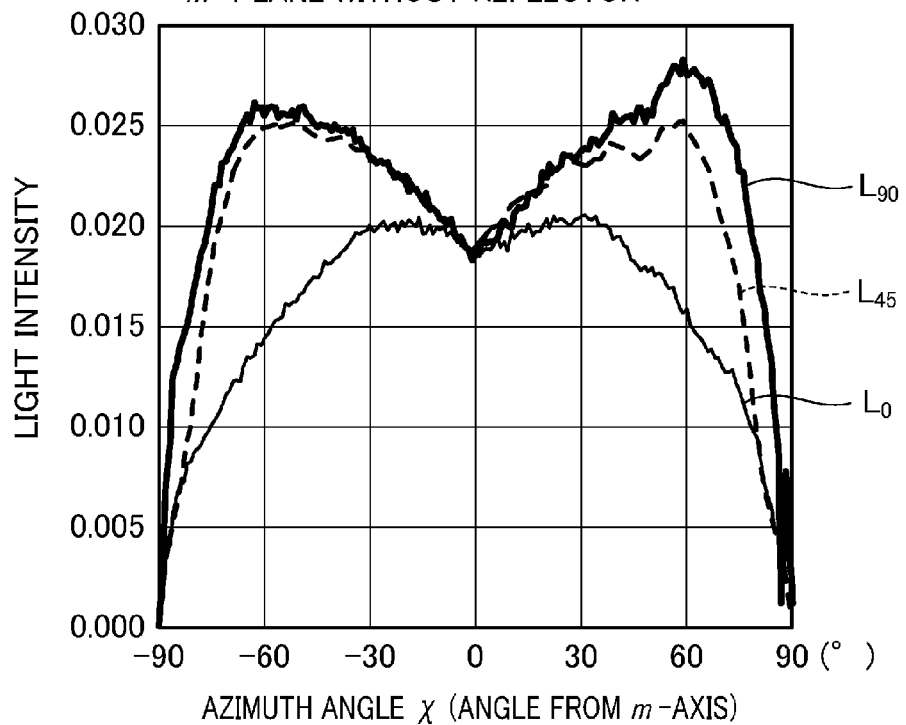
FIG. 30B is a graph illustrating the luminous intensity distribution of the semiconductor light-emitting device according to the first comparative example.

FIGS. 30A and 30B illustrate the degree of polarization of light from the semiconductor light-emitting device according to the first comparative example, and the luminous intensity distribution of the semiconductor light-emitting device according to the first comparative example, respectively. The thin solid line in each of these figures illustrates the corresponding property in the plane $L_0$, the broken line therein illustrates the corresponding property in the plane $L_{45}$, and the thick solid line therein illustrates the corresponding property in the plane $L_{90}$.

First, also when the azimuth angle $\chi$ is within the range from −80° to +80°, the degree of polarization of light in the plane $L_{90}$ is kept high as illustrated in FIG. 30A. When the azimuth angle $\chi$ is 0°, the degree of polarization of light in the plane $L_0$ is highest, and with increasing absolute value of the azimuth angle $\chi$, the degree of polarization of light in the plane $L_0$ gently decreases. The degree of polarization of light in the plane $L_{45}$ is similar to that in the plane $L_0$ in that when the azimuth angle $\chi$ is 0°, the degree of polarization of light is highest; however, with increasing absolute value of the azimuth angle $\chi$, the degree of polarization of light significantly decreases. Specifically, when the azimuth angle $\chi$ is not less than 40°, the degree of polarization of light is reduced to one half or less of the degree of polarization of light obtained when the azimuth angle $\chi$ is 0°. Furthermore, when the azimuth angle $\chi$ is not less than 50°, the degree of polarization of light is reduced to one third or less of the degree of polarization of light obtained when the azimuth angle $\chi$ is 0°. As such, the degree of polarization of light from a semiconductor light-emitting chip emitting polarized light varies among the planes $L_0$, $L_{45}$, and $L_{90}$.

In contrast, the luminous intensity distribution in the plane $L_{45}$ is similar to that in the plane $L_{90}$ as illustrated in FIG. 30B, and when the azimuth angle $\chi$ is about ±60°, both of the luminous intensity distributions characteristically have a peak. When the azimuth angle $\chi$ is within the range from 10° to 80°, the light intensity is higher than that obtained when the azimuth angle $\chi$ is equal to 0°, i.e., that in the normal line direction. In the luminous intensity distribution in the plane $L_0$, when the azimuth angle $\chi$ is within the range from −30° to +30°, the light intensity is high, and when the absolute value of the azimuth angle $\chi$ is greater than 30°, the light intensity monotonously decreases. As such, the luminous intensity distribution of a semiconductor light-emitting chip emitting polarized light in the plane $L_0$ is different from the luminous intensity distribution in each of the planes $L_{45}$ and $L_{90}$.

Second Comparative Example

A semiconductor light-emitting device according to a second comparative example will be described hereinafter.

The semiconductor light-emitting device according to the second comparative example is a semiconductor light-emitting device that includes an active layer having a growth surface that is a semipolar (20-2-1) plane, and that does not include a reflector.

A semiconductor light-emitting chip 100 including an active layer having a growth surface that is a (20-2-1) plane was fabricated in a manner similar to that in the second example, and was mounted on a mounting substrate 101. This provides a semiconductor light-emitting device having a configuration similar to that of the semiconductor light-emitting device illustrated in FIGS. 29A and 29B. In this state, the measured wavelength of light emitted from the semiconductor light-emitting device at an operating current of 10 mA was 441 nm. The degree of polarization of light emitted along the normal line direction was 0.65.

Figure 31A:
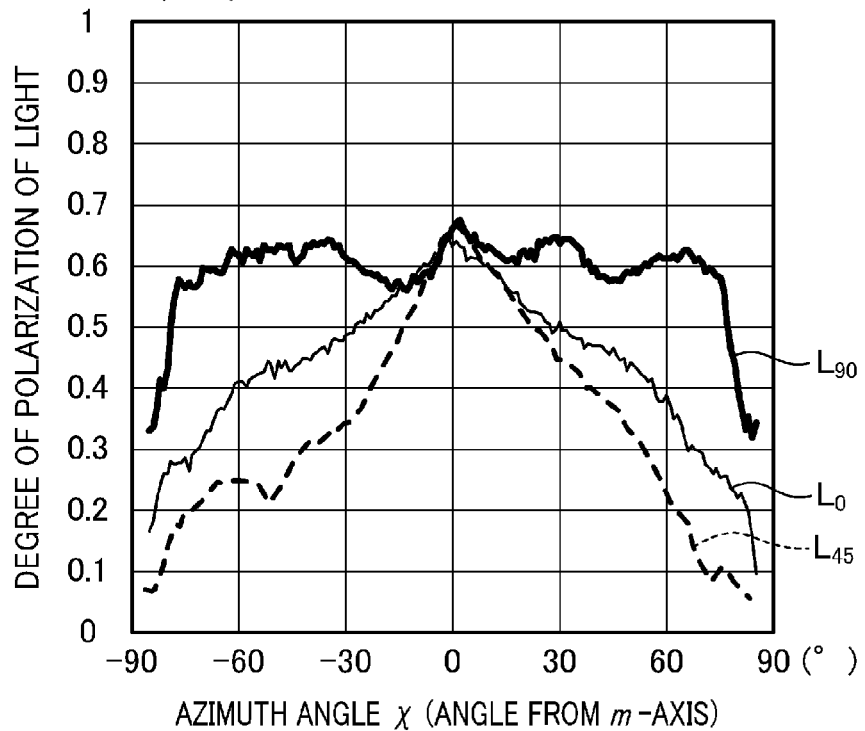
FIG. 31A is a graph illustrating the degree of polarization of light from a semiconductor light-emitting device according to a second comparative example.
Figure 31B:
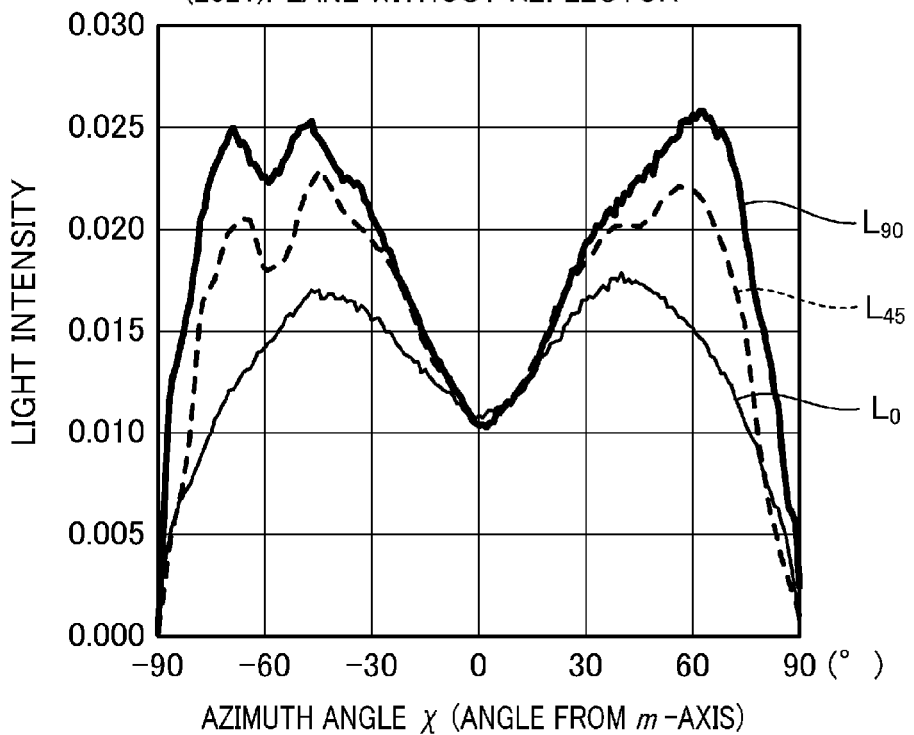
FIG. 31B is a graph illustrating the luminous intensity distribution of the semiconductor light-emitting device according to the second comparative example.

FIGS. 31A and 31B illustrate the degree of polarization of light from the semiconductor light-emitting device according to the second comparative example, and the luminous intensity distribution of the semiconductor light-emitting device according to the second comparative example, respectively. The thin solid line in each of these figures illustrates the corresponding property in the plane $L_0$, the broken line therein illustrates the corresponding property in the plane $L_{45}$, and the thick solid line therein illustrates the corresponding property in the plane $L_{90}$.

First, also when the azimuth angle $\chi$ is within the range from −80° to +80°, the degree of polarization of light in the plane $L_{90}$ is kept high as illustrated in FIG. 31A. When the azimuth angle $\chi$ is 0°, the degree of polarization of light in the plane $L_0$ is highest, and with increasing absolute value of the azimuth angle $\chi$, the degree of polarization of light in the plane $L_0$ gently decreases. The degree of polarization of light in the plane $L_{45}$ is similar to that in the plane $L_0$ in that when the azimuth angle $\chi$ is 0°, the degree of polarization of light is highest; however, with increasing absolute value of the azimuth angle $\chi$, the degree of polarization of light in the plane $L_{45}$ significantly decreases. Specifically, when the azimuth angle $\chi$ is not less than 40°, the degree of polarization of light is reduced to one half or less of the degree of polarization of light obtained when the azimuth angle $\chi$ is 0°. Furthermore, when the azimuth angle $\chi$ is not less than 60°, the degree of polarization of light is reduced to one third or less of the degree of polarization of light obtained when the azimuth angle $\chi$ is 0°. As such, the degree of polarization of light from a semiconductor light-emitting chip emitting polarized light varies among the planes $L_0$, $L_{45}$, and $L_{90}$.

In contrast, the luminous intensity distribution in the plane $L_{45}$ is similar to that in the plane $L_{90}$ as illustrated in FIG. 31B, and when the azimuth angle $\chi$ is about ±60°, both of the luminous intensity distributions characteristically have a peak. When the azimuth angle $\chi$ is within the range from 10° to 80°, the light intensity is higher than that obtained when the azimuth angle $\chi$ is equal to 0°, i.e., that in the normal line direction. Meanwhile, when the azimuth angle $\chi$ is about ±40°, the luminous intensity distribution in the plane $L_0$ characteristically has a peak. As such, the luminous intensity distribution of a semiconductor light-emitting chip emitting polarized light in the plane $L_0$ is different from the luminous intensity distribution in each of the planes $L_{45}$ and $L_{90}$.

The semiconductor light-emitting device according to the present disclosure can be utilized for, e.g., lighting devices, automobile headlamps, or spotlights.

What is claimed is:

1. A nitride semiconductor light-emitting device comprising:
   a mounting substrate;
   a semiconductor light-emitting chip held on a mounting surface of the mounting substrate, having a growth surface that is a nonpolar or semipolar plane, and emitting polarized light;
   a reflection member surrounding the semiconductor light-emitting chip when viewed in plan and having a reflective surface off which the polarized light is reflected; and
   a coupler held on the mounting surface of the mounting substrate and holding the reflection member such that the reflection member is rotatable around the semiconductor light-emitting chip, wherein out of an upper surface of the reflection member and an upper surface of the coupler, at least the upper surface of the reflection member includes a marker enabling determination of an angle of the reflective surface relative to a polarization direction of the polarized light.

2. The nitride semiconductor light-emitting device of claim 1, wherein:
   the coupler includes a projection facing an outer circumferential surface of the reflection member; and the outer circumferential surface of the reflection member has a recess which extends in parallel with the mounting surface and into which the projection of the coupler is fitted.

3. The nitride semiconductor light-emitting device of claim 1, wherein the coupler is ring-shaped when viewed in plan from a direction perpendicular to the mounting surface.

4. The nitride semiconductor light-emitting device of claim 1, wherein the coupler includes at least three pillar-like members extending in a direction perpendicular to the mounting surface.

5. The nitride semiconductor light-emitting device of claim 1, wherein:
the coupler faces a bottom portion of the reflection member;
the bottom portion of the reflection member includes a projection or a ring-shaped recess; and
an upper portion of the coupler includes a ring-shaped recess into which the projection of the reflection member is fitted, or a projection fitted into the recess of the reflection member.

6. The nitride semiconductor light-emitting device of claim 1 further comprising a rotation mechanism actuating the reflection member.

7. The nitride semiconductor light-emitting device of claim 1, wherein an outer circumferential surface of the reflection member includes a stopper fixing an angle of the reflective surface relative to a polarization direction of the polarized light.

8. The nitride semiconductor light-emitting device of claim 1, wherein:
the reflective surface includes a plurality of reflective surfaces; and
the reflective surfaces are arranged such that a shape formed by the reflective surfaces when viewed in plan from a direction perpendicular to the mounting surface is square.

9. The nitride semiconductor light-emitting device of claim 1, wherein:
the reflective surface includes a plurality of reflective surfaces; and
the reflective surfaces are arranged such that a shape formed by the reflective surfaces when viewed in plan from a direction perpendicular to the mounting surface is rectangular.

10. The nitride semiconductor light-emitting device of claim 1, wherein:
the reflective surface includes a plurality of reflective surfaces;
the reflective surfaces are arranged such that a shape formed by the reflective surfaces when viewed in plan from a direction perpendicular to the mounting surface is square; and
the marker is provided such that an angle $\theta 2$ can be set at an angle of not less than 30° and not more than 60°, where the angle $\theta 2$ represents an angle between the polarization direction of the polarized light and a side of the shape formed by the reflective surfaces when viewed in plan.

11. The nitride semiconductor light-emitting device of claim 1, wherein a surface roughness of the reflective surface is not more than 100 nm.

12. The nitride semiconductor light-emitting device of claim 1, wherein the reflection member has the reflective surface having an oval or polygonal end when viewed in plan.

13. The nitride semiconductor light-emitting device of claim 1, wherein the reflection member has the reflective surface having a rectangular end when viewed in plan.

14. The nitride semiconductor light-emitting device of claim 1, wherein the reflection member has the reflective surface having a square end when viewed in plan.

15. The nitride semiconductor light-emitting device of claim 1, wherein:
the coupler has a recess facing an outer circumferential surface of the reflection member and extending in parallel with the mounting surface; and
the outer circumferential surface of the reflection member includes a projection fitted into the recess of the coupler.

16. The nitride semiconductor light-emitting device of claim 15, wherein portions of the coupler except the recess into which the projection is fitted are not in contact with the reflection member.

17. The nitride semiconductor light-emitting device of claim 1, wherein:
the reflective surface includes a plurality of reflective surfaces;
the reflective surfaces are arranged such that a shape formed by the reflective surfaces when viewed in plan from a direction perpendicular to the mounting surface is square; and
the marker is provided such that an angle $\theta 2$ can be set at an angle of not less than 0° and not more than 10° or not less than 80° and not more than 90°, where the angle $\theta 2$ represents an angle between the polarization direction of the polarized light and a side of the shape formed by the reflective surfaces when viewed in plan.

18. The nitride semiconductor light-emitting device of claim 17, wherein:
one of the reflective surfaces when viewed in cross section taken along a direction perpendicular to the growth surface of the semiconductor light-emitting chip forms a straight line, a curve, or a combination of a straight line and a curve; and
an arithmetic average inclination angle $\Delta\theta 1$ is not less than 20° and not more than 40°, where the arithmetic average inclination angle $\Delta\theta 1$ represents an angle between the reflective surface and a direction of a normal line to the growth surface of the semiconductor light-emitting chip when viewed in cross section along the direction perpendicular to the growth surface of the semiconductor light-emitting chip.

19. The nitride semiconductor light-emitting device of claim 1 further comprising a polarization control member held on the reflection member, and varying a degree of polarization of the polarized light depending on a direction of incidence of the polarized light.

20. The nitride semiconductor light-emitting device of claim 19, wherein the polarization control member is a polarizing plate.

21. The nitride semiconductor light-emitting device of claim 19, wherein the polarization control member is a light-transmissive member having a surface including stripe-shaped projections and depressions.

22. The nitride semiconductor light-emitting device of claim 19, wherein the polarization control member is a semi-cylindrical light-transmissive member.

23. A nitride semiconductor light-emitting device comprising:
- a mounting substrate;
- a semiconductor light-emitting chip held on a mounting surface of the mounting substrate, having a growth surface that is a nonpolar or semipolar plane, and emitting polarized light;
- a reflection member surrounding the semiconductor light-emitting chip when viewed in plan and having a reflective surface off which the polarized light is reflected; and
- a coupler held on the mounting surface of the mounting substrate and holding the reflection member such that the reflection member is rotatable around the semiconductor light-emitting chip, wherein
- the coupler faces a bottom portion of the reflection member;
- the bottom portion of the reflection member includes a projection or a ring-shaped recess; and
- an upper portion of the coupler includes a ring-shaped recess into which the projection of the reflection member is fitted, or a projection fitted into the recess of the reflection member.

24. The nitride semiconductor light-emitting device of claim 23, wherein
the coupler is ring-shaped when viewed in plan from a direction perpendicular to the mounting surface.

25. The nitride semiconductor light-emitting device of claim 23 further comprising:
a rotation mechanism actuating the reflection member.

26. The nitride semiconductor light-emitting device of claim 23, wherein
an outer circumferential surface of the reflection member includes a stopper fixing an angle of the reflective surface relative to a polarization direction of the polarized light.

27. The nitride semiconductor light-emitting device of claim 23, wherein
the reflective surface includes a plurality of reflective surfaces, and
the reflective surfaces are arranged such that a shape formed by the reflective surfaces when viewed in plan from a direction perpendicular to the mounting surface is square.

28. The nitride semiconductor light-emitting device of claim 23, wherein
the reflective surface includes a plurality of reflective surfaces, and
the reflective surfaces are arranged such that a shape formed by the reflective surfaces when viewed in plan from a direction perpendicular to the mounting surface is rectangular.

29. The nitride semiconductor light-emitting device of claim 23, wherein
a surface roughness of the reflective surface is not more than 100 nm.

30. The nitride semiconductor light-emitting device of claim 23, wherein
the reflection member has the reflective surface having an oval or polygonal end when viewed in plan.

31. The nitride semiconductor light-emitting device of claim 23, wherein
the reflection member has the reflective surface having a rectangular end when viewed in plan.

32. The nitride semiconductor light-emitting device of claim 23, wherein
the reflection member has the reflective surface having a square end when viewed in plan.

33. The nitride semiconductor light-emitting device of claim 23, wherein
out of an upper surface of the reflection member and an upper surface of the coupler, at least the upper surface of the reflection member includes a marker enabling determination of an angle of the reflective surface relative to a polarization direction of the polarized light.

34. The nitride semiconductor light-emitting device of claim 33, wherein
the reflective surface includes a plurality of reflective surfaces,
the reflective surfaces are arranged such that a shape formed by the reflective surfaces when viewed in plan from a direction perpendicular to the mounting surface is square, and
the marker is provided such that an angle $\theta 2$ can be set at an angle of not less than 30° and not more than 60°, where the angle $\theta 2$ represents an angle between the polarization direction of the polarized light and a side of the shape formed by the reflective surfaces when viewed in plan.

35. The nitride semiconductor light-emitting device of claim 33, wherein
the reflective surface includes a plurality of reflective surfaces,
the reflective surfaces are arranged such that a shape formed by the reflective surfaces when viewed in plan from a direction perpendicular to the mounting surface is square, and
the marker is provided such that an angle $\theta 2$ can be set at an angle of not less than 0° and not more than 10° or not less than 80° and not more than 90°, where the angle $\theta 2$ represents an angle between the polarization direction of the polarized light and a side of the shape formed by the reflective surfaces when viewed in plan.

36. The nitride semiconductor light-emitting device of claim 35, wherein
one of the reflective surfaces when viewed in cross section taken along a direction perpendicular to the growth surface of the semiconductor light-emitting chip forms a straight line, a curve, or a combination of a straight line and a curve, and
an arithmetic average inclination angle $\Delta\theta 1$ is not less than 20° and not more than 40°, where the arithmetic average inclination angle $\Delta\theta 1$ represents an angle between the reflective surface and a direction of a normal line to the growth surface of the semiconductor light-emitting chip when viewed in cross section along the direction perpendicular to the growth surface of the semiconductor light-emitting chip.

37. The nitride semiconductor light-emitting device of claim 23 further comprising:
a polarization control member held on the reflection member, and varying a degree of polarization of the polarized light depending on a direction of incidence of the polarized light.

38. The nitride semiconductor light-emitting device of claim 37, wherein
the polarization control member is a polarizing plate.

39. The nitride semiconductor light-emitting device of claim 37, wherein
the polarization control member is a light-transmissive member having a surface including stripe-shaped projections and depressions.

40. The nitride semiconductor light-emitting device of claim 37, wherein
the polarization control member is a semicylindrical light-transmissive member.

\* \* \* \* \*